United States Patent [19]
Airhart et al.

[11] Patent Number: 5,881,310
[45] Date of Patent: Mar. 9, 1999

[54] METHOD FOR EXECUTING AN INSTRUCTION WHERE THE MEMORY LOCATIONS FOR DATA, OPERATION TO BE PERFORMED AND STORING OF THE RESULT ARE INDICATED BY POINTERS

[75] Inventors: Tom Patterson Airhart; Melvin G. Montgomery, both of Plano; John E. E. Kingman, Houston; Ronald B. Livesay, Ft. Worth, all of Tex.

[73] Assignee: Atlantic Richfield Company, Los Angeles, Calif.

[21] Appl. No.: 589,834

[22] Filed: Jan. 22, 1996

Related U.S. Application Data

[60] Division of Ser. No. 771,758, Oct. 4, 1991, abandoned, which is a continuation-in-part of Ser. No. 554,030, Jul. 16, 1990, Pat. No. 5,159,226, and a continuation-in-part of Ser. No. 695,610, May 3, 1991, abandoned, and a continuation-in-part of Ser. No. 746,309, Aug. 14, 1991, Pat. No. 5,166,908, which is a continuation-in-part of Ser. No. 554,022, Jul. 16, 1990, abandoned.

[51] Int. Cl.$^6$ ................................................ G06F 12/00
[52] U.S. Cl. ............................................ 395/823; 395/827
[58] Field of Search ........................... 340/172.5; 346/1; 364/200; 395/800, 823, 827

[56] References Cited

U.S. PATENT DOCUMENTS

| | | | |
|---|---|---|---|
| 2,868,311 | 1/1959 | Tullos | 367/25 |
| 3,588,804 | 6/1971 | Fort . | |
| 3,748,573 | 7/1973 | Voegel | 324/10 |
| 3,761,893 | 9/1973 | Morley | 340/172.5 |
| 4,010,476 | 3/1977 | Elliott | 346/1 |
| 4,156,229 | 5/1979 | Shawhan | 340/18 |
| 4,216,536 | 8/1980 | More | 367/80 |
| 4,363,112 | 12/1982 | Widrow | 367/30 |
| 4,365,322 | 12/1982 | Widrow | 367/32 |
| 4,367,541 | 1/1983 | Seeman | 367/34 |
| 4,390,975 | 6/1983 | Shawhan | 367/82 |
| 4,474,250 | 10/1984 | Dardick | 175/50 |
| 4,562,559 | 12/1985 | Sharp et al. | 367/82 |
| 4,697,650 | 10/1987 | Fontenot | 175/50 |
| 4,706,223 | 11/1987 | Zimmmerman | 367/57 |
| 4,715,451 | 12/1987 | Bseisu et al. | 175/40 |
| 4,881,167 | 11/1989 | Sasaki et al. | 364/200 |
| 4,929,898 | 5/1990 | Spies | 324/242 |
| 4,954,998 | 9/1990 | Rector | 367/82 |
| 4,980,643 | 12/1990 | Gianzero et al. | 2342/339 |
| 4,992,997 | 2/1991 | Bseisu | 367/82 |
| 5,038,108 | 8/1991 | Lessi et al. | 367/82 |
| 5,050,130 | 9/1991 | Rector et al. | 367/57 |
| 5,096,001 | 3/1992 | Buytaert et al. | 175/40 |
| 5,495,619 | 2/1996 | May et al. | 395/800 |
| 5,594,910 | 1/1997 | Filepp et al. | 395/800 |

FOREIGN PATENT DOCUMENTS

88/04435  6/1988  WIPO .

OTHER PUBLICATIONS

Dewan, *Essentials of Modern Open–Hole Log Interpretation* (PennWell Books, 1983), pp. 82–86.

(List continued on next page.)

*Primary Examiner*—Thomas C. Lee
*Assistant Examiner*—David Ton
*Attorney, Agent, or Firm*—Anderson, Levine & Lintel

[57] ABSTRACT

A system and method for performing seismic prospecting and monitoring during drilling of a well are disclosed. The system generates energy, such as acoustic vibrations and electromagnetic energy, at a downhole location and imparts the same into the surrounding earth. The energy may be imparted by the drilling operation itself, or may be generated by a downhole apparatus. Downhole sensors are provided which sense the energy after it has passed through the earth surrounding the wellbore. The sensed energy is either communicated to the surface, or is communicated to a downhole computer for analysis, with the results of the analysis communicated to the surface. Due to the use of both downhole generation and sensing of the energy, high frequency energy may be used. As a result, the resolution of the resulting survey is improved over techniques which utilize surface detectors for energy traveling through the earth.

15 Claims, 17 Drawing Sheets

OTHER PUBLICATIONS

*Log Interpretation Principles/Application* (Schlumberger, 1989), pp. 7–2, 7–7, 7–8, 7–12 through 7–X, 7–35, 9–10.

Honeybourne, "Measurement While Drilling", Symposium on the 75$^{th}$ Anniversary of the Oil Technology Course at the Royal School of Mines (1988).

DiSiena et al., "VSP While Drilling: Evaluation of TOMEX", *Exploration Technology Report* (Atlantic Richfied Company, Fall 1989), pp. 13–20.

Rector III, et al., "Extending VSP to 3–D and MWD: Using the drill bit as a downhole seismic source", *Oil and Gas Journal* (Jun. 1989), pp. 55–58.

Rector, Marian and Widrow, "Use of Drill–Bit Energy as a Downhole Seismic Source", *58$^{th}$ International Meeting of SEG*, paper DEV 2.7, pp. 161–164.

Bradley, et al., "Microprocessor–Based Data Acquisition System for a Borehole Radar", *IEEE Trans. Geoscience & Remote Sensing*, vol. GE–25, No. 4 (IEEE, 1987).

van Popta, et al., "Use of Borehole Gravimetry for Reservoir Characterisation and Fluid Saturation Monitoring", Publication 988 (Shell Internationale Research Maaschappij B.V. 1990).

Goodfriend, "Material Breahthrough Spurs Actuator Design", *Machine Design* (Mar. 21, 1991), pp. 147–150.

Squire, et al., "A New Approach to Drill–String Telemetry", presented at the 54$^{th}$ Annual Fall Technical Conference of the Society of Petroleum Engineers, paper SPE8340 (AIME, 1979).

"FCR$^{SM}$ MWD Focused Current Resistivity Sensor" (EXLOG, 1989).

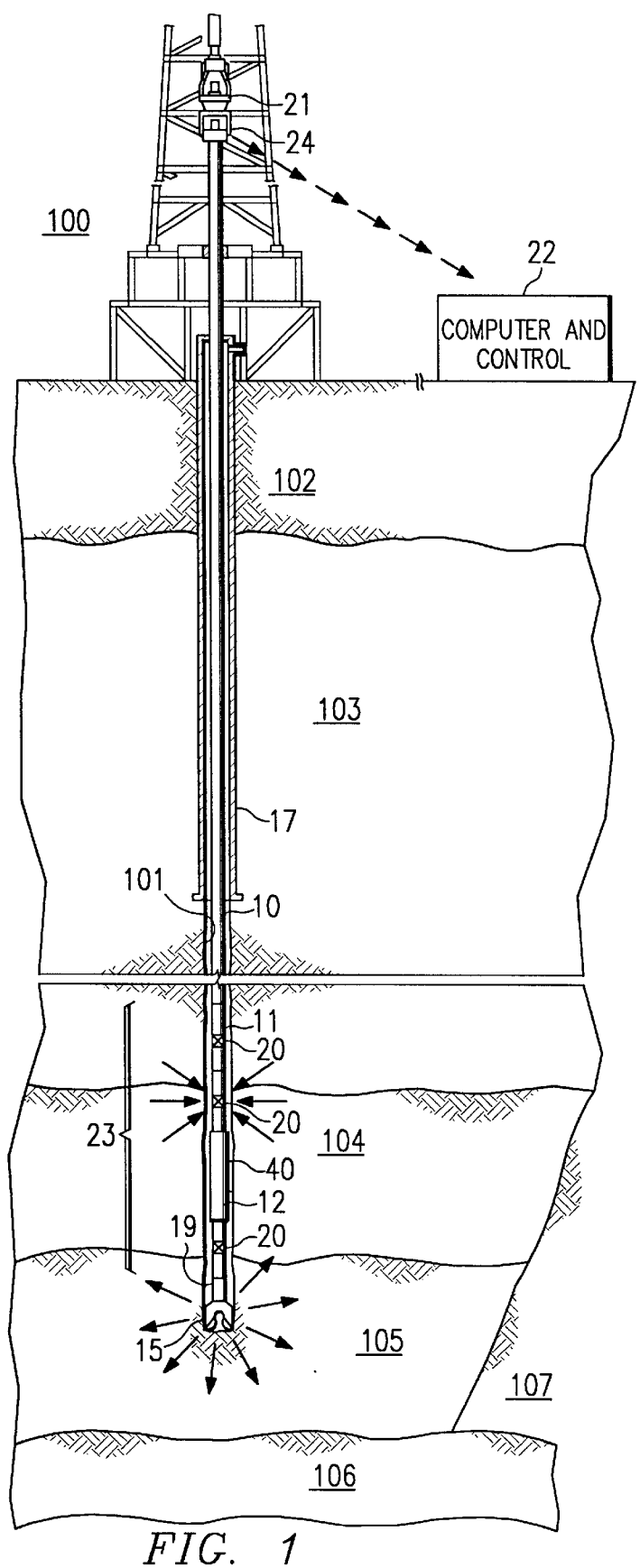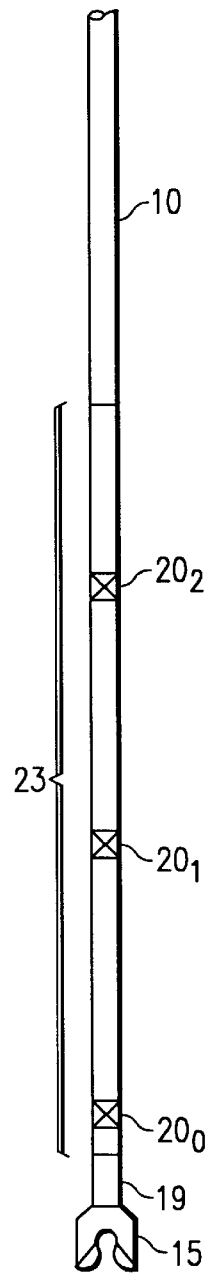
FIG. 1
FIG. 2a

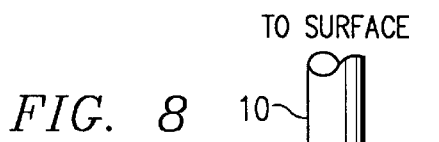
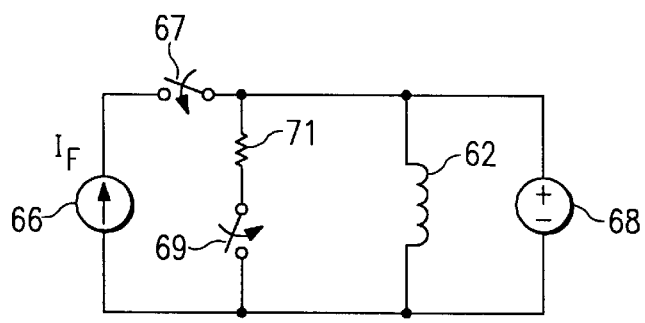
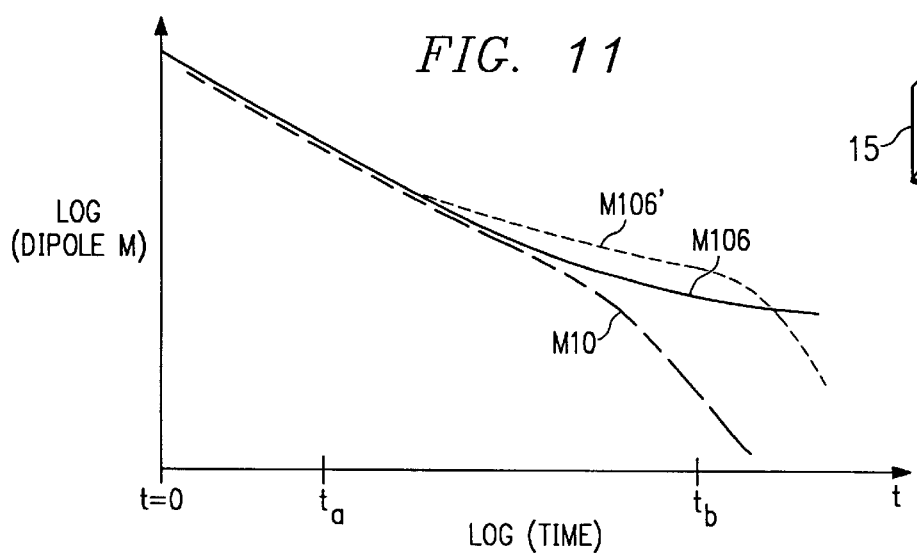

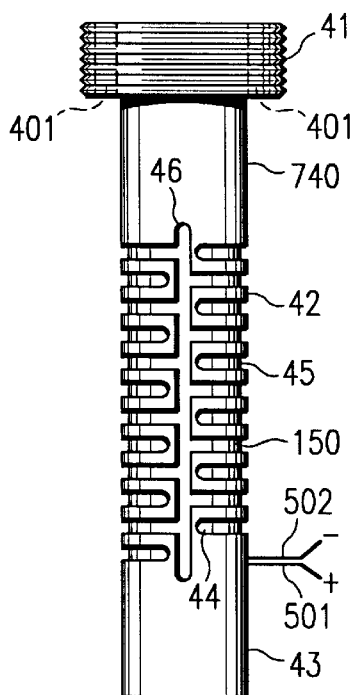
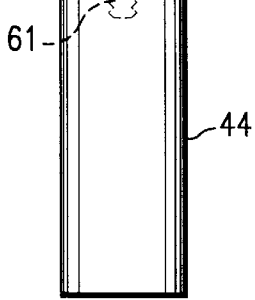
FIG. 14
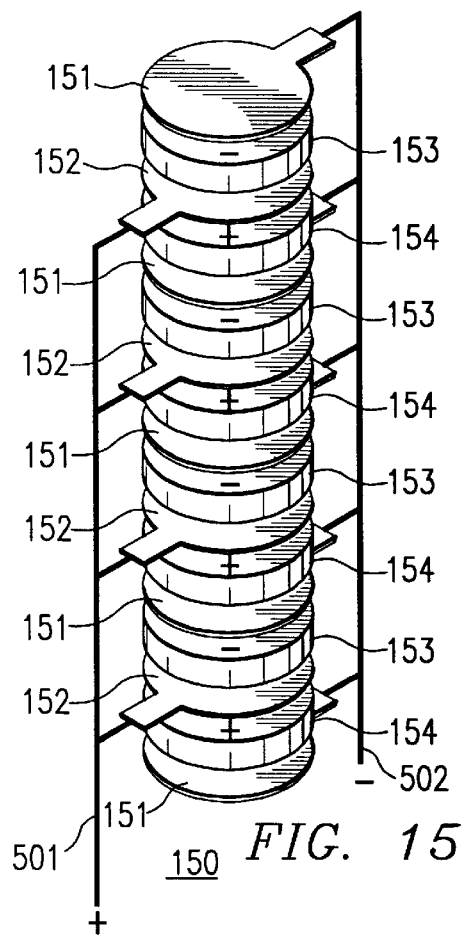
FIG. 15
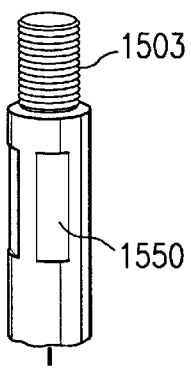
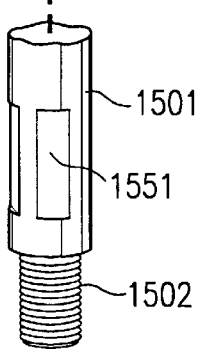
FIG. 17

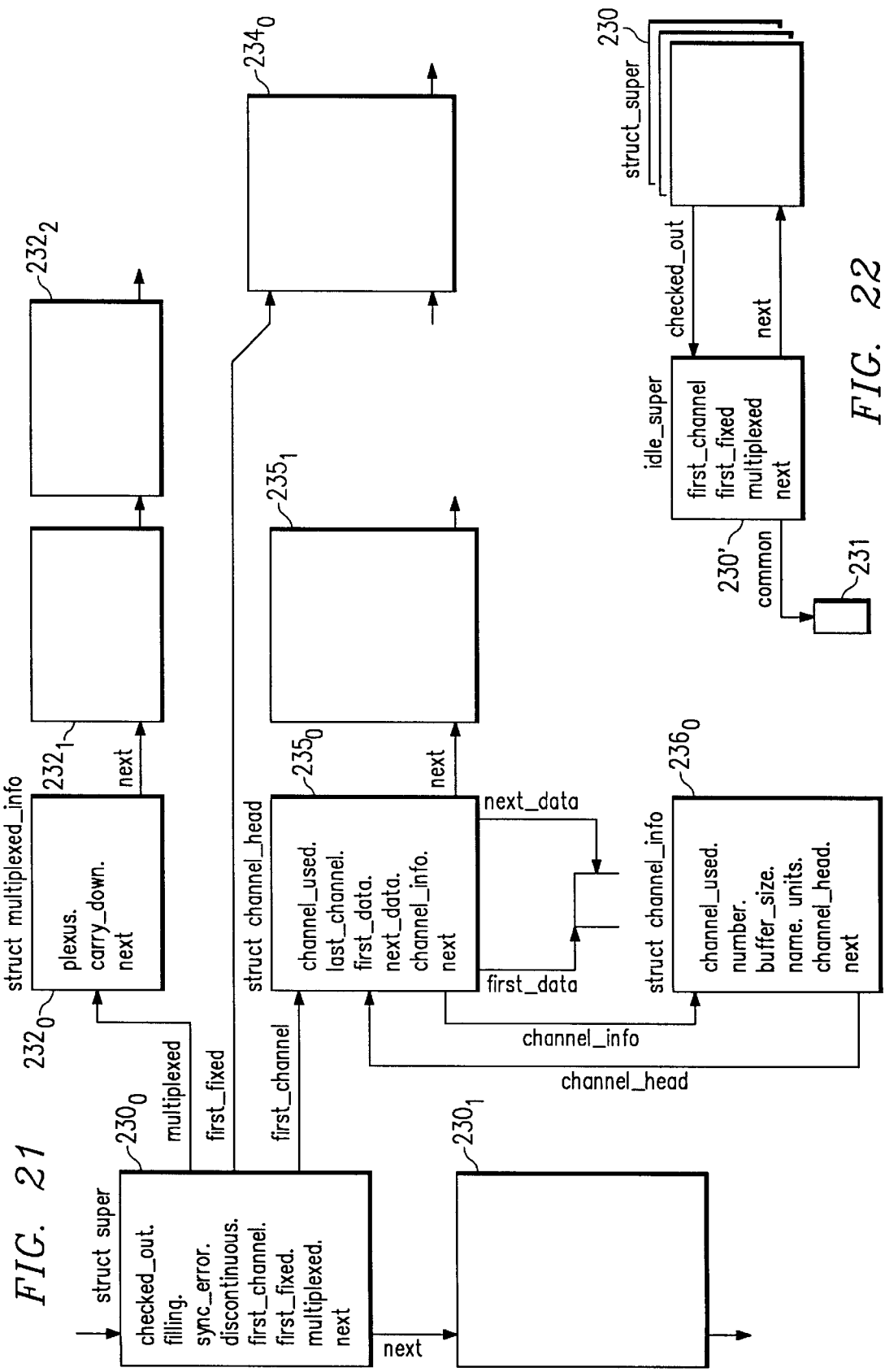

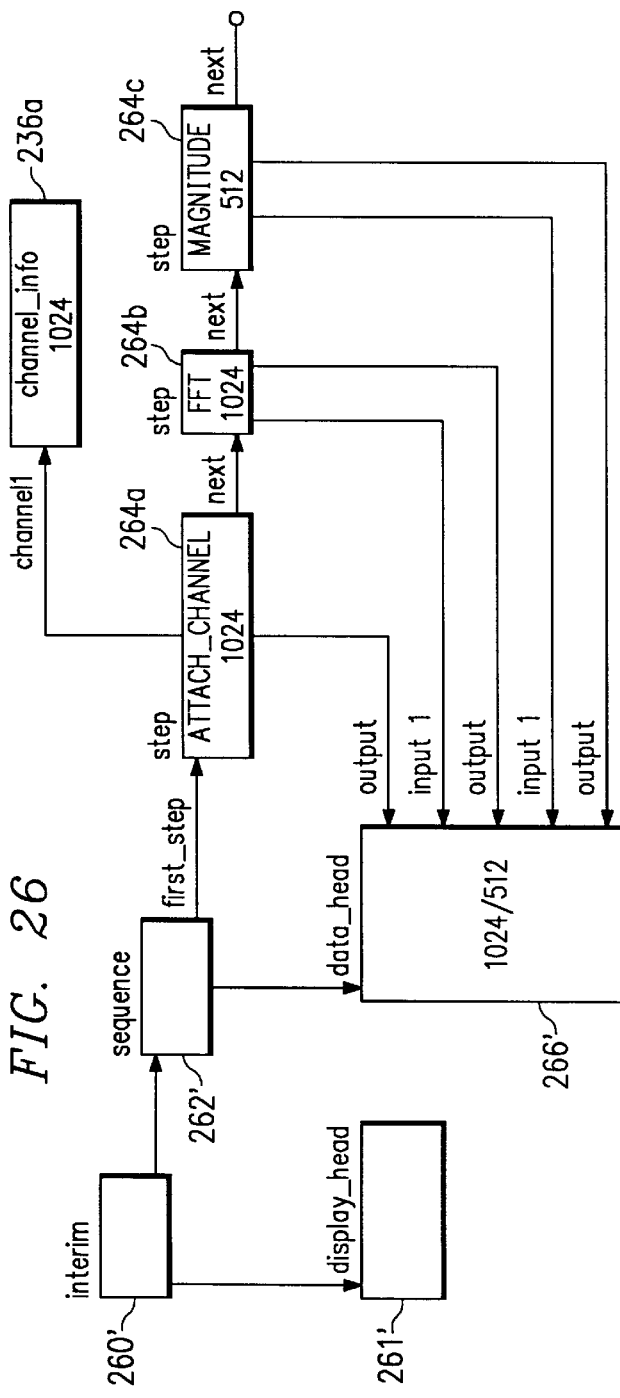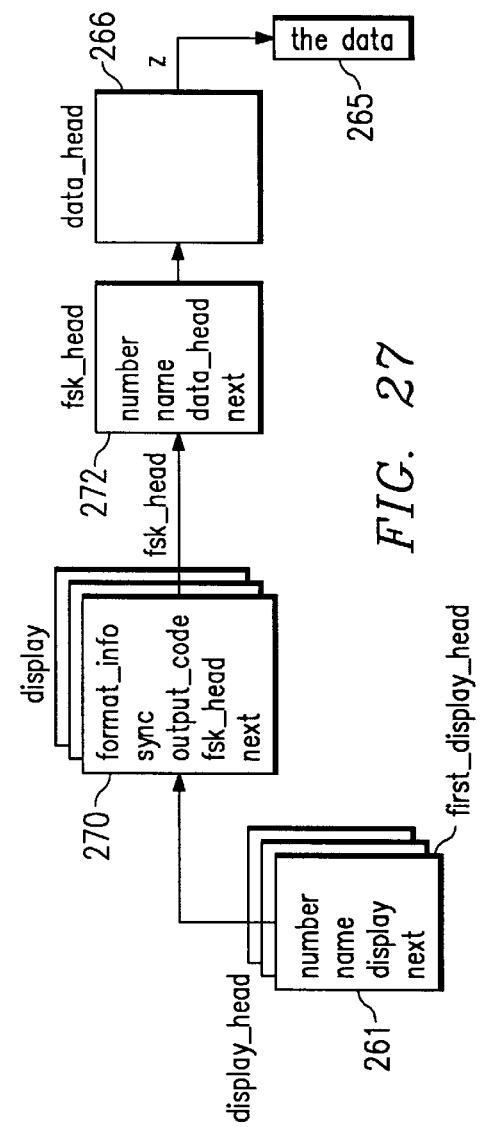

METHOD FOR EXECUTING AN INSTRUCTION WHERE THE MEMORY LOCATIONS FOR DATA, OPERATION TO BE PERFORMED AND STORING OF THE RESULT ARE INDICATED BY POINTERS

This application is a divisional of application Ser. No. 07/771,758, filed Oct. 4, 1991 now abandoned, which is a continuation-in-part of applications Ser. No. 07/554,030 filed Jul. 16, 1990 now U.S. Pat. No. 5,159,226, Ser. No. 07/695,610 filed May 3, 1991 now abandoned, and Ser. No. 07/746,309 filed Aug. 14, 1991 now U.S. Pat. No. 5,166,908, which is a continuation of application Ser. No. 07/554,022 filed Jul. 16, 1990, now abandoned, all assigned to Atlantic Richfield Company and incorporated herein by this reference.

This invention is in the field of hydrocarbon exploration, and is more specifically directed to real-time data acquisition and processing during the drilling operation.

BACKGROUND OF THE INVENTION

While the drilling of wells for the production of hydrocarbons, such as oil and natural gas, has always been quite expensive, even more attention has been paid to drilling costs in recent years. This is due in part to the increasing depth and difficulty of location of remaining hydrocarbon reserves, considering that many shallow and large reservoirs have already been heavily exploited. As drilling costs increase at least linearly with the depth of the well being drilled, newer wells are becoming increasingly expensive. Drilling in hostile surface or sub-surface environments increases the drilling costs. Furthermore, the volatility of prices in the oil and gas markets in recent years has reduced operating profit margins, and thus has placed significant pressure on producers to drill only where the likelihood of paying production is high.

Faster and more efficient drilling, in distance drilled per unit time, is of course highly desired to contain these costs. However, overpressurized sub-surface zones present significant problems to drilling in many locations, as drilling into such a zone causes a blow-out if the pressure of the hydrocarbon (generally natural gas) in the zone exceeds the pressure in the wellbore to such an extent that the hydrocarbon explodes out of the well. In locations where overpressurized zones are expected, drilling must be performed using heavy drilling mud to increase the pressure in the wellbore to hold the hydrocarbon in the overpressurized zone in place when the zone is reached. As is well known in the art, however, drilling with such heavier muds is significantly slower than drilling with lighter muds. Due to the limited accuracy with which conventional seismic surveys can predict the depth of such zones, heavy mud is used over relatively long distances to provide sufficient safety margin. As a result, drilling efficiency is significantly impacted by such conventional drilling and exploration techniques.

In addition, while the use of heavy muds reduces the likelihood of a blow-out, excessively heavy mud used during drilling can damage surrounding formations if the mud pressure is significantly greater than the so-called pore pressure in the earth. Therefore, the weight of the drilling mud has both an upper and a lower limit, outside of which drilling failure can occur.

Inaccuracies in the conventional surface geophysical surveys of course also add uncertainty to the success of the well in reaching any hydrocarbon reservoir. Particularly in many regions of the earth where exploration is currently taking place, reservoirs are limited in size, or may have a narrow cross-section in the plan view. A well drilled according to a conventional survey may narrowly miss the reservoir, where small deviations in the drilling direction would have resulted in success for the well.

For these and other reasons, it is therefore beneficial to acquire accurate information about the physical properties of the formations being drilled during the drilling operation, particularly concerning formations which are ahead of the drill bit. Such information can supplement that which was previously acquired by conventional surface geophysical surveys, and allow for control of the drilling to adjust for any differences between previously acquired information and the actual formations encountered. Furthermore, it is also beneficial to acquire accurate real-time information concerning certain drilling parameters, such as weight-on-bit, RPM, direction of the drill bit, and the like. This information, particularly in combination with surface survey information and information acquired during the drilling about the formations through which drilling has taken place and also into which drilling is about to take place, can allow for intelligent drilling, with parameters modified and adjusted on a real-time basis for maximum efficiency and the highest chances for successful production therefrom. The ability to acquire and utilize this type of real-time data is the goal of the invention described hereinbelow.

By way of background relative to the current state of the art, one type of exploration while drilling method which is known in the art is the "TOMEX" method presently offered by Western Atlas International, Inc. According to this method, energy imparted into the earth by the drill bit, during the drilling operation, is considered as the source energy for seismic surveying, with reflections of this source energy detected by geophones deployed at surface locations away from the drilling location. The "TOMEX" survey method is described in numerous publications, including Rector III, et al., "Extending VSP to 3-D and MWD: Using the drill bit as downhole seismic source", *Oil and Gas Journal*, (Jun. 19, 1989), pp. 55–58, and in Rector, Marion and Widrow, "Use of Drill-Bit Energy as a Downhole Seismic Source", *58th International Meeting of SEG*, paper DEV 2.7, pp. 161–164, U.S. Pat. Nos. 4,363,112 and 4,365,322, and PCT publication WO 88/04435.

However, certain limitations are believed to be present relative to the use of downhole seismic sources in conjunction with surface receivers, such as in the "TOMEX" survey method. Firstly, due to the distance traveled by the seismic energy through the earth, only relatively low frequency (and long wavelength) energy is useful. As a result, the resolution of such surveys is necessarily limited. Secondly, it is quite difficult to obtain an accurate source signature, or pilot signal, from vibrations transmitted along the drill string from the bit to the surface. For example, in the "TOMEX" survey where the source signal is detected by monitoring drill string vibrations, noise of significant amplitude couples into the source vibrations detected at the surface, making determination of the source signature (for purposes of later correlation with the geophone-detected vibrations) difficult and inaccurate. Such difficulties with the noise in drill string vibrations are described in copending application Ser. No. 564,621, filed Aug. 8, 1990, assigned to Atlantic Richfield Company and incorporated herein by reference, in J. P. DiSiena et al., "VSP While Drilling: Evaluation of TOMEX", *Exploration Technology Reiort* (Atlantic Richfield Company, Fall 1989), pp. 13–20, and also in U.S. Pat. No. 4,954,998.

By way of further background, other known analysis methods utilize energy that is generated downhole (for example by the drill bit) and detected at the surface, besides that described hereinabove for seismic surveying. For example, the vibrations in the drill string which are generated by the interaction of the drill bit with the formation can be detected at the surface and analyzed to provide real-time monitoring of drilling conditions and parameters. U.S. Pat. No. 4,715,451, issued Dec. 29, 1987, assigned to Atlantic Richfield Company and incorporated herein by reference, describes a method and system for monitoring drilling parameters by way of spaced apart subs at the upper end of the drill string, such subs including accelerometers and strain gauges. The monitored parameters include axial and torsional loading on the drill bit, axial and torsional drill-string vibrations, and bending modes of the drillstring.

By way of further background, other "measurement-while-drilling", or "MWD", techniques utilize downhole sensors of various parameters, in combination with one of several approaches for telemetry of the detected parameters. Various examples of such approaches are described in Honeybourne, "Measurement While Drilling", Symposium on the 75th Anniversary of the Oil Technology Course at the Royal School of Mines (1988), particularly relative to mud pulse telemetry.

U.S. Pat. No. 4,992,997, issued Feb. 12, 1991, assigned to Atlantic Richfield Company and incorporated herein by reference, describes a stress wave telemetry system for monitoring downhole conditions during drillstem testing, or during wellbore stimulation or fracturing; this system includes accelerometers or strain gauges mounted onto the drillstem near the surface, for sensing torsional, axial or bending vibrations in the drillstem which may be correlated to downhole conditions. The above-referenced related copending applications Ser. No. 554,022 and 554,030, both filed Jul. 16, 1990, both assigned to Atlantic Richfield Company, and both incorporated herein by this reference, describe another example of a telemetry system, where a transducer disposed within the drill string provides high data rate telemetry from downhole to the surface by way of acoustic axial or torsional vibrations. These techniques communicate data on a real-time basis, without requiring that drilling be stopped as in the case of conventional well log tools and techniques.

By way of additional background, conventional wireline logging tools are used to evaluate the properties of formations surrounding wellbores, in conjunction with drilling operations. These logging tools are lowered into the wellbore periodically in the operation, with the actual drilling and excavation stopping during the logging operation. These downhole logging tools include radioactive and electromagnetic instrumentation, of various types.

A first type of electromagnetic logging tool is the direct coupled, or galvanic, logging tool. An example of a currently available galvanic logging tool are those of the well-known "Laterolog" type, available from Schlumberger. Such galvanic logging tools source a current into the earth from one electrode, for example the upper portion of the drill string, and measure a potential difference with other electrodes in the logging tool. Conventional galvanic logging tools have a relatively shallow depth of investigation (on the order of inches to several feet), as the information of interest is the resistivity of the formation immediately outside of the so-called invaded zone; accordingly, the distance between a potential-measuring electrode and one of the current electrodes is quite small. Logging tools of the Laterolog type include an opposing current, to focus the investigation into the formation within a narrow plane perpendicular to the borehole. The Laterolog principles are also used in "measurement-while-drilling" galvanic tools, such as available as the "FCR" measurement system from EXLOG.

The second type of electromagnetic wireline logging tool is often referred to as an electromagnetic induction tool. In this tool, two coils are lowered into the wellbore, separated along the axial length of the wellbore. One of the coils is energized to produce electromagnetic waves of known frequency and amplitude, and the other coil measures the electromagnetic energy it receives from the first coil, after the waves have traveled through the formation. Analysis of the amplitude attenuation and phase shift of the received waves from the transmitted waves will be indicative of the impedance of the surrounding formation.

In the case of these induction tools, it should be noted that the measurement is directed substantially perpendicular to the axis of the wellbore (at the location of the tool), but only for a limited distance. This is due to the purpose of this tool of determining the local resistivity of the surrounding formation, assuming homogeneity of the formation. The distance of interest from the wellbore is preferably far enough away so that the effects of drilling mud packing into the near-wellbore layer of the formation are minimized, but not far enough away that another formation type is encountered by the waves. Since the logging by this tool assumes (and relies upon) homogeneity of the measured layer, the readings and analysis of the received energy from multiple formation types is undesired. Typical distances over which the waves of interest travel are on the order of 10 feet from the wellbore, in substantially a perpendicular plane therefrom.

"Logging-while-drilling" tools, which provide surrounding formation analysis by monitoring certain types of radioactivity (such radioactive measurements conventional for wireline logging tools) and which apparently may be used during drilling, are known to have been developed by Magnetic Pulse, Inc. The measurements available from this tool include the passive measurements of gamma ray emission from the surrounding formation, including spectral analysis of the gamma ray emission to determine the presence of certain elements in the formation. The tool is also apparently capable of neutron density measurements, as the tool has a neutron source (such as AmBe) and detector, such that the density of the formation can be determined by the number of neutrons detected after back-scattering by the formation to the neutron detector. A Cesium gamma ray source in such a tool is also known, such that density measurements may also be made by detecting gamma ray back-scatter from the formation.

By way of further background, Bradley, et al., "Microprocessor-Based Data-Acquisition System for a Borehole Radar", *IEEE Trans. Geoscience & Remote Sensing*, Vol. GE-25, No. 4 (IEEE, 1987) describes the use of a downhole radar tool for evaluating the formations surrounding the wellbore. By way of still further background, van Popta et al., "Use of Borehole Gravimetry for Reservoir Characterisation and Fluid Saturation Monitoring", Publication 988 (Shell Internationale Research Maaschappij B. V., 1990) describes a method of measuring secondary gas saturations in a fractured reservoir using borehole gravimetry.

By way of further background, U.S. Pat. Nos. 4,929,896, 4,906,928, 4,843,319, 4,839,593 and 4,929,898, all assigned to Atlantic Richfield Company and all incorporated herein by reference, describe systems for the measurement of the thickness of a conductive container, such as a pipe, by way of current induction. This method is commonly referred to as transient electromagnetic probing, or "TEMP". In these systems, a transmitting antenna generates a magnetic field, which in turn produces eddy currents in the conductive container being measured. These eddy currents produce a magnetic field, which is measured by a receiving antenna. The rate of decay of the measured current corresponds to the rate of decay of the eddy currents in the container being measured, which corresponds to the thickness of the conductive walls or coating of the container. Accordingly, these systems allow for non-contact measurement of the thickness of containers such as petroleum pipelines, so that the effects of corrosion may be monitored.

It is an object of this invention to provide a method and system for obtaining accurate seismic data, with high spatial resolution, which looks ahead of the drill bit during the drilling operation into nearby formations.

It is a further object of this invention to provide such a method and system which utilizes acoustic vibrations generated by the drill bit as the source for such data.

It is a further object of this invention to provide such a method and system which utilizes electromagnetic energy, both DC and induction, generated downhole.

It is a further object of this invention to provide such a method and system which can detect approaching overpressurized zones, so that drilling efficiency may be maximized by use of heavier drilling muds only in those regions at and near such overpressurized zones.

It is a further object of this invention to provide such a method and system which can provide for optimized casing design, relative to the heavy weight mud which must be used once such an overpressurized zone is reached.

It is a further object of this invention to provide such a method and system which includes downhole sensors of downhole-generated source energy, to provide for improved accuracy in the resulting data analysis.

It is a further object of this invention to provide such a method and system which includes high data rate telemetry for communication of the downhole sensed energy, to provide improved resolution look-ahead analysis.

It is a further object of this invention to provide such a method and system which includes downhole computing capability sufficient to provide real-time analysis of the downhole-sensed information, such that the results of the analysis can be communicated to the surface with even relatively low data rate telemetry.

It is a further object of this invention to provide such a method and system which utilizes downhole computing capability of sufficient performance as to allow conventional low data rate downhole-to-surface telemetry to communicate the results.

It is a further object of this invention to provide such a method and system which includes spaced apart downhole sensors for purposes of reduction of noise, and so that the resulting analysis can determine the location of certain sub-surface structures.

It is a further object of this invention to provide such a method and system which can provide information regarding the temperature and pressure near the bottom of the wellbore at data rates high enough so that pressure dynamics of flow and reservoir recovery can be used to assist in characterization of the reservoir.

It is a further object of this invention to provide such a method and system which can provide information regarding wellbore pressure, time rate of change of pressure, and pH of the surrounding fluid, in order to monitor the progress of acid treatment completion of oil and gas wells, and in order to monitor the extent of formation fracturing in completing oil and gas wells.

It is a further object of this invention to provide such a method and system which provides real-time drilling parameter monitoring capability in an improved manner.

It is a further object of this invention to provide such a method and system which can detect the presence of faults and interfaces which are at angles other than perpendicular to the direction of drilling.

It is a further object of this invention to provide such a method and system which can monitor parameters of formations through which drilling has already taken place, and to use this monitored information in providing a survey relative to formations into which drilling has not yet taken place.

It is a further object of this invention to provide such a method and system which utilizes spaced apart detection locations along the drill string so that drillstring interaction and distributed operator response characteristics can be measured.

Other objects and advantages of this invention will be apparent to those of ordinary skill having reference to the following specification together with the claims.

SUMMARY OF THE INVENTION

The invention may be incorporated into a downhole system, for example a drilling rig, where energy is imparted into the surrounding formation near the bottom of the wellbore. The energy may be vibrational energy, including that generated by the drill bit itself, or may be electromagnetic energy generated by a downhole source of the same. Sensors are provided at one or several downhole locations along the drill string, for detecting the imparted energy after it has traveled through the surrounding formation. The sensors may include accelerometers, strain gauges, and fluid pressure detectors, where the energy is acoustic vibrations; for electromagnetic energy, the sensors may include coils or resistivity probes.

Due to the provision of the downhole sensors, the operating frequencies of the energy may be quite high, thus providing high resolution information regarding the composition of the surrounding formations. In addition, the sensors are deployed in such a manner that energy is received from a relatively large volume surrounding the wellbore, including formations which are ahead of the drill bit. In addition, selection of the downhole sensor and frequencies of the energy can be varied to, in turn, vary the depth of investigation. Accordingly, both high resolution logging in the conventional sense and lower resolution look-ahead and look-around logging may be accomplished by the same system.

The detected energy may be communicated to the surface by way of high speed telemetry, including hardwired telemetry or stress wave telemetry, which can transmit the information at relatively high data rates commensurate with the high frequency information generated and detected. Alternatively, downhole computing equipment may be provided which is particularly adapted to performing complex analysis of the detected energy, with the results of the analysis communicated to the surface by way of either low or high data rate telemetry.

The invention provides for increased visibility into formations ahead of and surrounding the wellbore, on a real-time basis during the drilling operation. This increased visibility can be used in order to verify prior seismic surveys of the drilling location. For example, where drilling is being performed into an area where the stratigraphy is known, this visibility provides verification of the geologic location of the drilling operation; conversely, where drilling is being performed into an area where only a surface seismic survey has been performed, this visibility provides verification of the seismic location of the drilling. The invention can also provide accurate prediction of the properties of formations into which drilling is about to occur. Of particular importance is the ability of a system according to the invention to provide real-time information concerning overpressurized formations immediately ahead of the bit, so that heavy drilling mud need only be provided as such zones are approached rather than throughout the drilling as may now be necessary when drilling at locations for which less accurate surveys are provided. By limiting the length during which the heavier drilling mud is used, and by thus maximizing the length over which lighter drilling fluids are used, the efficiency and speed of the drilling operation is greatly increased.

In addition, the invention provides the ability to monitor the drilling operation itself by sensing and communicating drilling parameters, and also the ability to characterize the formations as the drilling takes place therethrough. Information concerning the surrounding formations also can be used to direct the drilling operation into reservoirs which may be located near the wellbore, but which would not be intersected if the drilling continued along its current path. In addition, monitoring the drilling parameters such as RPM, WOB and the like, allows for their real-time control and optimization of the drilling operation to increase the rate of penetration, as well as reducing the likelihood of washouts, twist-offs and other drilling failures.

BRIEF DESCRIPTION OF THE DRAWINGS

FIG. 1 is a schematic illustration of a generalized system according to the present invention.

FIG. 2a is a schematic diagram of a seismic measurement-while-drilling logging tool according to a first embodiment of the present invention.

FIGS. 3a and 3b are cross-sectional diagrams of a detector in the tool of FIG. 2a.

FIG. 8 is a cross-sectional diagram illustrating an electromagnetic induction logging tool according to another embodiment of the invention.

FIG. 9 is an electrical schematic for one coil in the embodiment of FIG. 8.

FIG. 11 is a plot of magnetic dipole moment versus time, as useful in the operation of the embodiment of FIGS. 8 and 10.

FIGS. 14 and 15 are views of a transducer for generating compressional vibrations according to one embodiment of the invention.

FIG. 17 is an exploded view of a housing for the transducer of FIG. 16.

FIG. 21 is a data structure diagram illustrating the acquisition of data by the system of FIG. 18.

FIG. 22 is a data structure diagram illustrating the handling of excess data by the system of FIG. 18.

FIG. 26 is a data structure diagram illustrating an example of the data processing performed by the system of FIG. 18.

FIG. 27 is a data structure diagram illustrating an example of the output data presentation by the system of FIG. 18.

DETAILED DESCRIPTION OF THE PREFERRED EMBODIMENTS

Figure 2B:
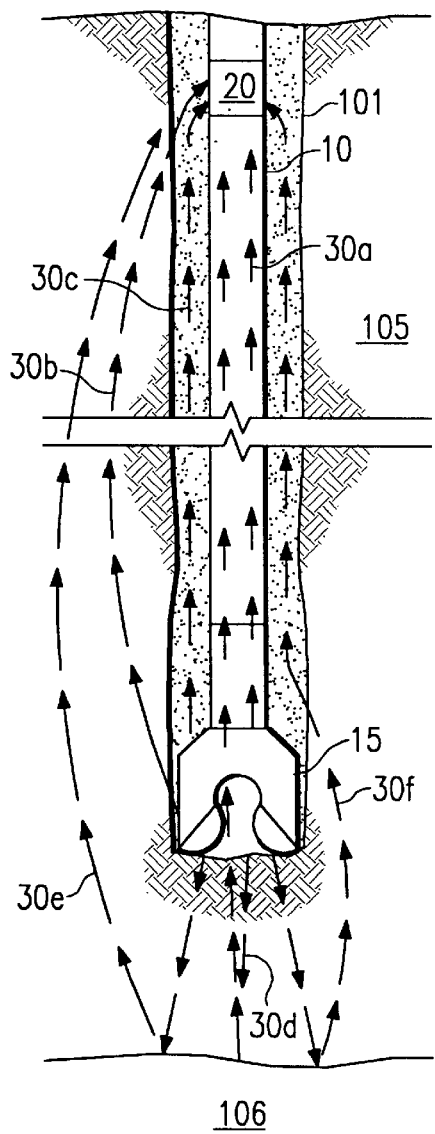
FIG. 2b is an elevation view of a portion of the tool of FIG. 2a, illustrating potential paths for the seismic energy from bit to detector.

The following description of the preferred embodiments of the invention will begin with description of the context and environment into which the present invention may be applied. The generation and detection of alternative energy types, and alternative telemetry and downhole computing systems, will be described in further detail thereafter.

I. Overview of the Real-Time Look-Ahead Prospecting and Monitoring System

Referring to FIG. 1, the context of the present invention, and an overview of its objects and advantages, will now be described. FIG. 1 illustrates drilling rig 100 in the process of drilling a wellbore into the earth for purposes of producing hydrocarbons from sub-surface reservoirs. Drilling rig 100 includes drill string 10 which is suspended from a conventional derrick, and which, in this example, is powered by swivel 21 at the surface, in the conventional top-drive rotary fashion. At the distal end of drill string 10 from the surface is a conventional drill bit 15. The rotation of drill string 10 from swivel 21, together with the weight of drill string 10 on bit 15, causes excavation of the earth by drill bit 15 to form wellbore 101 along the drilling path.

At the stage of the drilling operation shown in FIG. 1, wellbore 101 has been drilled from the surface through sub-surface strata 102, 103, and 104, with drilling currently taking place into stratum 105 and approaching stratum 106. A portion of the wellbore 101 is lined with casing 17, in the example shown in FIG. 1. As is conventional in the art, the annular portion of wellbore 101 surrounding drill string 10 will generally be filled with drilling fluid, or "mud". As is also conventional in the drilling art, such drilling mud is provided by pumping the same into drill string 10 from the surface, with the mud exiting from drill bit 15 at the downhole end of drill string 10 and returning to the surface via wellbore 101. The drilling mud not only lubricates the excavation action of the drill bit, but also serves to remove the cuttings from the excavation site, carrying the same to the surface. Also as is well known, drilling mud, if of sufficient weight and density, can prevent the explosive release of hydrocarbons out of wellbore 101, in the event that a highly pressurized hydrocarbon reservoir is reached by drill bit 15.

Particularly in locations where the cost of drilling is quite high, it is conventional to have a seismic survey performed of the region surrounding the drilling location prior to commencing drilling, such that the likelihood of reaching a hydrocarbon reservoir is predictable. Such surveys will, of course provide some indication of the presence and depth of the various sub-surface strata 102 through 106, and the interfaces therebetween. As is well known, hydrocarbon products, such as oil and gas, may reside in certain strata, or in interfacial traps between the same. However, while modern survey techniques can be relatively accurate in providing a survey of the drilling field, both recent surveys and particularly older surveys will be somewhat inaccurate in determining the depth of the sub-surface strata and interfaces. As a result, particularly if it is expected that highly pressurized regions will be drilled into, significant safety margin must be incorporated into the design of the drilling operation, to prevent explosive "blow-outs" at such time as those regions are reached.

In many drilling operations where such blow-outs are feared, extremely heavy drilling mud is conventionally used to reduce the risk and severity of reaching an over-pressurized zone. The heavy drilling mud increases the pressure within wellbore 101 near bit 15, increasing the pressure at which a blow-out can occur. However, the use of such heavy drilling mud decreases the drilling speed, thereby increasing drilling costs. Accordingly, inaccuracies (either actual or perceived) in the seismic survey require excessive use of heavy drilling muds add significant expense to the drilling operation, and also increases the risk of damaging formations that may otherwise have produced hydrocarbons.

Of course, inaccuracies in the seismic survey can also result in unsuccessful drilling. Referring to FIG. 1, region 107 is illustrated at a location adjacent to wellbore 101, but in a location which will not be reached so long as the drilling continues along its same path. The shape of region 107 is particularly troublesome to detect in conventional seismic surveys, as it has a boundary which is substantially vertical. If region 107 were the reservoir from which production is sought via the drilling operation of FIG. 1, the illustrated well would be unsuccessful.

The present invention is directed to providing real-time look-ahead information about the surrounding sub-surface formation so that prior seismic surveys can be verified, or to provide a new survey by sensing the presence and depth of layers not previously found. The present invention can also provide information about current drilling parameters, as will also be described in detail hereinbelow.

By way of overview, according to the present invention, energy is emitted from a downhole source, such as drill bit 15 or a source near drill bit 15, as illustrated in FIG. 1. According to the present invention, tool 23, having one or more downhole detectors 20 and data handling unit 40, is coupled between drill string 10 and bit sub 19; bit sub 19 is connected to drill bit 15. Within tool 20, at least one detector 20 is placed as close to drill bit 15 as possible, preferably within several feet of bit 15. If multiple detectors 20 are deployed in tool 20, these detectors 20 are preferably spaced from one another, as will be described in more detail hereinbelow. Detectors 20 sense the energy originally generated by drill bit 15 or such other source, after the energy has traveled through surrounding formations, including energy which has reflected from interfaces in advance of or otherwise near wellbore 10.

As a result of this configuration, both an energy source and energy detector are provided downhole. The distances required for the travel of the energy are much shorter (e.g., on the order of tens of feet) than that in prior seismic MWD methods, such as the above-noted "TOMEX" method, where the energy travels from the drill bit 15 to the surface through hundreds, or even thousands, of feet of earth. The shorter travel distances in the system according to the present invention allow for the use of higher frequency energy, including high frequency seismic vibrations (on the order of 100 to 2000 Hz), as such high frequency energy is attenuated, per unit distance through the earth, to a greater extent than is low frequency energy. Since the resolution increases with the bandwidth of the energy used, the resolution achievable according to the present invention is much improved from conventional surface-based, or MWD-type, surveys.

It is recognized that the detection of high frequency energy provides a large amount of data in short periods of time. In addition, according to the present invention, this large amount of data may be handled in alternative fashions. According to a first alternative, the energy detected by detectors 20 is communicated as raw data to the surface. This may be accomplished by high speed telemetry equipment having a transmitter downhole within data handling unit 40, which communicates the raw detected data along drill string 10 to the surface, such as to sub 24 which contains receivers therewithin. The data is then communicated by hard-wire, or by microwave, radio, or other transmission, to a computer and control center 22, as suggested by FIG. 1. Computer and control center 22 is preferably an on-site computer capable of analyzing the data transmitted thereto, as such on-site analysis can provide real-time guidance to the drilling operation, with the direction, weight-on-bit, mud weight and other parameters adjusted according to the analyzed data. Alternatively, the data may be transmitted (or stored and transported) to a remote computing site, for analysis in a non-real-time mode.

Such high-speed telemetry may be accomplished by electrical hard-wired communication within drill string 10. For example, where detectors 20 are piezoelectric transducers of some type, so as to convert mechanical energy into an electrical signal, the output of detectors 20 may be either directly communicated along a wire or cable to the surface, or may be communicated to a downhole sending unit within data handling unit 40 for transmission along a wire or cable to the surface. However, the provision of communication wires and cables in a downhole drilling environment is a difficult task, considering the high temperatures, high pressures, and other conditions (including the mechanical rotation of drill string 10, the communication of drilling mud therethrough, and the like). As such, while high speed electrical communication along such wires may be used in the present invention, such use is subject to certain limitations.

Therefore, according to the alternative of the present invention in which the energy detected by detectors 20 is communicated in substantially raw form from downhole to the surface, a preferred telemetry technique is the use of modulated vibrations to communicate the same. This communication technique is referred to as stress wave telemetry, and certain techniques and systems for such stress wave telemetry are described in U.S. Pat. No. 4,992,997, issued Feb. 12, 1991, assigned to Atlantic Richfield Company and incorporated herein by reference. Examples of preferred stress wave telemetry systems according to the present invention utilize piezoelectric sending transducers which are located within the inner diameter of data handling unit 40, rather than external to the drill string, are described in copending application Ser. Nos. 554,022 and 554,030, both filed Jul. 16, 1990, both assigned to Atlantic Richfield Company, and both incorporated herein by this reference. According to such stress wave telemetry systems, the sending unit in data handling unit 40 vibrates drill string 10 with modulated vibrations at relatively high frequencies, such as on the order of 1000 Hz. The information is communicated by way of frequency shift keying (FSK), phase shift keying (PSK) or other modulation techniques for modulating either axial or torsional vibrations that are applied to drill string 10 at a carrier frequency. Detectors are placed within sub 24 at the surface, such detectors being accelerometers, strain gauges, and the like, for converting the transmitted vibrations into corresponding modulated electrical signals. Demodulation of the modulated electrical signals can then be performed to retrieve the transmitted information from the modulated signal; this information may be transmitted, either in modulated or demodulated form, to computer and control unit 22 as illustrated in FIG. 1. Further detailed description of such a telemetry system will be given hereinbelow.

In the alternative to a piezoelectric transducer, the vibrations and stress waves may be generated by use of a magnetostrictive transducer, utilizing materials such as Terfenol-D which change shape in response to a magnetic field applied thereto. Magnetostrictive transducers may be preferable in some applications, particularly offshore, due to their lower voltage operation as compared with piezoelectric transducers. It is contemplated that provision of a heat conduction path, or other heat dissipation or cooling mechanism, will be preferred in such a transducer, as the $I^2R$ heat may be significant due to the relatively high current required in this technology. The Terfenol-D material and its use in actuators is described in Goodfriend, "Material Breakthrough Spurs Actuator Design," *Machine Design* (Mar. 21, 1991), pp. 147–150, incorporated herein by this reference.

In the alternative to telemetry of the energy detected downhole according to the present invention, downhole computing equipment may be provided in downhole data handling unit 40 to analyze the data and transmit the results to the surface. The analysis which may be performed downhole is contemplated to range from a thorough and full analysis of the data so that merely an alarm signal may be transmitted to the surface (thereby requiring only low data rate telemetry between data handling unit 40 and the surface), to rudimentary analysis of the data such that intermediate results are transmitted to the surface for completion of the analysis by computer and control unit 22.

As will be described in further detail hereinbelow, modern integrated circuit technology provides high levels of computing power in relatively small single integrated circuit chips. Particularly, numerous digital signal processor integrated circuits, which can digitally analyze analog information such as will be detected by detectors 20 using Fast Fourier Transforms (FFTs), digital filters, and the like, are now commonly available. A preferred architecture for a downhole computer in data handling unit 40 will be described in further detail hereinbelow. The provision of such downhole computing power thus allows for the high data acquisition rates contemplated by the present to be fully utilized to provide high resolution prospecting and formation analysis.

Considering the above alternatives for handling the data generated downhole relative to the prospecting system described herein, data handling unit 40, as it will be used in the description hereinbelow, will refer generically to downhole control, computing and communications electronics necessary to perform the described functions. As is evident from the foregoing, data handling unit 40 may be quite simple, including only that circuitry necessary to communicate the detected energy, and also perhaps to generate the input energy (as in the electromagnetic cases described hereinbelow). Alternatively, data handling unit may include high levels of computing capability (such as will be described in detail hereinbelow) so that the analysis of the data may be performed downhole, reducing the telemetry requirements for communicating the results to the surface. It is contemplated that, considering the functions as described herein, the construction and design of a particular data handling unit 40 will be apparent to one of ordinary skill in the art having reference to this specification.

The ability to utilize downhole-generated and downhole-detected energy, either acoustic or electromagnetic energy, enables high resolution visibility into the volume surrounding the excavation location of the bit. It is contemplated that this ability allows the monitoring of parameters concerning formations through which drilling has taken place, such as velocities and rock mechanics properties; this information can be used to verify or adjust prior surveys and core samples. In addition it is contemplated that the present invention can provide survey information in regions ahead of the bit, and on all sides of the bit. Seismic survey information so provided can include information in both the compressional and shear mode sense, including amplitude and phase analysis; the electrical survey information can be derived from resistivity measurements, as well as AC measurements which transmit and receive electromagnetic energy to detect conductive layers by monitoring the rate of decay of eddy currents therein. Particularly, it is contemplated that the presence and distance away of over-pressurized zones can be determined with relatively high resolution, such that heavy drilling mud and other blow-out prevention actions can be taken as the drilling site becomes near such a zone, rather than forcing such precautions to be taken throughout the drilling operation, where the sole effect of such precautions is to retard the drilling progress.

It is further contemplated that the energy detected by downhole detectors 20 will provide improved monitoring of drilling parameters, including axial and torsional strain and acceleration information, detection of drill string and casing interaction or abrasion, as well as rotating and non-rotating lateral acceleration and bending strain spectra. In addition, it is contemplated that information concerning both wellbore dimension and shape, and drilling mud rheology (including its specific gravity, viscosity, lubricity, and the like) and pressure, can be obtained by way of the present invention.

The remainder of this specification will describe various approaches to the system of the present invention in further detail. The next following section is directed to data acquisition, and describes examples of both a seismic and an electromagnetic system. Following the data acquisition portion of the specification, data handling will be described in detail, including both a telemetry approach and a downhole computing approach. It should be noted that either of the seismic or electromagnetic data acquisition systems may be used with either of the telemetry or downhole computing options. As a result, the following detailed description is presented by way of example, and is not intended to limit the scope of the invention as claimed.

II. Data Acquisition
A. Look-ahead Seismic Monitoring and Prospecting

According to a first alternative embodiment of a data acquisition method and system, acoustic vibrations are generated and detected downhole, thus providing downhole look-ahead seismic monitoring and prospecting capability.

FIG. 2a illustrates, in more detail, the position of detectors 20 within tool 23 according to this embodiment of the invention. Tool 23 is connected as closely as possible to drill bit 15, for example right behind bit sub 19 (and the rear bit stabilizer, if used). Within tool 23, detector $20_0$ is located as near as possible to bit 15, preferably within several feet thereof. Detector $20_1$, the next nearest detector 20 in tool 23, is preferably separated from detector $20_0$ by at least approximately one-quarter wavelength of the lowest frequency energy of interest. It is contemplated that the seismic energy generated by drill bit 15, and which is of interest for high resolution look-ahead prospecting, is on the order of 100 Hz to 2 kHz; as such, the separation between detectors $20_0$ and $20_1$ is preferably on the order of 7 to 15 feet. An additional detector $20_2$ is similarly separated from detector $20_1$, by a similar distance.

Tool 23 also includes data handling unit 40 (not shown in FIG. 2a for clarity), including data telemetry equipment as will be described in detail hereinbelow, and which may also include downhole computing capability which will also be described in detail hereinbelow. The construction of a single tool 23 which houses detectors 20 and data handling unit 40 is preferred over alternative techniques such as threadably connecting each detector 20 and the data handling unit 40 between drill string sections, as a single tool 23 only requires two couplings, thus providing improved reliability. It is contemplated that the total length of tool 23 may range up to on the order of ninety feet; as such, additional detectors 20 may be deployed therein as desired. The limitation on the length of tool 23 will depend upon the maximum length which the drilling operator can add to the drill string during drilling, as well as on the mechanical strength of tool 23 itself.

Referring now to FIG. 2b, the downhole portion of the system will now be described in further detail. Drill bit 15 is in contact with the formation 105 into which drilling is currently taking place. As is well known, particularly as pointed out by the references noted hereinabove relative to the "TOMEX" technology, drill bit 15 imparts seismic energy, in the form of vibrations, into the earth as it excavates wellbore 101 along the drilling path. This energy is travelling radially away from the location at which drill bit 15 is in contact with the earth, and will be at frequencies, and components (compressional, horizontal shear, vertical shear) which depend upon the drilling operation at each instant.

The seismic energy generated by drill bit 15 travels along various paths in the apparatus, as shown in FIG. 2b, with the velocities of the energy depending upon the characteristics of the media of transmission. In addition, as for conventionally generated seismic energy as used in typical surveys, the seismic energy from the bit will be reflected from interfaces and structures at which the instantaneous velocity changes. For example, assuming that stratum 106 of FIG. 2b has a different velocity to vibrations from that of stratum 105, reflection of the vibrations generated by drill bit 15 will occur, to some extent, from the interface between strata 105 and 106. According to this embodiment of the invention, detection of the reflected vibrations from this, and other, interfaces will provide information about the distance between drill bit 15 and the interface, as well as information concerning the type of material in stratum 106.

In the alternative to drill bit 15 serving as the seismic source, a seismic, acoustic, or vibrational source may be provided downhole, preferably near drill bit 15, for generating the source energy. Such a dedicated source would allow for selection and control of the amplitude and frequency of the input seismic energy.

The vibrations generated by drill bit 15 and transmitted in its environment will likely manifest themselves at locations along drill string 10 in several forms. Referring to FIG. 2b, detector $20_0$ is located near drill bit 15, as noted above relative to FIG. 2a. According to this embodiment of the invention, it is preferred that each detector 20 be capable of detecting acceleration, strain, and pressure changes in the drilling fluid surrounding detector 20. This will allow comparison of the types of information received at approximately the same time by detectors 20, which may also be indicative of the surroundings, and which may be useful in separating signal from noise.

Figure 3A:
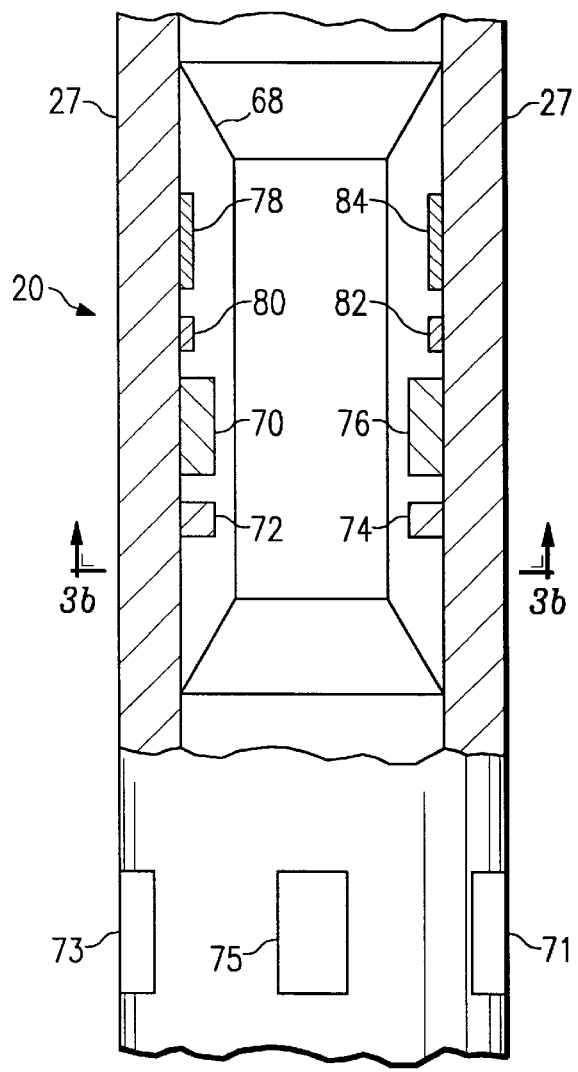
Figure 3B:
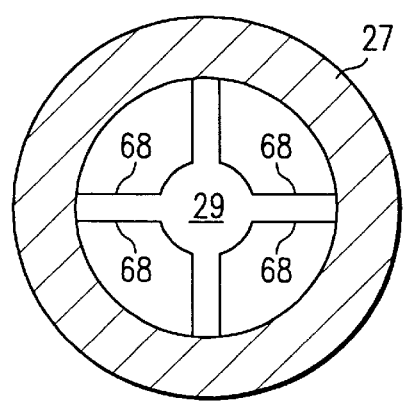

Referring now to FIGS. 3a and 3b, a preferred embodiment of detector 20 will be described in further detail. Detector 20 contains the appropriate apparatus for detecting energy in the form of acceleration, strain, and fluid pressure; the acceleration and strain energy is detectable in varying directions according to this construction of detector 20.

The accelerometer and strain gage system in detector 20 is functionally similar to that described in the above-referenced and incorporated U.S. Pat. No. 4,992,997, issued Feb. 12, 1991, and U.S. Pat. No. 4,715,451, issued Dec. 29, 1987, both assigned to Atlantic Richfield Company. In the example illustrated in FIG. 3a, detector 20 corresponds to a portion of tool 23, through which drilling mud may pass from the surface to drill bit 15 in the conventional manner. At the location of detector 20, protective cover or liner 68 is disposed within the interior of tool 23 to cover a portion of the interior walls 27 thereof from drilling mud passing therethrough. Located within the space provided by liner 68, and attached to walls 27 of tool 23, are accelerometers 70, 72, 74 and 76. Accelerometers 70, 72, 74, 76 are preferably of conventional construction for high resolution acceleration detection, as described in U.S. Pat. No. 4,715,451, with their axes of sensitivity directed in varying directions, such that acceleration energy communicated along drill string 10 in different directions may be detected, and eventually compared. For example, the accelerometers may be arranged so as to detect torsional or bending vibrations on drill string 10. This may be accomplished by orienting the axis of sensitivity of accelerometers 72 and 74 to sense acceleration in a direction which is in a plane normal to the axis 17 of drill string 10. Accelerometers 70 and 76 may have their axes of sensitivity oriented in such a manner as to each sense motion along axis 17 of drill string 10, but in opposite directions relative to one another; as, a result, not only can detector 20 detect axial acceleration, but bending vibrations may also be detected, as bending vibrations would cause out of phase from accelerometers 70, 76.

Detector 20 further includes a system of strain gauges 78, 80, 82, 84 mounted to the interior surface of walls 27, and within protective liner, for detection of strain on drill string 10 (i.e., stress wave vibrations traveling along drill string 10 through detector 20). Strain gauges 78, 80, 82, 84 are conventional strain gauges, for generating an electrical signal or impedance according to the mechanical stress applied thereto, and are also preferably arranged within detector 20 in order to detect such stress wave vibrations which are of different directional components, i.e., both axial and torsional stress wave vibrations. It is contemplated that the illustrated arrangement of FIG. 3a is by way of example only, and that other arrangements of accelerometers, strain gages, and the like may alternatively be deployed at detector 20, optimized for the type of energy expected.

Also included in detector 20 according to this embodiment of the invention, in addition to the detection equipment described in the above-referenced U.S. Pat. No. 4,992,997 and U.S. Pat. No. 4,715,451, are pressure transducers 71, 73, 75, mounted in such a manner as to be in contact with drilling mud or fluid within wellbore 101. Pressure transducers 71, 73, 75 (and another transducer not shown, which is on the opposite side of detector 20 from transducer 75), are preferably flush-mounted along the outside surface of walls 27 with their direction of sensitivity in a radial direction from the axis of tool 23. Each of pressure transducers 71, 73, 75 are for detecting fluid pressure on its side of tool 23, and for converting the mechanical energy of such pressure into an electrical signal. The orientation of the multiple pressure transducers 71, 73, 75 allows for monitoring the pressure coming from various directions, which will provide positional information relative to the source of such energy (or reflections of such energy).

Referring to FIG. 3b, a portion of tool 23 is illustrated in cross-section illustrating the position of four protective liners 68 for isolating the instruments of detector 20. Passageway 29 is provided between protective liners 68, to allow the passage of drilling fluid therethrough.

Each of the accelerometer, strain gauge, and pressure transducer components of detector 20 generates an electrical signal (directly, or by way of an impedance) according to the particular physical energy to which each responds. These electrical signals are communicated to data handling unit 40 located within and at the location of tool 23, for communication directly to the surface by way of hardwired telemetry, stress wave telemetry, or the like, or for analysis by downhole computing equipment with the results transmitted by telemetry therefrom. The data handling and communication useful with this embodiment of the invention is noted hereinabove, and will be described in detail hereinbelow.

As noted hereinabove, it is contemplated that the distance between drill bit 15 and the its closest detector $20_0$ will be relatively short, for example on the order of less than ten feet; this is relatively close, considering that the depth of many modern wells can easily be on the order of thousands of feet. Also as noted hereinabove and as will be described in further detail hereinbelow, for purposes of noise reduction and analysis, it is preferred that multiple detectors (or detectors) 20 be provided along drill string 10, separated from one another by a particular distance. The distance of separation may be optimized according to the resolution necessary for the noise reduction or data analysis; it is contemplated that the separation between detectors 20 will preferably be at least one-quarter wavelength of the lowest frequency signal component.

It should also be noted that detectors 20 may be advantageously deployed in groups, one group at each location along wellbore 101. The vibrations from each of the detectors 20 in such a group may be averaged together, so that vibrations of certain wavelengths are eliminated. This technique is similar as that used in making geophone spreads in surface seismic prospecting, to remove the effects of "ground roll".

FIG. 2b illustrates the different paths 30, including both direct and reflected, which exist for the travel of energy between drill bit 15 and detector 20. Path 30a is a direct path between drill bit 15 and detector 20, where the vibrations travel through drill string 10 therebetween. Path 30b is also a direct path of vibrations from drill bit 15 to detector 20, where the surrounding formation 105 is the transmission medium. Path 30c is another direct path for the vibrations from drill bit 15 to detector 20, where drilling fluid in wellbore 101 is the medium. It should be noted that path 30b for vibrations where surrounding formation 105 is the transmission medium is of interest, as seismic velocity measurements may be made therefrom, as will be discussed hereinbelow.

The reflected paths of the vibrations from drill bit 15 to detector 20 are especially of interest as they are indicative of the presence and depth of formation 106 ahead of drill bit 15. Path 30d illustrates the path followed by vibrations from drill bit 15 as they pass through formation 105 to the interface with formation 106, reflect back to drill bit 15, and travel to detector 20 along drill string 10. Path 30e is the path followed by vibrations from drill bit 15 through formation 105 and reflected from formation 106, where formation 105 is the transmission medium for the reflected vibrations to detector 20. Path 30f is that followed by vibrations from drill bit 15 through formation 105 and reflected from formation 106, where the reflected vibrations travel back through formation 105 to the drilling fluid in wellbore 101, and reach detector 20.

Figure 4:
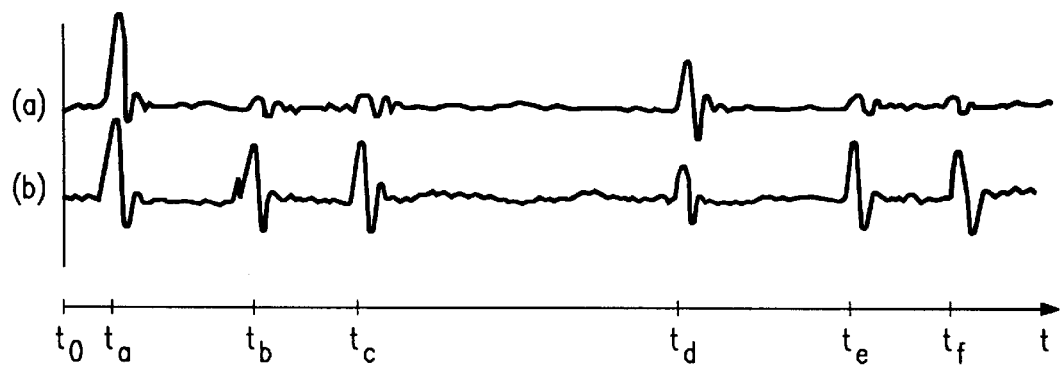
FIG. 4 is a set of timing diagrams, illustrating an example of the energy received by the detector of FIGS. 3a and 3b from the bit, along the various paths illustrated in FIG. 2b.

It is contemplated that these six paths will each transmit vibrations from drill bit 15 of sufficient magnitude to be detectable by detector 20. Referring now to FIG. 4, the temporal relationship of the detected vibrations will now be discussed, relative to the example of an impulse vibration from drill bit 15 of FIG. 2b, It is of course understood that the vibrations of drill bit 15 in an actual drilling environment will seldom consist of a series of pure impulses with wait times between each. Accordingly, while the example of an impulse input is presented herein for purposes of explanation, it is contemplated that conventional correlation techniques may be used to determine the various travel times shown in FIG. 4. Correlation and stacking techniques used in conjunction with the above-noted "TOMEX" system are contemplated to be especially useful, since the "TOMEX" system also uses the drill bit as the seismic energy source.

FIG. 4 illustrates a set of time plots of such energy, illustrating the time required for the energy to travel the various paths, showing both pressure and strain characteristics. Trace (a) in FIG. 4 corresponds to strain vibrations detected by strain gauges 78, 80, 82, 84 in detector 20, as described hereinabove relative to FIG. 3a, while trace (b) in FIG. 4 corresponds to pressure measurements made by pressure sensors 71, 73, 75. The acceleration measurements made by accelerometers 70, 72, 74, 76 will also have importance in this method.

In FIG. 4, the impulse vibrations are generated by drill bit 15 at time $t_o$. Since the highest velocity path in the example of FIG. 2b is the direct path 30a through drill string 10 (velocity on the order of 16,850 ft/sec), the first vibrations detected by detector 20, at time $t_a$, are those which traveled along path 30a. The vibrations traveling directly along path 30a in drill string 10 from drill bit 15 to detector 20 can be considered as the source signature for purposes of correlation, in a manner similar to the "TOMEX" system noted hereinabove, but detected at a location much nearer drill bit 15. Since the distance between drill bit 15 and each detector 20 is known, and since the velocity of vibrations in drill string 10 is known, the time relative to time to for each arrival of detected vibrations via path 20a can be readily calculated.

The next vibrations detected, at time $t_b$ of FIG. 4, are those which traveled along direct path 30b, where formation 105 is the transmission medium. This is because the velocity of vibrations along path 30c through the drilling fluid in wellbore 101, arriving at detector 20 at time $t_c$ in FIG. 4, has a value (e.g., on the order of 5000 ft/sec) significantly less than the velocity of most commonly-encountered formations (e.g., on the order of 8000 ft/sec). It should be noted that comparison of the time difference between times $t_b$ and $t_a$ will provide an indication of the seismic velocity of the surrounding formation 105.

Any reflected vibrations from formation 106 ahead of drill bit 15 will reach detector 20 at significantly later times, as the paths 30d, 30e, 30f of such vibrations each include twice the distance between drill bit 15 and formation 106. In FIG. 4, times $t_d$, $t_e$, and $t_f$ correspond to detected vibrations which follow paths 30d, 30e, and 30f, respectively. Since each of the reflected paths 30d, 30e, 30f include approximately the same two-way distance (in addition to the length and medium of its analogue path 30a, 30b, 30c, respectively), the vibrations will reach detector 20 in approximately the same order as the corresponding direct vibrations (the time differences among paths 30d, 30e, 30f corresponding to the differences in media velocity for the various paths between drill bit 15 and detector 20). While it is contemplated that, for path 30f, the vibrations will couple into the drilling fluid at the bottom of wellbore 101 with greater efficiency than elsewhere along the length of wellbore 101 so that a distinct vibration will be detectable at time $t_f$, it is understood that those reflected vibrations will couple into the drilling fluid along the entire length of wellbore 101 between drill bit 15 and detector 20. As a result, depending upon the coupling efficiency, the detected peak at time $t_f$ may be less distinct in actual practice than that shown in FIG. 4.

The first of the reflected vibrations to reach detector 20, at time $t_d$, are those traveling along path 30d, i.e. reflected from formation 106 and traveling to detector 20 along drill string 10. The time difference between time $t_d$ and time $t_a$ will be substantially the "two-way" time from drill bit 15 to formation 106; knowing the velocity of formation 105 therebetween thus can give an indication of the depth between drill bit 15 and formation 106. The other reflected vibrations received at times $t_e$ and $t_f$ similarly can provide two-way times, when compared against their direct path analogues (times $t_b$ and $t_c$, respectively).

Furthermore, it is contemplated that other attributes of the vibrations detected by detector 20 will provide additional information regarding the presence, depth and attributes of formation 106. For example, it is well known that the phase of a reflected wave depends on the relative acoustic velocities of the transmitting and reflecting media. Accordingly, phase comparison of the sensed reflected vibrations (i.e., those received at times $t_d$, $t_e$, $t_f$) with their direct analogues (at times $t_a$, $t_b$, $t_c$, respectively) can provide an indication of the relative velocities of formations 105, 106.

Comparison of the vibrations detected by strain gauges 78, 80, 82, 84 in detector 20, with those detected by accelerometers 70, 72, 74, 76 also can provide important information concerning the drilling process. It is contemplated that the ratio of strain to acceleration corresponds to the extent of the coupling of drill bit 15 to formation 105 into which it is drilling, as a greater strain level for a given acceleration force would indicate that drill bit 15 is in contact with formation 105 with greater force, and that formation 105 is relatively hard. A reduced amount of strain for the same level of acceleration would, on the other hand, indicate that drill bit 15 is either not firmly in contact with formation 105, or that formation 105 is a relatively soft formation.

As shown in FIG. 3a, the construction of detector 20 according to this preferred embodiment of the invention has pressure sensors 71, 73, 75 (and 77, not shown) facing in four directions radially from the axis of drill string 10; as a result, pressure sensors 71, 73, 75, 77 are arranged in pairs of diametrically opposing sensors. For example, sensors 71 and 73, diametrically oppose one another but are at the same depth. Comparison of their detected vibrations may be indicative of the type of vibration detected. For example, if the vibrations detected at the same time by sensors 71 and 73 are in phase with one another, the vibrations are likely to be pressure waves. If diametrically opposite sensors 71, 73 detect vibrations which are opposite in phase, the vibrations are likely to be horizontal shear waves.

The ability to distinguish pressure waves from shear waves is important as it provides additional information concerning the subsurface geology. As is well known in the art, the ratio of the pressure wave velocity to the shear wave velocity depends upon the composition of the medium through which the vibrations are transmitted. In the case of detector 20 with diametrically opposed pressure sensors 71, 73 (and 75, 77) as described hereinabove, the difference in the velocities will be manifested as discrete detection of vibrations at different times; since pressure waves generally have a higher velocity than shear waves, the in-phase detected vibrations will be seen first, with the out-of-phase detected vibrations seen later. As noted hereinabove, time to at which the vibrations are generated by drill bit 15 can be readily determined from the first arrival of detected vibrations at detector 20 via path 20a, as the distance and velocity are known. Accordingly, the pressure wave velocity and shear wave velocity of formation 105 in this example can be readily determined from the time delay from time $t_0$ to the arrival time of the direct vibrations of each component along path 20b. Calculation of the ratio of these velocities can then be readily calculated, providing further information regarding formation 105. Furthermore, detection of this shear mode would be particularly useful in horizontal wells, as refracted shear wave detection could be used to locate vertical distances within a substantially horizontal formation.

As is well known, significant vibration in drill string 10 is generated during the drilling of a hydrocarbon well. This vibration of course includes the rotation of drill string 10 itself for surface-drive drilling rigs such as shown in FIG. 1. While the average rotation rate of drill string 10 is known from the surface drive, and is useful for filtering out vibrations at the frequency of rotation and its harmonics, it is preferred that a magnetometer be located near drill bit 15 to sense its instantaneous orientation and frequency of rotation, and to generate an electrical signal accordingly. This allows for bit effects such as "stick-slip" to also be taken into account in noise reduction and in the monitoring of bottom-hole assembly dynamics. This electrical signal can be provided to downhole sending unit 40 for communication to the surface, or included in the downhole calculations, as appropriate.

Referring back to FIG. 1, it is preferred that multiple detectors 20 be located along the length of drill string 10. For example, four to six detectors 20 (or groups) may be spaced along the length of drill string, particularly along the lower part thereof. Such multiple detectors are believed to be quite useful in connection with this embodiment of the invention, due to the large amount of noise generated during the drilling operation.

Significant noise is generated in the drilling of a well generated by the rotation of drill string 10 in a surface-drive arrangement, as noted above; where a downhole motor is used to turn drill bit 15, vibrations relating to the rotation of the drill bit will also be generated that correspond to the rotation of drill bit 15, and which will appear as coherent noise. Vibrations are also generated by the drilling fluid as it is pumped through drill string 10 at high pressure. Other apparatus in the drilling operation, such as bearings in the swivel 21 at the top of the drill string, the rattling of chains which turn the kelly bushing, and the slap of drill string 10 against the casing or against wellbore 101, also generate significant acoustical vibrations which are received by and transmitted along drill string 10. Each of these vibrations are superimposed upon the vibrations generated by drill bit 15, as detected by each of detectors 20 in the system. Since it is the vibrations from paths 30 of FIG. 2b which are of interest (i.e., the "signal"), these other vibrations constitute noise for purposes of this analysis.

It should be noted that much of these noise vibrations are generated at a point along drill string 10 above detectors 20. For the system of FIG. 1, where vibrations generated by drill bit 15 constitute the signal, the down-going noise vibrations will reach detector $20_1$ before they reach detector $20_0$. Conversely, the vibrations generated by drill bit 15 as described above will reach detector $20_0$ before they reach detector $20_1$. Comparison of the detected vibrations from the various locations $20_0$ and $20_1$, by way of "stacking" or other correlation techniques, can thus allow one to distinguish up-going vibrations (the "signal") from down-going vibrations (the "noise"). Similar noise reduction has been done in the marine environment, and is commonly referred to as "de-ghosting", where down-going reflections from the water surface are subtracted from the detected signal so that the portion of the detected vibrations corresponding to up-going reflections from sub-surface geology is enhanced. Accordingly, the provision of multiple detectors 20 along the length of drill string 10 can allow for reduction of noise generated above detectors 20.

As noted hereinabove, numerous advantages are made available from this embodiment of the invention, whether the data is communicated in substantially raw form to the surface, or is analyzed by a downhole computer (each alternative described in further detail hereinbelow). The resolution of the data obtained by the downhole detection of seismic vibrations generated downhole, such as from drill bit 15, can be significantly greater than that obtained from conventional surface prospecting methods, and also than that from the surface detection of drill-bit generated vibrations (such as is used in the "TOMEX" method described hereinabove). In each of these prior techniques, the frequency of the seismic energy is necessarily quite low (less than 100 Hz) due to the attenuation of higher frequency vibrations in traveling from downhole to the surface. According to the present invention, however, the downhole location of detectors 20 reduces the distance that the vibrations must travel through the earth (particularly for reflected vibrations traveling along path 30d, where drill string 10 is the medium), and thus reduces the attenuation of higher frequency vibrations. It is contemplated that vibration frequencies on the order of hundreds or thousands of Hz can be analyzed according to this method, thus providing seismic information with resolution on the order of one meter.

The survey information provided by this method not only has higher resolution, but may be acquired during the drilling operation itself to obtain real-time high resolution information about formations ahead of the bit. Particularly, overpressurized zones ahead of drill bit 15 can be detected, and their distance away from drill bit 15 determined. This allows for the use of heavier drilling mud only as the drilling operation approaches, allowing for lighter drilling mud to be used along a greater length of the wellbore drilling operation. In addition, a better estimate of the required mud weight can be made using this method, allowing for the proper casing design, and reducing the possibility of formation damage. Safety from blow-outs can thus be obtained without greatly affecting the efficiency of the operation.

Furthermore, the high resolution survey information acquired during drilling according to this method can allow for real-time adjustment of the drilling operation, particularly in direction, so that the likelihood of reaching a hydrocarbon reservoir increases. Particularly, information about the sub-surface formations through which drilling has occurred, for example velocity information (pressure and shear) can be used to verify or adjust prior conventional surveys of the drilling site. In addition, information concerning the formations ahead of the bit can also be acquired, further supplementing the prior surveys and allowing for adjustment of the drilling direction, speed, and the like.

The use of multiple detectors 20 along the length of tool 23 according to this embodiment of the invention also allows for the detection and characterization of offset formations, i.e., those formations which have a surface which is substantially parallel to the borehole. If, for example, the time difference between reflected waves detected by separate detectors 20 is much smaller than that which would occur from a formation ahead of drill bit 15 (due to the distance along tool 23 between detectors 20), one can deduce that the path lengths of the two reflections are relatively close. Using an analysis technique similar to "beam forming" in the surface seismic surveying art, the distance and characteristics of such an offset formation may be determined using this embodiment of the invention.

As a by-product of the method according to this embodiment of the invention, the vibrations detected downhole by detectors 20 may also be used to monitor the drilling process itself, such as by monitoring weight-on-bit, bottomhole assembly strain, bit-to-earth coupling, and other parameters of importance to the drilling operator. Conditions such as washouts, stick-slip, and the rate of fatigue (i.e., the absolute number of cycles) can also be monitored.

Other advantages of this embodiment of the invention should also now be apparent to one of ordinary skill in the art having reference to this specification.

B. Look-ahead Electromagnetic Monitoring and Prospecting

According to alternative embodiments of a data acquisition method and system, electromagnetic energy is generated and detected downhole for look-ahead monitoring and prospecting. Two alternative embodiments using electromagnetic energy which is both generated and sensed downhole will be described in detail hereinbelow. These two techniques will be referred to as galvanic and induction methods, respectively.

1. Galvanic Electromagnetic Look-ahead Data Acguisition

Figure 5:
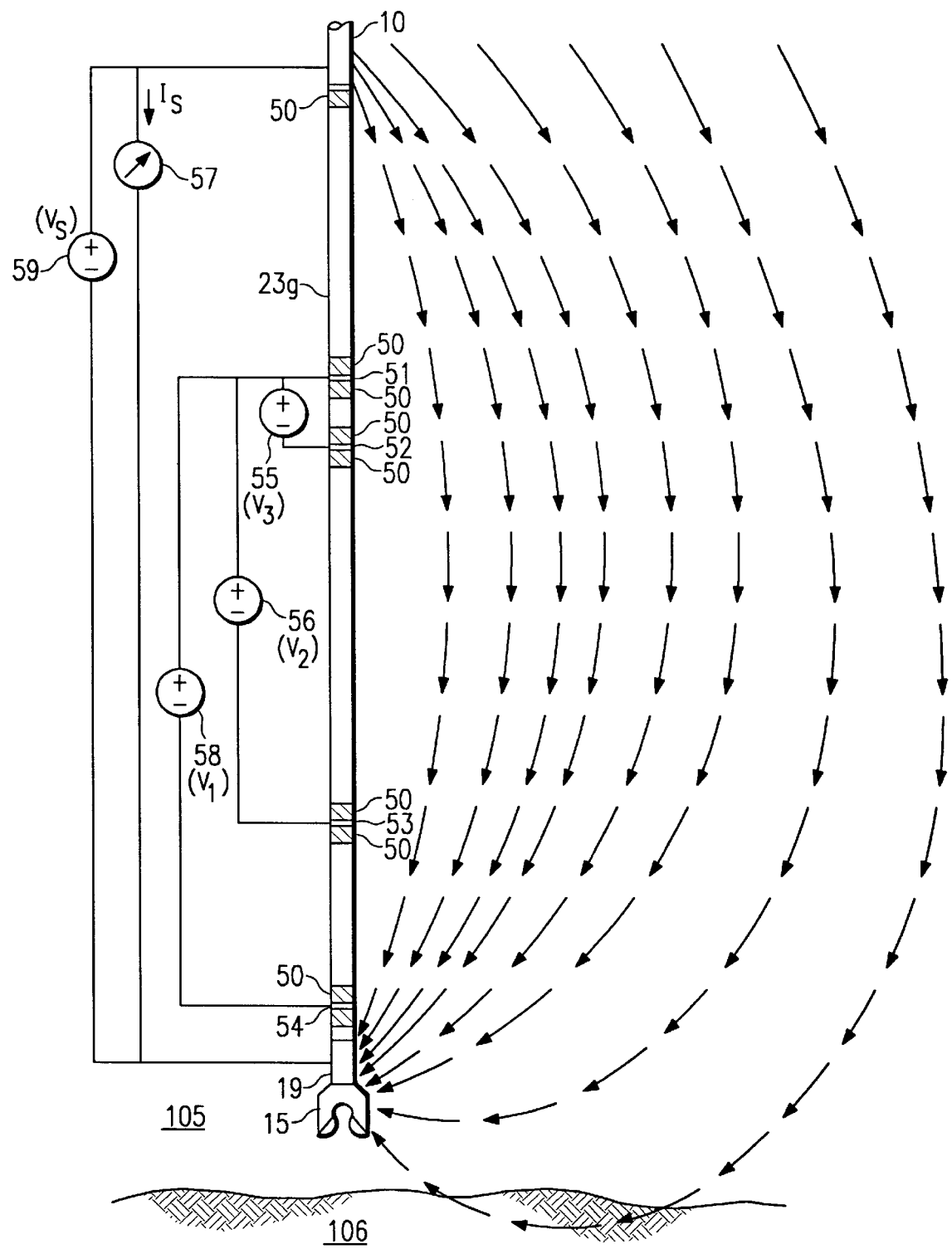
FIG. 5 is an elevation view schematically illustrating the construction and operation of a galvanic logging tool according to a second embodiment of the invention.

Referring now to FIG. 5, downhole tool 23g for galvanic electromagnetic look-ahead monitoring and prospecting system will now be described in detail, relative to a drilling operation. Tool 23g is preferably connected on one end to bit sub 19 so as to be as near to drill bit 15 as practicable. On its other end, tool 23g is connected to drill string 10. As noted hereinabove relative to the look-ahead seismic case, tool 23g may be on the order of up to ninety feet in length; the diameter of tool 23g is on the order of that of drill string 10 and bit sub 19.

Tool 23g includes several electrodes 51, 52, 53, 54 along its length, with which the galvanic measurements will be made. Electrodes 51, 52, 53, 54 are in electrical contact with drilling fluid in the annulus of wellbore 101 surrounding drill string 10, and thus are electrically coupled to formation 105 surrounding wellbore 101 at the location of tool 23g. Alternatively to electrical connection via drilling fluid, electrodes 51, 52, 53, 54 may be in direct contact with surrounding formation 105 by way of shoes or other contacts extending outwardly from tool 23g. Further in the alternative, electrodes 51, 52, 53, 54 may be discrete electrodes or sets of electrodes, rather than bands around the circumference of tool 23g as shown in FIG. 5.

Electrode 54, which is nearest bit sub 19, is disposed between two insulating sections 50 of tool 23g. Each insulating section 50 preferably is formed of a glass-mica composite, epoxy fiberglass, or another one of the ceramic materials known in the art to be capable of withstanding the high temperature and hostile downhole environment. Accordingly, electrode 54 is electrically insulated from bit sub 19 and from the portion of tool 23g thereabove. Electrode 54 is preferably as close as possible to bit sub 19, for example on the order of one to two feet away therefrom.

Electrodes 51, 52, 53 are located varying distances away from electrode 54 along tool 23g. For the example of FIG. 5, electrode 53 is preferably located approximately ¼ the length of tool 23g from its bottom end, electrode 51 is preferably located approximately ⅔ the length of tool 23g from its bottom end, and electrode 52 is preferably located between electrodes 51 and 53, but near to electrode 51, for example on the order of three feet away therefrom. Each of electrodes 51, 52, 53 are also insulated on both sides by insulating material 50.

The two other "electrodes" used by tool 23g are drill string 10 itself, which is insulated from tool 23g by an insulating section 50 located at the top end of tool 23g, and bit sub 19. The length of the electrode of drill string 10 will be quite long, up to hundreds of feet long for a conventional well. Drill string 10 and bit sub 19 will source the electrical current into the earth, and as such are electrically connected to a controllable power source.

The source of power for drill string 10 and bit sub 19, as well as other electronic circuitry for detecting voltages and currents downhole and either transmitting or computing the same, noted above and as will be described hereinbelow, are preferably located within tool 23 itself, for example in data handling unit 40 (not shown in FIG. 5 for clarity). Alternatively, the power source and other circuitry may be provided within a special sub threadedly connected within drill string 10. In either case, the power source and other circuitry is preferably mounted in such a manner that drilling fluid may continue to flow from the surface from drill string 10 to drill bit 15 in the conventional manner. Alternatively, the driving and measurement circuitry may be provided at the surface, with hardwired connection to the various locations of drill string 10 and electrodes 51, 52, 53, 54 to make the measurements described hereinbelow. Other techniques for generating the desired current and making the below-described measurements will, of course, be apparent to those of ordinary skill in the art. Voltmeter 55 measures the voltage $V_3$ between electrodes 51 and 52, voltmeter 56 measures the voltage $V_2$ between electrodes 51 and 53, and voltmeter 58 measures the voltage $V_1$ between electrodes 51 and 54.

FIG. 5 also illustrates, schematically, the various current paths and voltages used in, and the operation of, the system incorporating tool 23g according to this embodiment of the invention. A current source is provided which sources current into the earth between drill string 10 and bit sub 19. It is preferred that current $I_s$ will be generated at a relatively low frequency, for example less than 1 kHz, and preferably in the tens of Hz, so that eddy currents in drill string 10 are avoided. Current meter 57 measures current $I_s$, and voltmeter 59 measures the corresponding voltage $V_s$ between drill string 10 and bit sub 19. The ratio $V_s/I_s$ corresponds to the contact resistance of drill string 10 and bit sub 19, which will be largely dependent upon the resistance of the contact between the earth, on the one hand, and drill string 10 or bit sub 19, on the other hand. As noted hereinabove, the various meters 55, 56, 57, 58, 59 and the others are preferably provided within tool 23g. Similarly as noted hereinabove for the look-ahead seismic prospecting case, the raw output of meters 55, 56, 57, 58, 59 may be communicated directly to the surface by hardwire, or to a downhole data handling unit 40 (FIG. 1) for transmission to the surface by way of stress wave telemetry, mud pulse telemetry, magnetostrictive telemetry, or other techniques. Alternatively, downhole computing power may be provided within downhole data handling unit 40, so that the outputs of meters 55, 56, 57, 58, 59 are communicated to the downhole computer, with the result of the computation then transmitted to the surface.

Each of the voltages $V_1$, $V_2$, $V_3$ are indicative of the current density and resistivity of the formation surrounding tool 23g, with the measured voltages $V_1$, $V_2$, $V_3$ measuring the voltages from different volumes of the formation, and different depths of investigation, due to their location along tool 23g, particularly their proximity to bit sub 19. Similarly as in conventional logging tools, the depth of investigation of voltage $V_1$ between electrodes 51 and 54 is relatively shallow, for example on the order of one foot, due to the short distance between the electrode of bit sub 19 and electrode 54. The depth of investigation for electrode pair 51, 54 is shallow since the current density is quite concentrated within the volume near bit sub 19. Accordingly, conductive formations or other structures away from tool 23g will have little effect on the voltage $V_1$ measured between electrodes 51 and 54. The resolution of the measurement made by electrodes 51, 54 will be quite fine, however.

Conversely, voltage $V_3$ between electrodes 51 and 52 according to this embodiment of the invention will have a very large depth of investigation. This is because the density of the current $I_s$ through the formation that surrounds tool 23g is lower at locations away from bit sub 19 than at locations near thereto. Accordingly, changes in the conductivity of surrounding formations some distance from tool 23g will affect the voltage $V_1$ measured by electrode pair 51, 52. The length of drill string 10 above tool 23g assists in the distribution of current $I_s$ in such a manner that a significant portion thereof will travel through the earth ahead of bit sub 19, as suggested in FIG. 5.

For example, FIG. 5 illustrates formation 106 which is some distance ahead of bit 15, which is currently within formation 105. If, for example, formation 106 is significantly more conductive than formation 105, the current density near electrodes 51 and 52 will decrease, since a greater portion of the current passes through conductive formation 106 than if the geology were homogenous. In effect, the resistance of formation 105 in the volume near electrodes 51, 52 is effectively in parallel with a lower resistance when drill bit 15 (and tool 23g) is near a conductive formation. A drop in the measured voltage $V_1$ will thus be detected; since electrode 54 is near bit sub 19, and since most of the current $I_s$ is concentrated near electrode 54, little, if any, drop in voltage $V_1$ will be detected.

Conversely, drill bit 15 approaches formation 106 which has significantly less conductive than formation 105 (for example, if formation 106 is a hydrocarbon reservoir), the current density in the volume near electrodes 51 and 52 will increase over that in the homogeneous case, and the voltage $V_3$ measured by electrodes 51 and 52 will increase. This situation is analogous to a parallel resistor network which has a resistor with relatively low resistance replaced with one having a higher resistance, raising the resistance of the parallel resistor network. As in the prior case, due to the close proximity of electrode 54 to bit sub 19, little effect on voltage $V_1$ will be detectable.

Measurement of voltage $V_2$ between electrodes 51 and 53 provides a depth of investigation between that of the other electrode pairs 51, 52 and 51, 54, as electrode 53 is between electrodes 52 and 54. Accordingly, tool 23g of FIG. 5 provides the ability to acquire measurements of varying depths of investigation, from contact resistance $V_s/I_s$ to the look-ahead measurement of $V_3$.

Figure 6:
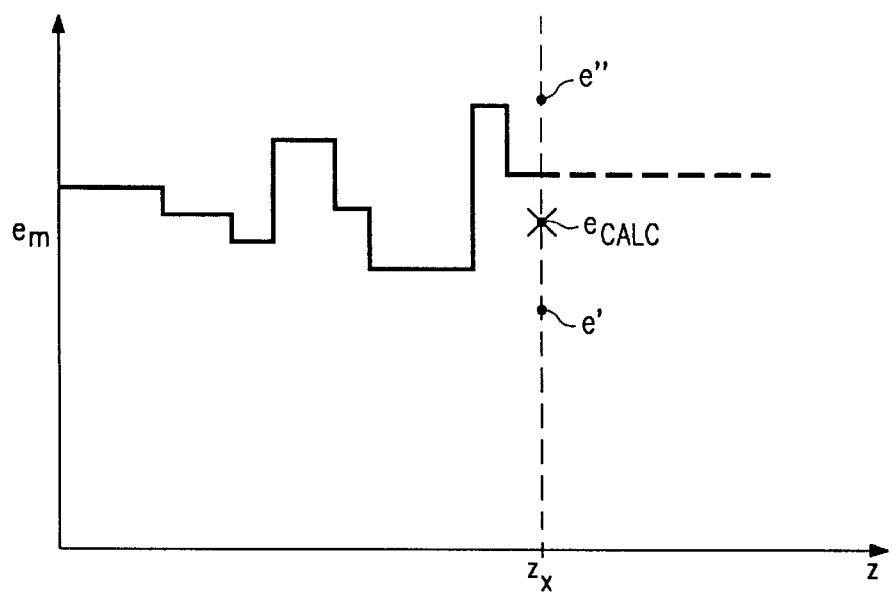
FIG. 6 is a plot illustrating an example of resistivity measurements obtained by the tool of FIG. 5 during the span of a drilling operation.

Referring now to FIG. 6, the operation of a method of interpreting the results of the measured voltages $V_1$, $V_2$, $V_3$ will now be described. FIG. 6 is an example of a log of a resistivity measurement $\rho_m$, based upon one of the measured voltages, for example voltage $V_3$ which has a large depth of investigation, versus the depth of drilling z; the resistivity $\rho_m$ may be obtained by dividing the measured voltage (in this case $V_3$) by a current value based on the measured source current $I_s$. During the drilling operation, the resistivity value $\rho_m$ changes with the various formations encountered. Either within the downhole data handling unit 40, or at the surface, a history of the measurements of $\rho_m$ are stored. Based upon these measurements, and according to a weighted sum or other algorithm, a statistical distribution for the expected resistivity value $\rho_m$ at depth $z_x$ may be calculated, assuming that the current formation into which drill bit 15 is drilling is infinitely deep (i.e., the geology is homogenous ahead of drill bit 15). It should be noted that this expected resistivity value may differ from that of the immediately prior measurement (i.e., it is not a good assumption that the most recent resistivity value will continue), as the varying resistivity of prior formations will also affect the measured value, particularly for the measurement having a large depth of investigation.

At depth $z_x$ of drill bit 15, the computing equipment compares the measured resistivity value $\rho_m$ is compared against the calculated expected value $\rho_{calc}$. A statistically significant deviation between the measured resistivity value $\rho_m$ and the calculated expected value $\rho_{calc}$ is indicative of an approaching change in formation ahead of drill bit 15. For example, a measured resistivity value $\rho'$ which is significantly lower than the value $\rho_{calc}$ indicates a high conductivity formation ahead of drill bit 15; conversely, a measured resistivity value $\rho'$ which is significantly higher than the value $\rho_{calc}$ indicates a low conductivity formation ahead of drill bit 15.

The technique illustrated in FIG. 6 may also incorporate knowledge from previously acquired stratigraphic surveys, in the alternative to calculating the expected resistivity value $\rho_{calc}$ assuming that the current formation extends infinitely deep from the current location $z_x$. For example, based on prior surveys, on the known bit depth, and modified by previously measured resistivity measurements $\rho_m$, the expected value $\rho_{calc}$ may be determined assuming the presence of a new formation with an assumed conductivity at a particular depth in advance of drill bit 15. Deviations between the actual measured resistivity $\rho_m$ and this calculated resistivity will then indicate deviations between the depth or conductivity of actual formations in the earth and that of the survey.

Figure 7A:
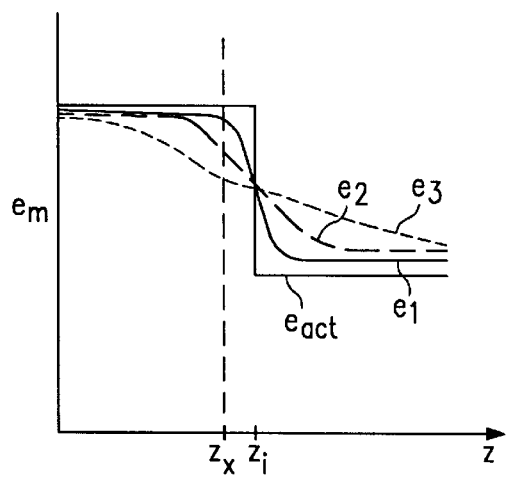
FIGS. 7a and 7b are plots of resistivity versus depth and resistivity versus electrode position, respectively, for an example of the tool of FIG. 5.
Figure 7B:
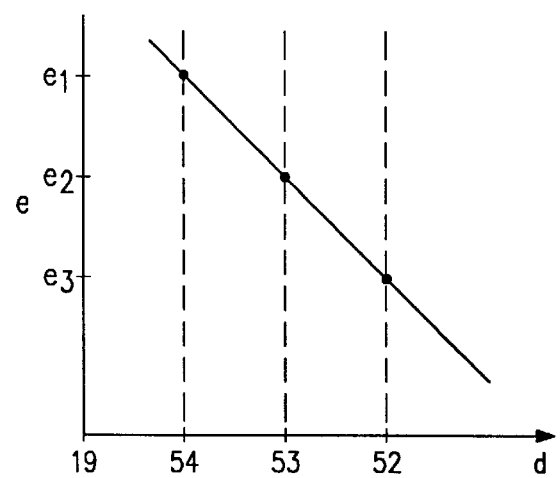

FIG. 6 plots resistivity versus depth for one of the measured voltages (e.g., $V_3$). The plots of FIGS. 7a and 7b illustrate the information that can be obtained from a comparison of the multiple voltages measured by tool 23g as illustrated in FIG. 5. FIG. 7a is a plot of three resistivity measurements $\rho_1$, $\rho_2$ and $\rho_3$ versus depth z, based on the three voltage measurements $V_1$, $V_2$, $V_3$, respectively, which are obtained by tool 23g of FIG. 5. In FIG. 7a, depth z corresponds to the depth of drill bit 15, with each of the three resistivity measurements $\rho_1$, $\rho_2$ and $\rho_3$ taken at the same position.

In the example of FIG. 7a, depth $z_i$ is a depth at which drill bit 15 enters a new formation which is significantly more conductive formation; referring to FIG. 5, depth $z_i$ is the depth at which drill bit 15 will first touch formation 106. Resistivity $\rho_{act}$ is a plot of the actual resistivity of the formations encountered by drill bit 15. At drill bit depth $z_x$ (which is above the interfacial depth $z_i$, for example with drill bit 15 in the position shown in FIG. 5), FIG. 7a illustrates that the resistivity $\rho_3$ which is based on voltage $V_3$ between electrodes 51 and 52, and which has the deepest depth of investigation, is lower by a larger degree than the other measurements $\rho_2$ and $\rho_3$ from electrode pairs which have shallower depths of investigation.

FIG. 7b is a comparison plot of the resistivity measurements $\rho_1$, $\rho_2$ and $\rho_3$, for drill bit depth $z_x$ above the interfacial depth $z_i$, versus distance d of the corresponding electrodes 54, 53, 52 above bit sub 19. Resistivity $\rho_1$ is the highest value, with resistivity $\rho_2$ lower due to the approaching conductive formation, and with resistivity $\rho_3$ the lowest of the three due to its deeper depth of investigation. It is contemplated that a comparison of the three resistivity measurements $\rho_1$, $\rho_2$ and $\rho_3$ can be used to calculate the distance $(z_i-z_x)$ which the new formation 106 is ahead of drill bit 15, such calculations being analogous to "soundings" by which the depth of a body of water is calculated based on sonar measurements.

It is contemplated that other uses and calculations of resistivity, depth, and comparisons of the same to previously obtained stratigraphic surveys will now be apparent to those of ordinary skill in the art having had reference to the foregoing.

As a result of this embodiment of the invention, it is contemplated that the presence of an approaching formation may be detected ahead of drill bit 15. It is particularly contemplated that high conductivity formations, such as hydrocarbon reservoirs, may be so detected. It is further contemplated that this system and method may be used in order to detect the presence of an overpressurized zone ahead of the bit by some distance, such that corrective action may be taken prior to the drill bit 15 reaching the overpressurized zone. For example, lightweight drilling mud may be used for much of the drilling operation, thus providing for fast and efficient drilling: upon detection of a lower resistivity layer ahead of the drill bit, such lower resistivity indicating an over-pressurized zone, heavier drilling mud may then be pumped into wellbore 101, preventing a blowout condition from occurring. Such knowledge about the proper mud to be used can also allow for optimized casing design.

In addition, it is contemplated that this method will also provide for a real-time resistivity log, with the data acquired during the drilling of the well. In particular, the data acquired according to this method will not only be a local resistivity log, extending in a plane perpendicular to the wellbore as in conventional MWD resistivity logging, but also gathers bulk resistivity information, including resistivity of layers ahead of the drill bit. The resistivity data so acquired can be compared against prior information, such as that acquired from neighboring wells, seismic surveys, and the like, to provide a more accurate survey, and to adjust prior surveys to match the attributes measured during drilling.

2. Electromagnetic Induction Look-ahead Data Acquisition

Referring now to FIG. 8, a downhole electromagnetic induction look-ahead monitoring and prospecting system will now be described in detail. As will be apparent from the following description, this system generates magnetic fields which induce eddy currents into surrounding conductive formations. These eddy currents in turn generate magnetic fields which induce currents in a coil located in the downhole portion of the drill string; this coil may be the same coil as that which generated the magnetic field, or may alternatively be a separate coil therefrom. In the alternative to an induction coil, a high resolution AC-coupled magnetometer may be used to detect magnetic fields generated by these eddy currents. It is contemplated that measurement and analysis of the induced return current will be indicative of the presence, distance, and characteristics of conductive layers ahead of the drill bit.

FIG. 8 illustrates the downhole portion of a drill string 10 which has drill bit 15 at its terminal end. Bit sub 19 is connected to drill bit 15, and tool 23e according to this embodiment of the invention is connected between bit sub 19 and drill string 10. Insulating bands 60 are provided within tool 23e at a plurality of intervals, such that drill string 10 is insulated from bit sub 19. It is contemplated that the length of drill string 10 will be much longer that of tool 23e together with bit sub 19 and bit 15, particularly for most depths of interest for this embodiment of the invention. Horizontal coil 62h is located within a portion of tool 23e, preferably near bit 19, and will generate and sense magnetic fields having vertical polar orientation, as the planes of each loop of horizontal coil 62h are perpendicular to tool 23e, and thus substantially perpendicular to the instantaneous direction of drilling. It is contemplated that horizontal coil 62h will be on the order of 100 cm long, having a sufficient number of turns to obtain very high inductance; depending upon the particular configuration, this may require as many as several thousand turns. The terminal ends of horizontal coil 62h are in communication with downhole control and measurement circuitry, for example in data handling unit 40 (not shown in FIG. 8) within tool 23e, as discussed hereinabove relative to FIG. 1.

Two vertical coils 62v are also located within tool 23e. Vertical coils 62v may be located in another portion of tool 23e which is electrically insulated from the portion within which horizontal coil 62h is disposed, as illustrated in FIG. 8. Alternatively, vertical coils 62v may be located at the same location as horizontal coil 62h, for example encircling or within horizontal coil 62h, but electrically insulated therefrom; such construction may be preferred for reduction of the length of tool 23e. Each vertical coil 62v may be on the order of 100 cm long, having a sufficient number of turns to obtain high inductance as noted hereinabove relative to horizontal coil 62h, and is oriented so that the plane of each loop is substantially parallel to the axis of tool 23e, and thus drill string 10, in order to generate and detect magnetic fields having horizontal polar orientation. The individual ones of vertical coils 62v are oriented perpendicularly to one another, to provide detection of the direction of offset formations from tool 23e, as will be noted hereinbelow. Horizontal coil 62h and vertical coils 62v may be energized either in an alternating fashion, or simultaneously, as the magnetic fields generated and detected by coils 62h, 62v are perpendicular relative to one another.

FIG. 9 is a schematic diagram, for purposes of explanation, of a simple implementation of the electronics for generating and sensing magnetic fields from one of the coils 62 (i.e., either horizontal coil 62h or one of vertical coils 62v), as will now be described. Of course, an actual implementation of this system will be somewhat more complex, particularly relative to achieving fast switching times and reduced transient noise. Conventional systems are available for surface electrical geophysics and prospecting which operate similarly as the schematic of FIG. 9, and which include such additional circuitry for achieving high performance and sensitivity, and as such would be suitable for use in the present embodiment when configured to operate downhole.

Preferably located downhole with coil 62 (for example in data handling unit 40) is current source 66, voltmeter 68, and switches 67, 69. Current source 66 is connectable by switch 67 in series with coil 62, and is for generating a measurable fixed current through coil 62 to induce a magnetic field in the conventional manner, Resistor 71 is in series with switch 69, so that self-induced currents remain low during the operation of tool 23e; in operation, switch 67 will be open when switch 69 is closed, and vice versa. Switches 67 and 69 allow for coil 62 to both generate and receive magnetic fields, with voltmeter 68 for measuring the voltage received by coil 62 due to the presence of conductive formations. The operation of FIG. 9 will be described hereinbelow.

Further reference is directed to U.S. Pat. No. 4,906,928, assigned to Atlantic Richfield Company and incorporated herein by reference, which describes a control system in connection with transient electromagnetic probing ("TEMP") of conductive containers such as pipes. It is contemplated that the techniques in this patent will be applicable to the measurements made by the system of FIG. 8.

Magnetometer 64 is also provided within tool 23e, for example above the location of coils 62h and 62v. Magnetometer 64 is a conventional magnetometer having sufficient sensitivity to detect the orientation of drill string 10 relative to the earth's magnetic field. The monitoring of the orientation of drill string 10 by magnetometer 64 allows for cancellation of the earth's magnetic field from the measurements made by coils 62 in tool 23e, and also for synchronizing the rotation of drill string 10 and tool 23e to the measurements made by vertical coils 62v, so that the direction of vertical conductive layers from tool 23e may be determined, as will be noted hereinbelow.

Figure 10:
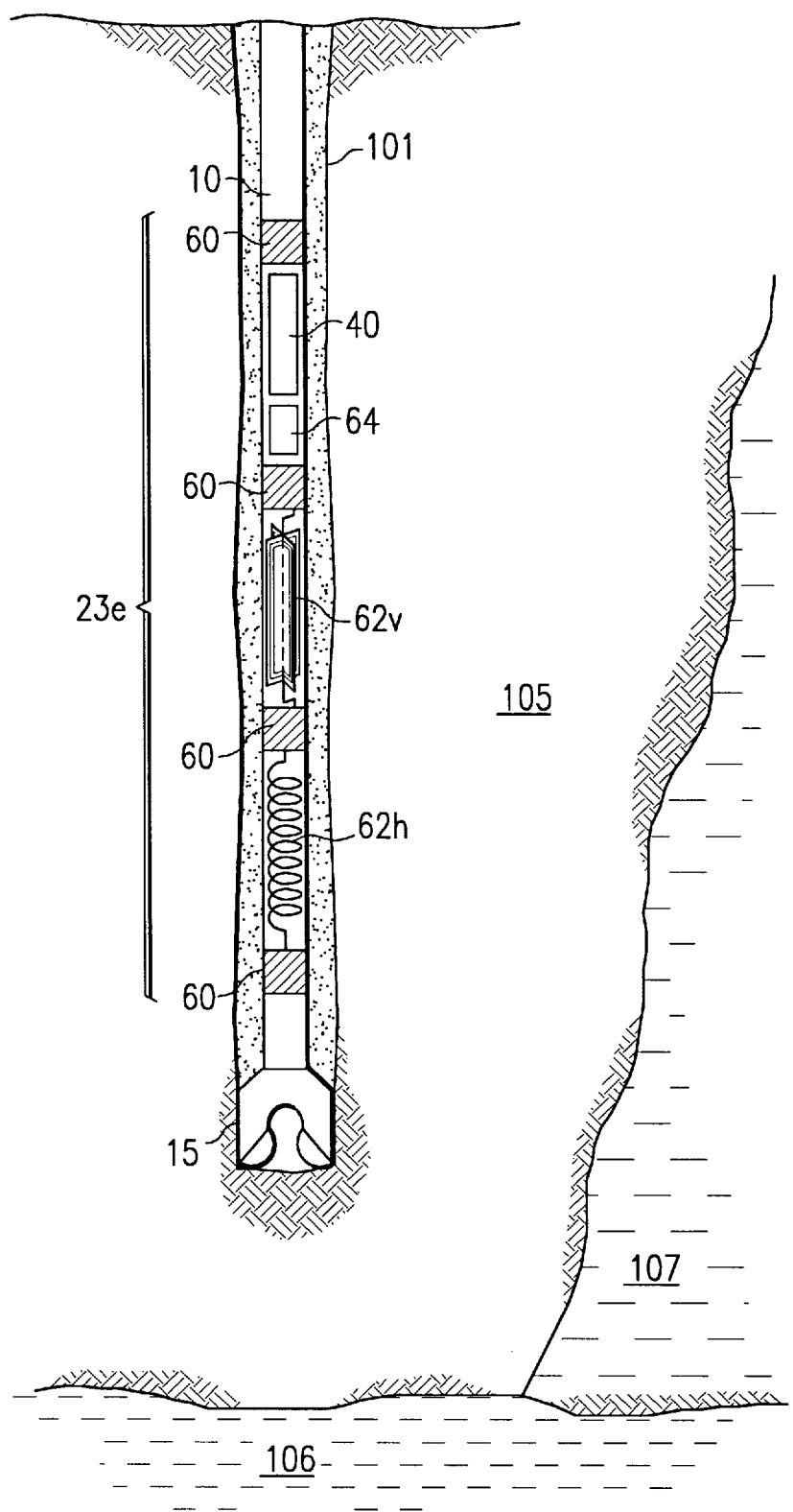
FIG. 10 is a cross-sectional diagram illustrating an example of the use of the tool of FIG. 8.

Referring now to FIGS. 10 and 11 in combination, the operation of electromagnetic induction tool 23e according to this embodiment of the invention will now be described in detail. As shown in FIG. 10, drilling of wellbore 101 has progressed into formation 105 which, for purposes of this example, has relatively low conductivity. Ahead of drill bit 15 by some distance is formation 106, which is relatively conductive compared to formation 105; the interface between formations 105 and 106 is substantially perpendicular to wellbore 101. Offset from wellbore 101 is formation 107 which, for purposes of this example, is also more conductive than formation 105 and may also contain hydrocarbons therein; the interface between formations 105 and 107 is closer to being parallel to wellbore 101 than it is to being perpendicular thereto. In this example, continued drilling of wellbore 101 in the same direction as shown in FIG. 10 would miss formation 107.

The operation of this embodiment of the invention will first be described relative to horizontal coil 62h, and its ability to detect formation 106 ahead of drill bit 15. Horizontal coil 62h is first energized by current source 66 (shown in FIG. 9), by the closing of switch 67 and opening of switch 69. In the conventional manner, a magnetic field is generated by coil 62h. Referring to FIG. 11, at time t=0 switch 67 is opened and switch 69 is closed. The step function decrease in the current through horizontal coil 62h, according to Faraday's law, produces an electromotive force within and outside of horizontal coil 62h. This electromotive force propagates from coil 62h and induces eddy currents in the surrounding structures. These eddy currents have an orientation matching that of the current through coil 62h an instant after time t=0, and as such will behave as distributed horizontal loops throughout the surrounding structure. As is well known in the art, eddy currents decay and physically disperse exponentially, with such decay and dispersal greater in structures having lower conductivity and larger volumes.

Figure 12A:
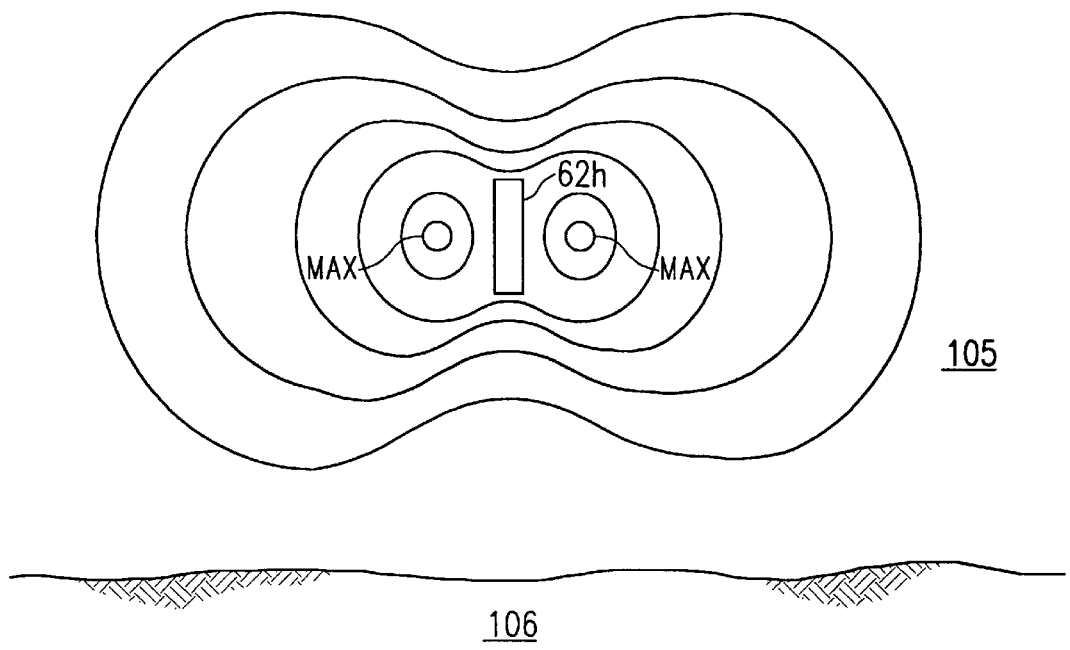
FIGS. 12a and 12b are contour plots of the eddy currents generated according to the embodiment of FIGS. 8 and 10.
Figure 12B:
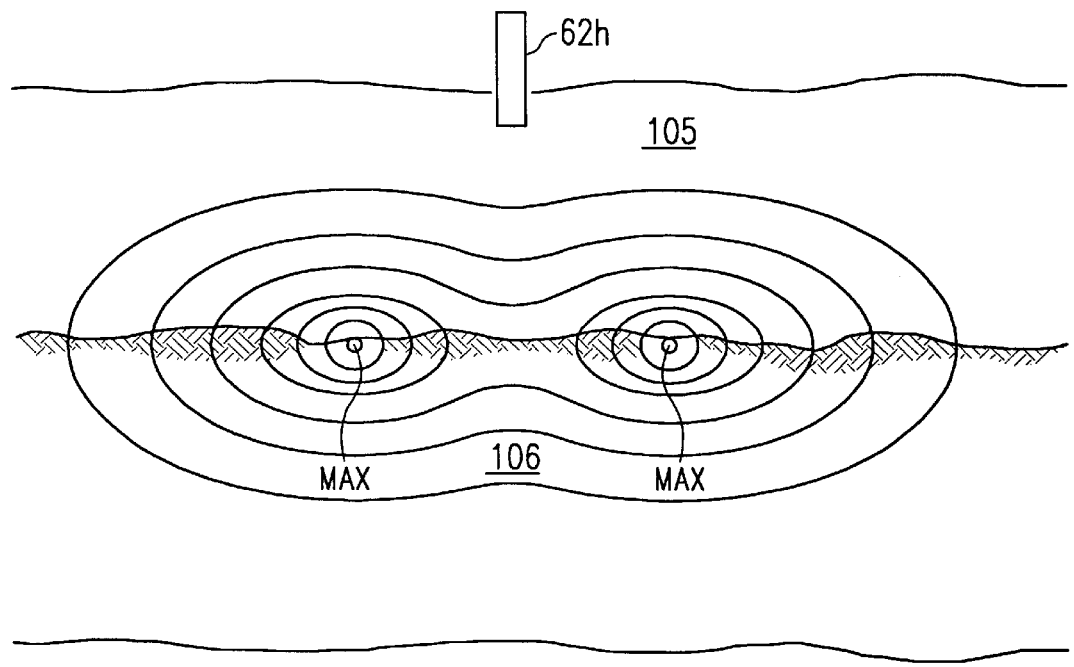

Referring to FIGS. 12a and 12b, the dispersal of these eddy currents will now be described relative to the example of FIG. 10 (not considering the effects of drill string 10, which will be discussed hereinbelow). FIG. 12a is a contour plot of eddy current density at a point in time after current is no longer being forced through coil 62h, but prior to such time as eddy currents have reached conductive layer 106. At the time illustrated in FIG. 12a, dispersal of the eddy currents through relatively non-conductive layer 105 has occurred to a significant degree, and in a relatively uniform fashion from horizontal coil 62h. FIG. 12a illustrates this relative to the maxima locations MAX located horizontally outward from horizontal coil 62h. This dispersal and decay occurs at a relatively fast rate due to the relatively low conductivity of formation 105 in this example.

Referring now to FIG. 12b, the contour plot of eddy current intensity is now illustrated after such time as the induced eddy currents have reached conductive formation 106. Maxima points MAX now reside in conductive formation 106, and the current density within conductive formation 106 is quite high relative to that in formation 105 surrounding horizontal coil 62h. This is because eddy currents decay more slowly in a conductive layer than in a non-conductive layer, as the decay rate is inversely exponential with conductivity, analogous to the case of an RC electrical circuit. In addition, it is also well known that the dispersal of eddy currents is much reduced in conductive layers rather than in non-conductive layers. As a result, the induced eddy current in formation 105 will continue to disperse, while that in conductive formation 106 will disperse more slowly. It should be noted that the substantially horizontal formation 106 will maintain the eddy current in a horizontal orientation.

Since switch 67 is open and switch 69 closed for horizontal coil 62h according to this example during such time as eddy currents are dispersing in the surrounding formation, horizontal coil 62h will be acting as a receiving antenna. The eddy currents in the surrounding formations 105, 106, and in drill string 10 as will be discussed hereinbelow, will in turn generate a magnetic field. The component of this magnetic field which is coaxial with horizontal coil 62h (i.e., the eddy currents traveling in a plane coplanar with loops in horizontal coil 62h) will induce a current in horizontal coil 62h, measurable by voltmeter 68. Resistor 71 is preferable in order to minimize the self-induction current in coil 72. As a result, the voltage measured by voltmeter 68 will indicate the time rate of change of magnetic flux due to eddy currents in the structures surrounding horizontal coil 62h. It is contemplated according to this embodiment of the invention that monitoring of this induced current in horizontal coil 62h over time will provide an indication of the presence and distance of conductive structures surrounding coil 62h. Particularly, it is contemplated that the magnetic dipole generated by eddy currents in horizontally oriented formation 106 ahead of drill bit 15 will be detectable by horizontal coil 62h.

As in the embodiments of the invention described hereinabove, various options for handling the detected data may be used, preferred examples of each of which will be described in detail hereinbelow. A first choice is telemetry of the raw measured data, in real-time or otherwise, by way of hardwired telemetry, stress wave telemetry (generated by piezoelectric, magnetostrictive, or other transducers), mud pulse telemetry and the like. Alternatively, downhole computing capability may be provided which receives the raw data and performs some or all of the calculations required in its analysis, with the results of the analysis communicated to the surface by way of telemetry; telemetry of the results may be at a lower data rate than is required for telemetry of high frequency raw data. Downhole electronics corresponding to these approaches may be incorporated into data handling unit of tool 23e, in similar manner as discussed hereinabove. Either of these approaches, as well as others, may be used in connection with this embodiment of the invention.

Referring now to FIG. 11, a method for detecting conductive layers distant from horizontal coil 62h will now be described, relative to its implementation in the system of FIG. 9. As described hereinabove, insulating sections 60 are provided within tool 23e itself, and between it and drill string 10. As a result, any eddy currents induced into portions of tool 23e will decay quite rapidly. However, induced eddy currents in drill string 10 will be maintained for some time, and will have a magnetic dipole moment, with a substantial vertical component; the magnetic dipole of drill string 10 will induce a current in horizontal coil 62h.

FIG. 11 is a log—log plot of dipole moment versus time, as may be measured by horizontal coil 62h in this embodiment of the invention. For relatively short times after t=0 when the current into horizontal coil 62h is switched off, it is contemplated that the measured magnetic dipole moment will be dominated by eddy currents in drill string 10. In FIG. 11, the magnetic field at coil 62h due to drill string 10, in a uniform insulating formation 105, is estimated to behave as line M10. The dominance of the magnetic dipole moment of drill string 10 shortly after the switching time t=0 is due to the proximity of drill string 10 to horizontal coil 62h, as well as its significant length (hundreds or thousands of feet). If drilling is proceeding through a uniformly high resistivity formation 105, it is contemplated that the magnetic dipole moment measured by horizontal coil 62h will substantially follow the decay of the magnetic dipole moment in drill string 10, following line M10 of FIG. 11.

It is further contemplated, however, that the presence of a substantially horizontal conductive formation 106 will affect the magnetic dipole moment versus time characteristic measured by horizontal coil 62h. As illustrated relative to FIG. 12b, it is contemplated that eddy currents in such a formation 106 will decay and disperse at a much slower rate in conductive formation 106 than in less conductive formation 105. As a result, it is contemplated that the presence of a conductive formation 106 ahead of drill bit 15 will be evident by a reduced (and perhaps non-linear on the log scale) rate of decay of the magnetic dipole moment over time as measured by horizontal coil 62h. An example of this reduced rate of decay, due to the presence of formation 106, is illustrated as curve M106 in FIG. 11, which corresponds to the sum of the effects of drill string 10 and such a conductive formation.

It is further contemplated that the distance of formation 106 ahead of drill bit 15 may also be determined from the magnetic dipole versus time characteristic. For example, time $t_a$ of FIG. 11 corresponds to the situation illustrated by the contour plot of FIG. 12a, where substantial eddy currents have not yet reached conductive formation 106. Accordingly, the magnetic dipole measured by horizontal coil 62h will be dominated by that of drill string 10, and any effects of conductive formation 106 will not be present (the eddy currents not yet reaching formation 106). Time $t_b$ of FIG. 11 corresponds to the situation of FIG. 12b, where the eddy currents are maintained near the surface of formation 106, but have substantially dissipated elsewhere. Accordingly, the magnetic dipole moment measured by horizontal coil 62h will not only include the moment of drill string 10, but will also include the dipole moment generated by eddy currents in formation 106, as evidenced by curve M106 in FIG. 12. Accordingly, it is contemplated that the time at which the measured magnetic dipole moment deviates from that expected from drill string 10 (and considering that contributed by eddy currents in formation 105 through which drilling is taking place), will be earlier as formation 106 becomes closer to horizontal coil 62h. It is therefore contemplated that analysis of the time at which changes in magnetic dipole moment are detected, particularly as a function of drilling depth, will provide information regarding the location of a conductive layer.

It is also contemplated that the characteristics of the magnetic dipole moment versus time curve will also provide information about the formation thickness. FIG. 11 illustrates dipole moment characteristic M106' which, it is believed, corresponds to the effects of a thin conductive layer ahead of horizontal coil 62h in combination with the effects of drill string 10. As noted hereinabove, eddy currents will be maintained in conductive material for a longer period of time, and decay less, than in non-conductive material. The duration of such eddy currents is of course dependent on the conductivity of the material, but also is dependent on the thickness of the material. Accordingly, a relatively thin layer of conductive material will support eddy currents only for a time corresponding to its thickness, after which the eddy currents will decay and be dispersed in non-conductive material on the opposite side thereof. Curve M106' of FIG. 11 illustrates such a case, where the dipole moment is maintained above that of drill string 10 (shown as line M10), but then rapidly falls off until it asymptotically approaches line M10. Detection of this time-related behavior can thus indicate the presence of a thin conductive layer ahead of horizontal coil 62h (and drill bit 15).

The effect of drill string 10 on the detected magnetic dipole moments according to the present invention is believed to be predictable. It is contemplated that either downhole or surface computing capability will be able to readily subtract out these predictable effects, thus improving the accuracy and sensitivity of tool 23e.

Referring back to FIG. 9, it is contemplated that vertical coils 62v will operate similarly to detect vertical formations 107 which are distant from wellbore 101. In the same manner as described hereinabove relative to horizontal coil 62h, the energizing and switching off of vertical coils 62v will generate eddy currents in the surrounding structure, but which have a vertical orientation (matching the vertical orientation of loops in vertical coils 62v), and thus a horizontal dipole moment. These eddy currents will disperse and decay in non-conductive material similarly as discussed hereinabove, and will decay and disperse to a lesser extent in conductive material such as a conductive vertical formation 107. The eddy currents which are maintained in vertical formation 107 will generate a magnetic field having a horizontal orientation, and which can therefore be sensed by vertical coils 62v when not energized by its current source. Accordingly, a change in the characteristic of dipole moment measured by vertical coils 62v (relative to the moment generated by eddy currents in drill string 10 and the surrounding formation) can indicate the presence of a conductive formation alongside well bore 101.

Provision of two, perpendicular, vertical coils 62v allows for determination of the direction of formation 107 from tool 23e, even during drilling when drill string 10 is rotating, so long as the orientation of tool 23e can be monitored. Magnetometer 64 is capable of detecting the orientation of tool 23e, such that the measurements from coils 62v can be synchronized with magnetometer 64 so that the direction can be deduced. For example, magnetometer 64 can synchronize the operation of vertical coils 62v in such a manner as to direct the magnetic field in a particular direction; this may be accomplished by controlling the magnitude of the current through each vertical coil 62v, so that the sum of the magnetic field generated thereby appears (outside of tool 23e) as the equivalent of a single fixed vertical coil oriented in a given direction. Such operation allows for direction of the magnetic field in a selected direction, to determine the presence or absence of a conductive layer in that direction. Iterative rotation of the direction in which the fields are generated through 180° will provide full coverage of the volume of interest.

This technique of rotating the direction of interest can determine the direction of an formation which is offset from tool 23e. However, ambiguity in the detected direction will remain, as the two coils are unable to distinguish perfectly vertical offset formations which are diametrically opposite from one another. However, it is contemplated that the use of prior history will allow the distinction of even this ambiguity, as the direction of the interface from the normal will provide differing magnitudes over time. Any deviation, over depth, in the angle of the interface from that which is exactly parallel to tool 23e will provide the ability to fully identify the direction of formation 107 from tool 23e, using previously obtained information during the same drilling operation. By knowing the direction of vertical formation 107 from wellbore 101, correction in the drilling direction can be made to hit, or avoid, conductive formation 107.

Statistical analysis of measured magnetic fields according to this embodiment of the invention may be carried out in similar manner as described hereinabove relative to FIG. 6. History of the measurements made during the drilling operation can be used to generate an expected value at each depth, deviations from which are indicative of an approaching change in formation characteristics, for example due to a new stratum approaching ahead of the drill bit 15. The use of this history may particularly enable the detection of low conductivity formations ahead of bit 15, by detecting a reduction in dipole moment from that which is otherwise expected. The results of this monitoring can be used to generate a new stratigraphic survey, or to verify and adjust a prior survey.

It is further contemplated that bending strain and flex in drill string 10 and any bottomhole assembly used therewith may be a source of noise, as such strain and flex will tend to disturb the orientation of the dipoles in the material of drill string 10. In situations where such noise is, or is expected to be, significant, it is contemplated that inclinometers, bending strain gages, and the like may be included within tool 23e for detecting such bending. Noise cancellation techniques can then be applied to remove noise which is suspected to be due to such bending.

As a result of this embodiment of the invention, it is contemplated that the presence of a different formation may be detected ahead of drill bit 15. It is particularly contemplated that low conductivity formations, such as hydrocarbon reservoirs, may be so detected. It is further contemplated that this system and method may be used in order to detect the presence of an overpressurized zone ahead of the bit by some distance, such that corrective action may be taken prior to the drill bit 15 reaching the overpressurized zone. For example, lightweight drilling mud may be used for much of the drilling operation, thus providing for fast and efficient drilling. This will allow changing of the drilling mud to a heavier weight upon detecting a conductive layer ahead of the drill bit.

In addition, it is contemplated that this method will also provide for a real-time log of the formations through which drilling has occurred, with the data acquired during the drilling of the well. This information can be compared against prior information, such as that acquired from neighboring wells, seismic surveys, and the like, to provide a more accurate survey, and to adjust prior surveys to match the attributes measured during drilling.

III. Data Handling

The following portion of this application will describe alternative methods for handling the data generated by the above-described data acquisition methods. As indicated hereinabove, the downhole generation and detection of data allows for higher frequency data to be acquired, providing higher resolution information concerning the surrounding sub-surface geology. Each of these attributes results in more data per unit time than prior methods, particularly when performed real-time during drilling. Accordingly, communication of the data taken, either in raw form or after downhole data processing, to the surface for storage, analysis, and corrective action initiation, is a significant portion of the present invention.

A. High Speed Stress Wave Telemetry

A first approach to this problem is the use of high speed stress wave telemetry. Various techniques for communicating information from downhole to the surface are known, and are believed useful in combination with the present invention. Particular classes of techniques which are contemplated to have sufficient data rate capability for such communication include stress wave telemetry using vibrations which are generated and sensed by piezoelectric transducers, and also stress wave telemetry where the vibrations are generated by magnetostrictive transmitters.

Copending application Ser. Nos. 554,022 and 554,030, both filed Jul. 16, 1990, both assigned to Atlantic Richfield Company, and both incorporated herein by this reference, describe a high speed stress wave telemetry system useful to communicate the real-time acquired data for the systems described hereinabove to the surface, for analysis. It should be noted that the provision of a downhole computer to process some or all of the data can alternatively be used; in such a case, the results of the downhole computation may then be transmitted to the surface, for analysis thereat, by such a telemetry method.

Figure 13:
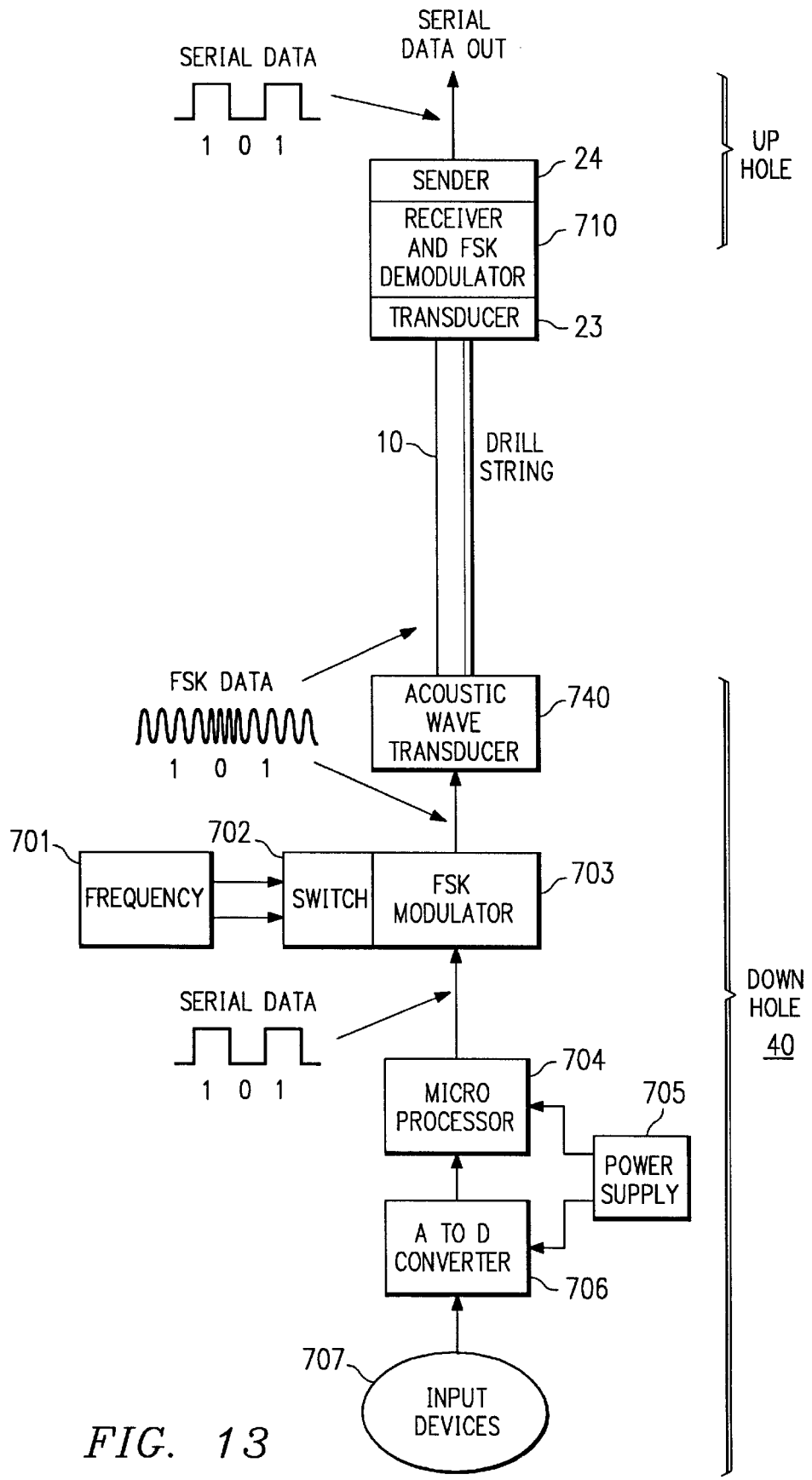
FIG. 13 is a schematic diagram, in block form, of a stress wave telemetry system useful as a data handling unit in the present invention.

Referring now to FIG. 13, an example of data handling unit 40, in this case for communicating information by way of stress wave telemetry, i.e., transmission of sensed information by way of vibrations in the structure, such as described in the above-referenced copending applications Ser. No. 554,022 and Ser. No. 554,030 both filed Jul. 16, 1990, both assigned to the Atlantic Richfield Company, and both incorporated herein by reference, will now be described. In such a data handling unit 40, the acoustic vibrations transmitted are preferably modulated (e.g., FSK modulated), to represent information gathered from near the bottom of drill string 10.

Referring to FIG. 13, the construction, in block diagram form, and operation of an implementation of a telemetry system according to a preferred embodiment of the invention is illustrated. Data handling unit 40 of FIG. 13 includes input devices 707, which may be transducers for the look-ahead seismic data acquisition system described above, or electrical meters or detectors as in the look-ahead electrical embodiments described hereinabove. Input devices 707 provide an analog electrical signal to analog-to-digital converter (ADC) 706. ADC 706 can be any one of the well known analog-to-digital conversion circuits which operate to convert an analog signal to a digital representation thereof. The output of ADC 706 is connected to a microprocessor 704, such as a Z8 manufactured and sold by Zilog, or other general or special purpose microprocessor. Microprocessor 704 is used in this case to interpret the digital value of the detected physical signal, and to apply it as a serial digital data stream to a conventional frequency shift key modulator 703. As is well known in the art, frequency shift keying is a type of modulation which provides a signal at a first frequency to represent a digital "0", and at a second frequency to represent a digital "1". In the example of FIG. 13, frequency control circuit 701 provides sinusoidal signals at two frequencies, which are generally close together but distinguishable by a demodulator circuit. Switch 702 and FSK modulator 703 apply, to transducer 740, one of the two frequency signals output by frequency control circuit 701, based upon the serial digital data presented by microprocessor 704. Transducer 740, as discussed above, then generates an acoustic wave in pipe string 10 corresponding to the frequency shift keyed data received from FSK modulator 703. As will be discussed hereinbelow with reference to preferred embodiments of transducer 740, the acoustic wave is generated by the expansion and contraction, in a given direction, of a piezoelectric stack contained within transducer 740, to generate axial or torsional vibrations corresponding to the modulated signal applied thereto.

The axial or torsional vibrations induced onto drill string 10 (or into such other structure as can utilize the invention) are sensed by transducer 23. Transducer 23 can be a piezoelectric element, or alternatively an accelerometer, strain gage, or other conventional transducer for generating an electrical signal in response to a physical force applied thereto. The electrical output of transducer 23 is received by receiver and frequency shift key (FSK) demodulator 710, such as an XR-2211 demodulator/tone decoder manufactured and sold by Exar, or another conventional FSK demodulator/tone decoder circuit. The output of demodulator 710 is a digital signal, for example a serial data stream, which is communicated to sender 24. As a result there is a serial data output from sender 24 to a computer or other data processing or storage unit, for analysis of the received vibrational data in the conventional manner to determine the characteristics of the signals.

While frequency shift keying is discussed hereinabove, other data encoding techniques, including a simple repetitive frequency, or amplitude or frequency modulation, could alternatively be used. For example, phase shift keying or modifications thereof, could be employed to transmit data along the drill string. An example of an alternate prior method for frequency shift keying an electrical signal is described in U.S. Pat. No. 4,156,229 issued May 22, 1979, and an example of a prior method for phase shift keying an electrical signal is described in U.S. Pat. No. 4,562,559 issued Dec. 31, 1985.

Using transducer 740 and the techniques discussed herein, many systems can be constructed to transmit large amounts of information quickly from downhole to uphole, or vice versa. By selection and modification of frequency control circuit 701, under local underground control, or by signals transmitted from a remote device, different transmission frequencies can be achieved and the frequency can be adjusted for optimum transmission along the drill string, as will be discussed hereinbelow. In addition, multiple transducers 740 can be placed along the drill string, each operating at a different frequency, or set of frequencies, to avoid interference with each other.

Transducer 740, according to the preferred embodiments of the invention, incorporates piezoelectric material for converting the electrical signal applied at its input to acoustic vibrations applied to drill string 10. As will be described hereinbelow, such a piezoelectric transducer 740 generates acoustic vibrations by the expansion and contraction, in a given direction, of a piezoelectric stack contained therewithin, which is coupled to drill string 10 to generate axial or torsional vibrations at frequencies and amplitudes corresponding to the electrical signal applied thereto. In this example, transducer 740 is preferably disposed downhole, near the drill bit 15, as shown in FIG. 1.

In the application of transducer 740 within drill string 10, it should be noted that space is quite limited within the well bore, for example between the walls of the hole and drill string 10. According to the preferred embodiment, transducer 740 is mounted within drill string 10 so that the vibrations are applied from the inside out. As described in the above-incorporated applications Ser. No. 554,022 and Ser. No. 554,030, the problem of limited cross-sectional area within the drill pipe is solved by mounting the vibrating device longitudinally along the axis of the drill string 10, and in such a manner that drilling fluid can flow through a downhole sub 30 which contains transducer 740. Sub 30 is preferably constructed to be located anywhere along the length of drill string 10.

Sub 30 and two transducer embodiments, namely transducer 740 for generating axial compressive vibrations and torsional wave transducer 1400, will now be described with reference to a downhole drilling operation. The transducers 740, 1400 described hereinbelow are preferred due to their ability to generate detectable vibrations at relatively high frequencies, such as over 1 kHz. As a result, the data rate can be quite high, for example on the order of hundreds or thousands of bits per second.

Referring now to FIG. 14, the construction of a transducer 740 for imparting compressional waves along the axis of drill string 10 will now be described. The above-cited applications Ser. No. 554,022 and Ser. No. 554,030, both filed Jul. 16, 1990, both assigned to the Atlantic Richfield Company, and both incorporated herein by reference, describe transducer 740 in further detail. Transducer 740 includes a stack 150 of piezoelectric elements 153, 154, disposed within housing 43. Housing 43 is preferably connected at one end to a mass 44, which provides a reactance in the mechanical system of transducer 740 to provide an increased amplitude to the physical vibrations generated by transducer 740. At the other end, housing 43 includes a threaded mating end 41, for connecting transducer 740 to sub 30 in drill string 10, or to such other structure to which the vibrations are to be imparted.

Housing 43 of transducer 740 is preferably constructed with a series of longitudinally displaced slits 45 defining ribs 42 which allow the unit to expand and contract along the longitudinal axis in the manner to be shown. The terminations 44 of slits 45 are preferably rounded so that stress is not concentrated at sharp corners thereof. Three sections of ribs 42 provides improved stability to the equilibrium, extended, and contracted, positions of housing 43, as wobble due to the uneven length or extension of the sections of ribs 42 is minimized for a three-legged structure. Tightening collar 60 is positioned at the bottom of transducer 740 and is used to apply pressure to piezoelectric stack 150 contained within device 740, in order to remove any space between the disks within the stack 150, such space resulting in less efficient conversion of the electrical signal to physical force. In addition, the tightening of stack 150 by tightening collar 60 may serve to reduce non-linearities in the force exerted by stack 150 as a function of the electrical input. Threaded stud 61 connects mass 44 to the free end of transducer 740. Mass 44 increases the vibratory effect of transducer 740 so that the magnitude of the vibrations induced onto drill string 10 (FIG. 1) is increased, and so that the frequency characteristics of transducer 740 can be optimized according to the frequency response of the structure to which the vibrations are applied.

As shown in FIG. 15, a series of piezoelectric elements 153, 154, preferably formed of lead zirconium titanate (or PZT), are illustrated. Each of PZT disks 153, 154 has a polarization axis, with positive and negative poles along this axis. In this embodiment, the orientation of piezoelectric elements 153 and 154 is alternately reversed along stack 150, with the elements labeled 153 having their negative poles facing upwards and with elements 154 having their positive poles facing upwards in FIG. 15. Accordingly, the negative sides of adjacent elements 153 and 154 are in contact with the same terminal 151 and the adjacent positive sides of each element are in contact with terminal 152. This construction allows all elements 153 and 154 to expand along the longitudinal axis of stack 150 with the application of a positive polarity voltage between leads 501 and 502, and for all elements 153 and 154 to contract along the longitudinal axis of stack 150 with the application of a negative polarity voltage between leads 501 and 502. A typical voltage supplied to the piezoelectric stack in this embodiment is on the order of 3,000 volts peak to peak. This voltage can be generated from a transformer from a low voltage power source, such as a battery, since relatively little current is required to cause the piezoelectric stack 150 to respond by expanding or contracting along its longitudinal axis responsive to the polarity of the voltage applied in this signal.

For installation of transducer 740 into drill string 10, sub 30 therein preferably has a central threaded receptacle therein for receiving the top threaded mating end 41 of housing 43, so that the expansion and contraction of the piezoelectric material in transducer 740 is coupled to drill string 10 therethrough. The compressional axial vibrations are thus transmitted along drill string 10 to the surface, and thus transmit data from downhole to the surface. As described above, mass 44 acts as a reactance mass to amplify the magnitude of the vibrations, so that vibrations of sufficient amplitude are transmitted at the desired frequency.

Figure 16:
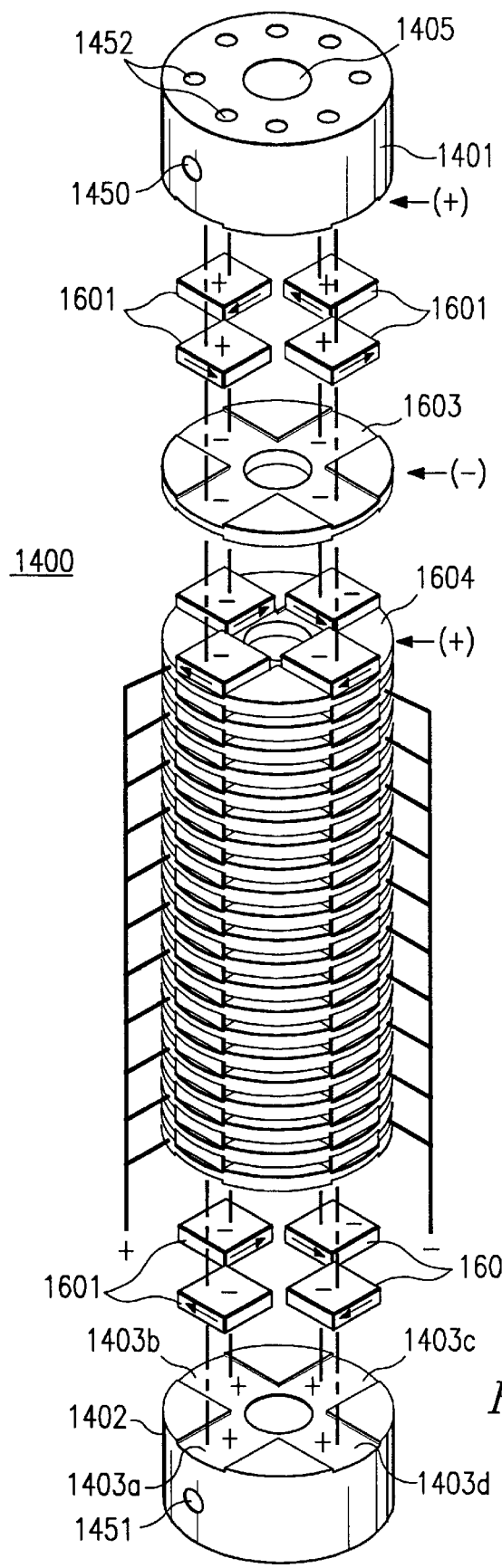
FIG. 16 is an exploded view of an alternative transducer for generating torsional vibrations according to an alternative embodiment of the invention.

Referring now to FIGS. 16 and 17, an exploded view of a transducer 1400 for generating torsional waves, according to an alternative embodiment of the invention, is illustrated. Except for the details of its construction as specifically described hereinbelow, transducer 1400 can be used in substitution for transducer 740 described hereinabove. It should be noted that transducer 1400 is also described in further detail in the above-cited applications Ser. No. 554,022 and Ser. No. 554,030.

Transducer 1400 includes brass end pieces 1401 and 1402 which, in this embodiment, each include four grooves 1403 (*a*), (*b*), (*c*) and (*d*) milled therein. Grooves 1403 are each about a half inch wide and spaced 90° apart, and retain piezoelectric elements 1601 in a fixed position relative to one another to transfer the force of piezoelectric elements 1601 to the end pieces 1401 and 1402. Piezoelectric elements 1601 are preferably formed of PZT, as in the case described above relative to the compressional axial wave transducer 740. The layers of piezoelectric elements 1601 adjacent to brass end pieces 1401 and 1402 are bonded thereto, preferably with a silver conductive epoxy. Brass washers 1603, each having grooves similar to grooves 1403 in end pieces 1401 and 1402 are placed between layers of piezoelectric elements 1601, throughout the length of the stack from end piece 1401 to end piece 1402. An example of a completed stack is approximately thirty layers of piezoelectric elements 1601, with washers therebetween.

Piezoelectric elements 1601 are polarized along a polarization axis, similarly as piezoelectric elements 153, 154 discussed hereinabove, but with their polarization axes orthogonal to the applied voltage, as shown by the arrows in FIG. 16. A first layer of piezoelectric elements 1601 is located adjacent end piece 1401 within transducer 1400, and oriented in such a manner that their polarization axes (negative-to-positive poles) are oriented in a counter-clockwise direction around the longitudinal axis of transducer 1400. A brass disk 1603 is located between this layer and the next adjacent layer of piezoelectric elements 1601; brass disk 1603 serves as an electrode in transducer 1400. In the adjacent layer of piezoelectric elements 1601, the polarization axes are oriented (negative-to-positive poles) in a clockwise direction around the longitudinal axis of transducer 1400. A brass disk 1604 is located adjacent this layer and the next adjacent layer of piezoelectric elements 1601. For each of piezoelectric elements 1601 shown in FIG. 16, the arrows indicate the direction of the polarization axis, pointing toward the positive pole, corresponding to its distortion direction for a given voltage polarity.

Since both the orientation of the piezoelectric elements 1601 alternate for alternating layers and the brass electrodes 1603 and 1604 are alternately connected to one another, each layer of piezoelectric elements will distort in the same direction for a given polarity applied between electrodes 1603 and 1604. The net result is that all of elements 1601 in the stack exert a force in the same rotational direction. The grooves in each of electrodes 1603 and 1604, and in end pieces 1401 and 1402, cause the distortion of each layer of elements 1601 to be additive along the length of transducer 1400, so the net result at the top is a rotational movement which is the sum of the movement of all the individual layers.

Brass end pieces 1401 (at the top) and 1402 (at the bottom) each have a hole 1405 counterbored therethrough to accept a nut for each end 1502, 1503 of shaft 1501 as shown in FIG. 13. Shaft 1501 is placed within transducer 1400 in the hole therethrough along its longitudinal axis. The end nuts, not shown, are used to preload the end pieces 1401 and 1402 with spring tension. Set screws, not shown, are used in tapped holes 1450 and 1451 of end pieces 1401 and 1402, respectively, to mate with flats 1550 and 1551, respectively (FIG. 13). This construction forces shaft 1501 to twist when voltage is applied to piezoelectric elements 1601, in either polarity. The twisting of shaft 1501 will store energy in kinetic form, so that transducer 1400 will tend to quickly return to its quiescent state when voltage is removed. Bolt holes 1452 allow mounting of transducer 1400 within a sub 30 of drill string 10, or other appropriate structure, in similar fashion. Similar bolt holes (not shown) on the base 1402 at the free end of transducer 1400 can receive a mass 44 to increase the amplitude of the vibrational signal and tune the frequency of vibrations from transducer 1400.

In either case of transducers 740, 1400, according to the system illustrated in FIG. 13, stress wave telemetry of data from downhole to the surface can be accomplished at relatively high data rates. As a result, it is contemplated that the data generated and detected downhole according to the data acquisition methods can be communicated in real-time fashion to the surface for analysis thereat, by way of such telemetry.

B. Downhole Computation of Acquired Data

As is evident from the foregoing description, a significantly larger amount of data is acquired in the look-ahead prospecting technologies as compared with previous MWD parameter monitoring, and with surface seismic prospecting techniques. The amount of data acquired is significantly greater than that of conventional MWD, due to the higher sampling frequency required for this high resolution prospecting, and due to the higher number of channels from which the data is acquired. In addition, due to the relatively poor signal/noise ratio expected from this technology, additional data will likely be required and additional processing complexity will be needed to implement noise reduction techniques. Relative to surface seismic prospecting, the frequencies of the energy detected downhole are orders of magnitude greater than that detected by conventional surface seismic detectors, and thus is arriving at a higher data rate.

High data rate telemetry, as discussed hereinabove, allows for a useable portion of such high speed data to be communicated to the surface, enabling the use of downhole generated and downhole detected energy to deduce the structure and properties of strata at and ahead of the drill bit, during drilling. However, even the high data rate telemetry described hereinabove cannot communicate raw data at a rate close to the same order of magnitude of the rate at which modern high speed computing circuits and systems are able to process the same data. Accordingly, it is contemplated that deployment of high speed computing capability to locations downhole will allow for even further exploitation of the energy which is both generated and detected downhole, as described hereinabove. This will also reduce the telemetry requirements, as communication of the results may be done at much slower rates than the communication of the raw data.

However, due to the space available in a downhole tool, as well as the hostile temperature, pressure and other environmental factors downhole, it has been difficult, if not impossible, to physically place sufficient computing capability downhole which is of such power and capacity to adequately deal with the quantities of data contemplated relative to the above data acquisition methods. In recent years, however, significant advances have been made in the integrated circuit art, such that huge data processing capability can now fit into relatively small form factors. Examples of high performance data processing systems of a size suitable for use in a downhole environment, are the T425-25 and T800 transputers available from Inmos Corporation. Each of these transputers, including their own CPU and memory, are useful in performing the processes noted hereinbelow.

According to this embodiment of the invention, multiple transputers are utilized in a downhole environment in data handling unit 40 as shown in FIG. 1 hereinabove. In addition, it has been found that certain data structures together with a certain processing methodology are particularly beneficial to the implementation of parallel processing. It is contemplated that these data structures and this methodology, when used with high-speed processing equipment such as the transputers noted hereinabove, will enable downhole data analysis to such an extent that the analysis which is to be performed relative to the above-described look-ahead seismic and electromagnetic surveying techniques may be performed downhole, with only the results communicated to the surface.

Figure 18:
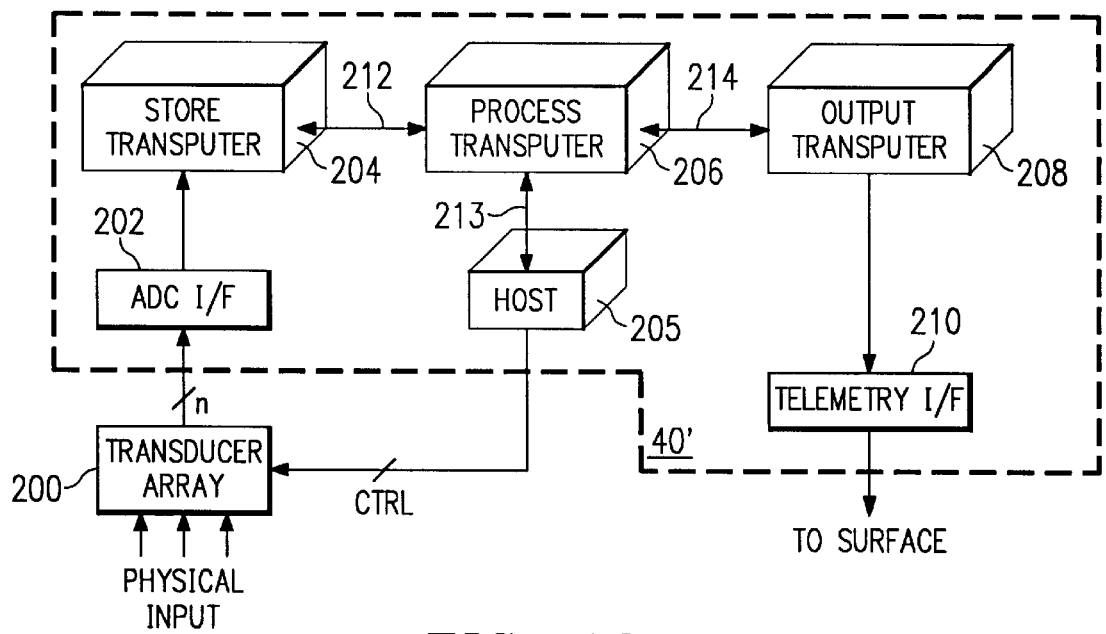
FIG. 18 is an electrical diagram, in block diagram form, of a data processing system useful according to the present invention.

Referring now to FIG. 18, an example of data handling unit 40' according to this embodiment of the invention will now be described in detail. This example of data handling unit 40' includes three transputers 204, 206, 208 for handling the three fundamental functions of data acquisition, data processing, and output. As will be noted hereinbelow, however, this embodiment of the invention utilizes a data structure which is particularly well suited for parallel processing, so that more than the three transputers illustrated may be utilized. In FIG. 18, store transputer 204 receives, formats and stores the incoming data in suitable condition for analysis. Process transputer 206 performs the data analysis algorithms on the data received and stored by store transputer 204, with host computer 205 controlling its operation. Output transputer 208 receives the results of the processing by process transputer 206, formats the same and presents it to telemetry interface 210, which controls the communication of the results of the processing by way of hardwired electrical telemetry, stress wave telemetry (piezoelectrically or magnetostrictively generated), or such other technique selected for communicating the results of the data processing to the surface for receipt and further analysis.

By way of example, it is contemplated that store transputer 204 may be of lower capacity and performance than process transputer 206. For example, store transputer 204 may be a T425-25 transputer, while process transputer 206 is a higher capacity and performance T800 transputer. Selection of the particular capacity and performance levels can, of course, be made by one of ordinary skill in the art having knowledge of the volume of data to be processed.

Host computer 205 is a conventional microcomputer, having the primary function of controlling the operation of process transputer 206. In addition, particularly in the case where source energy is to be actively generated downhole (as in the electromagnetic situations described hereinabove), host computer 205 is coupled to transducer array 200 to control the generation of such input energy to the earth surrounding the associated tool 23. Examples of microcomputers which may be used as host computer 205 are general purpose microprocessors (such as the i80386 manufactured and sold by Intel Corporation), or special purpose microcomputers (such as the TMS 320C25 manufactured and sold by Texas Instruments Incorporated).

Figure 19:
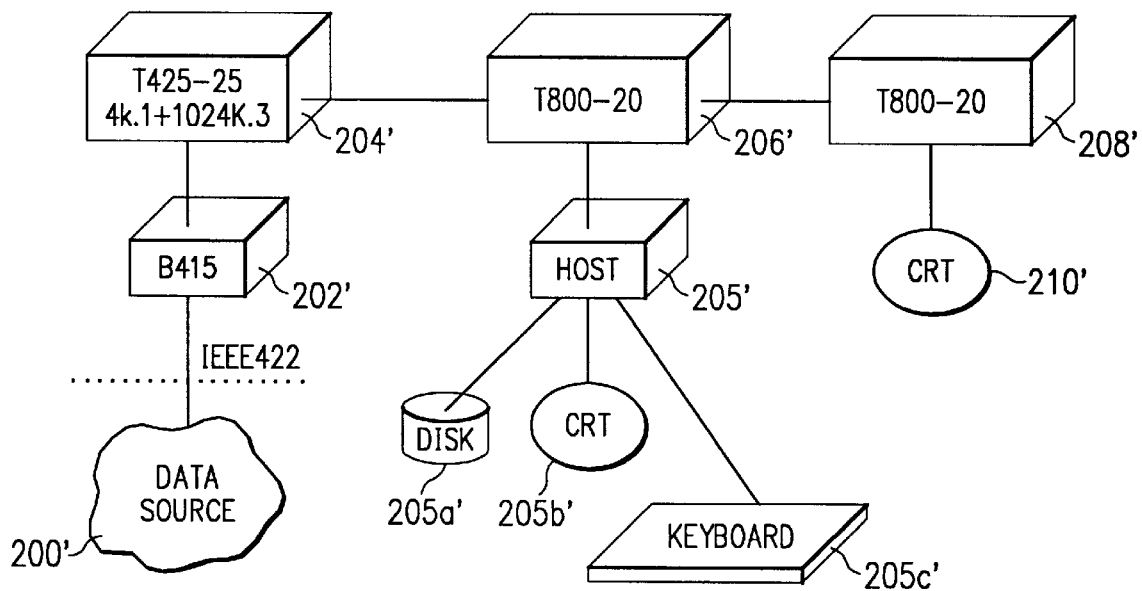
FIG. 19 is an electrical diagram, in block diagram form, of the data processing system of FIG. 18 in stand-alone form.

The architecture of FIG. 18 is also useful in conventional above-ground computer systems. FIG. 19 illustrates, in block form, a conventional workstation computer architecture using transputers in a similar arrangement as that illustrated in FIG. 18. In this example, data source 200' is a digital data source, such as disk storage, analog-to-digital converter output, modem communication ports, etc., which communicate data to interface 202' and in turn to store transputer 204'. Process transputer 206', in this case, is controlled by host computer 205', with conventional peripherals such as disk storage 205a', CRT monitor 205b', and keyboard 205c' cooperating with host computer to define the task to be performed. Output transputer 208', in this example, generates graphics output of the results of the processing of process transputer 206', and presents these results to CRT output 210'. It is contemplated that the benefits of the data structure and methodology described hereinbelow relative to downhole data handling unit 40' will also be applicable to a conventional computer system such as illustrated in FIG. 19.

Referring back to FIG. 18 for data handling unit 40', transducer array 200 includes the detectors described herein for the various embodiments of energy detected (seismic, galvanic, induction, etc.), which receive the physical energy from the formation and generate electrical signals responsive thereto. The output of transducer array 200 is received by interface 202 in data handling unit 40', interface 202 including such analog-to-digital conversion circuitry, multiplexing, and other formatting electronics as is conventional in the art for receiving analog electrical signals and communicating the same to data processing systems. The output of interface 202 is connected to store transputer 204 which receives the digital electrical signals from interface 202, and stores the same in memory in conjunction with particular contextual information relating thereto, as will be described in further detail hereinbelow.

As noted hereinabove, store transputer 204 is coupled to process transputer 206 by way of bidirectional link 212, so that the data received and stored by store transputer 204 may be communicated thereto. Bidirectional link 212 is a high speed serial link, capable of communicating digital data at rates of up to 20 Mbits/second. Process transputer 206 is also connected to host computer 205 by way of bidirectional link 213; in contrast to line 212, link 213 is a relatively slow link due to the limitations of host computer 205. Host computer 205 may be a conventional personal computer, or general or special purpose microprocessor in the same, which selects and controls the processes to be performed by process transputer 206. In this example, host computer 205 also controls transducer array 200, by way of control bus CTRL, so that the receipt of physical inputs thereby and the communication of the same to store transputer 204 is appropriately controlled.

Also as noted hereinabove, process transputer 206 is coupled to output transputer 208 by way of bidirectional link 214, which is a high speed serial link similar to link 212.

Output transputer 208 processes the information received from process transputer 206 to place it in the proper format for communication from data handling unit 40', for example by way of telemetry interface 210.

Each of transputers 204, 206, 208, according to the Inmos configuration noted hereinabove, has four link ports available thereto for potential connection to a high speed serial link. In the arrangement of FIG. 18, process transputer 206 has the most ports occupied, namely three; transputers 204, 208 each have two ports occupied. Accordingly, transputers 204, 206, 208 may be incorporated into a parallel processing configuration; for example, another process transputer 206 may be connected to the spare port of process transputer 206, with connections to spare ports of store transputer 204 and output transputer 208. Such an arrangement can allow for parallel processing of the particular data analysis routines to be performed on the signals corresponding to the downhole detected energy.

According to the preferred embodiment of the invention, however, the structure of the data as it is stored by store transputer 204 is particularly well suited to parallel processing. In this sense, parallel processing refers not only to multiple transputers performing similar processes (e.g., multiple process transputers 206), but also the parallel and simultaneous operation of store transputer 204, process transputer 206, and output transputer 208 in the configuration of FIG. 18.

Figure 20:
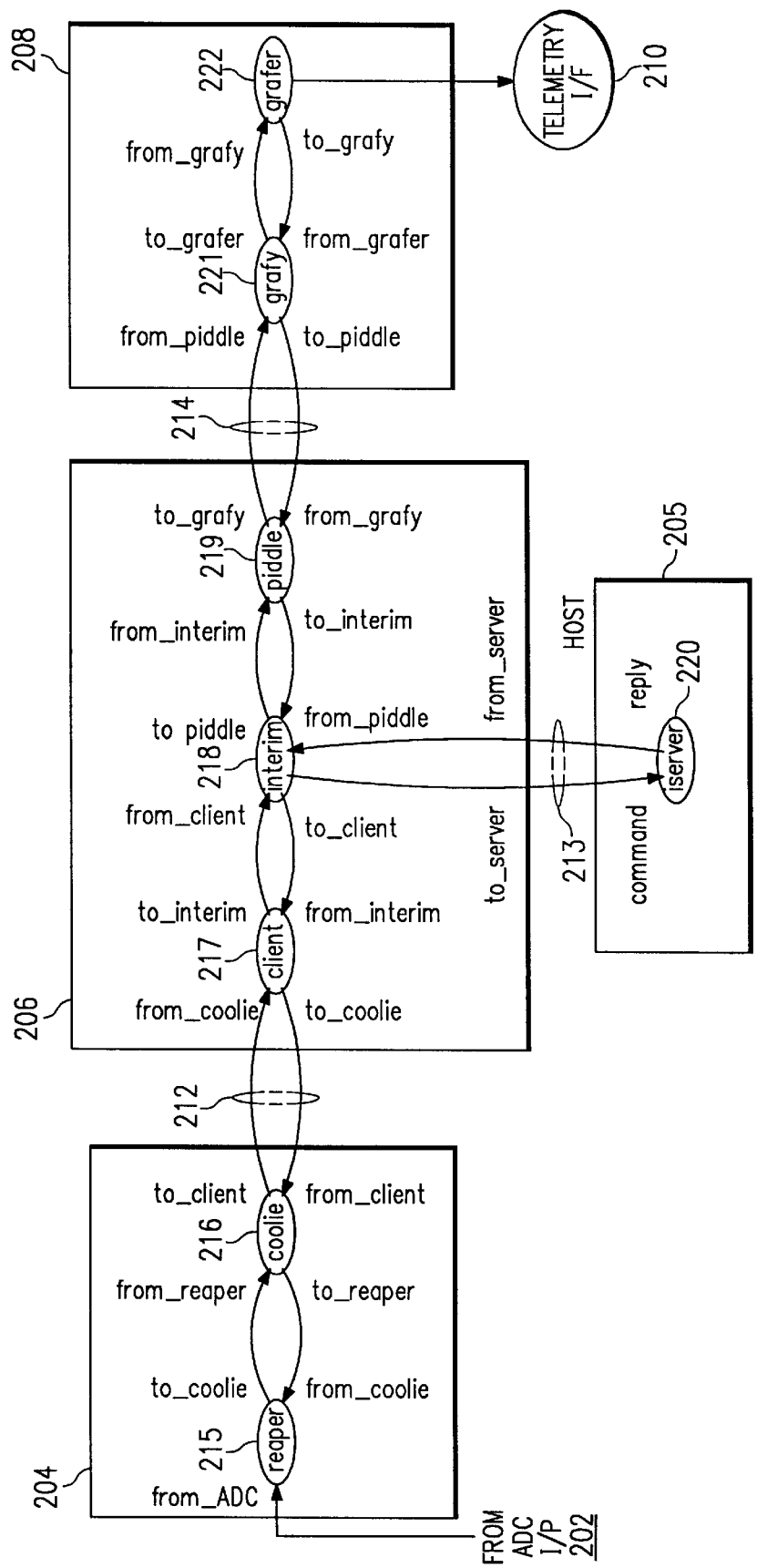
FIG. 20 is an electrical diagram, in block diagram form, illustrating the assignment of various processes to hardware in the system of FIG. 18.

Referring now to FIG. 20, the assignment of various tasks to transputers 204, 206, 208 of FIG. 18 will be described in further detail. Processes "reaper" 215 and "coolie" 216 are assigned to store transputer 204. In this example, reaper 215 receives the raw data from ADC interface 202, and stores the same according to a structure which is particularly adapted to parallel processing, as will be described in further detail hereinbelow. Reaper 215 is in bidirectional communication with coolie 216 which, in turn, is in bidirectional communication with process "client" 217 assigned to process transputer 206. Coolie 216 and client 217 effectively serve as DMA controllers for communicating the input data from store transputer 204 to process transputer 206 when needed; this DMA transaction will be described in further detail hereinbelow. The DMA operation involving coolie 216 and client 217 is made necessary by the use of separate transputers 204, 206 for the store and process operations, since the data must be physically transferred in some fashion from store transputer 204 to process transputer 206. A single chip transputer or other processor which performs both the store and process functions would eliminate the need for the coolie 216 and client 217 processes. For example, implementation of the functional system of FIG. 20 on a conventional personal computer workstation eliminates the need for coolie 216 and client 217; of course, the performance benefits of high speed transputers are not obtained in this arrangement.

Process transputer 206 also has processes "interim" 218 and "piddle" 219 assigned thereto. Interim 218 is the workhorse process of the analysis performed by this embodiment of data handling unit 40', as it performs sequences of instructions according to the algorithm used in the analysis. Piddle 219, similarly as client 217 and coolie 216 noted hereinabove, is a DMA control process, for communication of the results of interim 218 to output transputer 208, in particular, to process "grafy" 221 assigned to output transputer 208. In addition, interim 218 is in communication, via link 213, to process "iserver" in host 205. Iserver 220 is the process by which sequences in interim 218 are defined and ordered.

Processes "grafy" 221 and "grafer" 222 are assigned to output transputer 208. As noted above, grafy 221 is a DMA control function, for receiving data from process transputer 206, and storing it within output transputer 208. Grafer 222 is the process which receives the results of the algorithm performed by process transputer 206, and formats these results for communication, for example by telemetry interface 210; in the alternative arrangement of FIG. 19, grafer 222 would prepare the graphics output for display on the system monitor, or for output on a printer or plotter.

Figure 23:
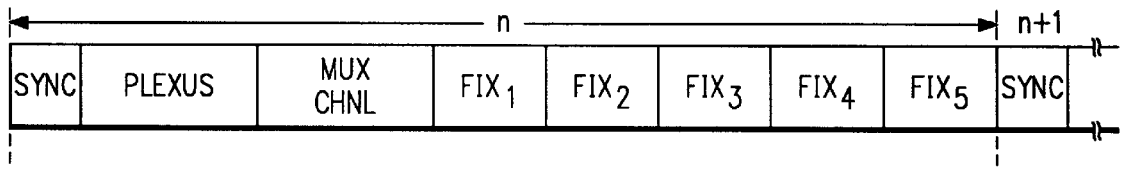
FIG. 23 is a diagram of an incoming data stream acquired by the system of FIG. 18.

Referring now to FIGS. 21 through 24, the operation of reaper 215 in store transputer 204 according to this embodiment of the invention will now be described in detail. Referring first to FIG. 23, the serial data received by store transputer 204, particularly reaper 215 assigned thereto, will be described. Each packet of incoming data, in this example, includes a value associated with a relatively slow changing variable (e.g., temperature, battery output voltage, etc.) as well as a number of relatively rapidly changing values (e.g., detected energy to be used in the seismic analysis described hereinabove). Therefore, the structure of the incoming data stream will always include a value for each of the channels along which rapidly changing data will be transmitted, and perhaps a value from one of the slower changing channels. The slower changing channels are thus referred to as multiplexed channels, as they receive data in a multiplexed fashion from a series of packets; each packet corresponds to a sample of the detected analog data, after sampling and conversion by interface 202 (see FIG. 18). The rapidly changing channels are thus referred to in this example as fixed channels, as each of these channels receive a value in each packet.

Packet n in the data stream of FIG. 23 thus includes a sync word followed by a plexus value. The plexus value identifies the slow moving channel with which the next value in the packet is associated. The value following the plexus value is the multiplexed channel data. Following the multiplexed channel data are the data values for each of the fixed channels; in the example of FIG. 23, five fixed channels are associated with the data packet. Following the last fixed channel value, the sync word for the next packet n+1 may be transmitted and received.

Referring now to FIGS. 21 and 23, the operation of reaper 215, and the data structure according to the present invention into which reaper 215 organizes the data in a manner particularly adaptable to parallel processing, will be described in detail. FIG. 21 illustrates the data structures used and generated by reaper 215 in performing the process of FIG. 23. According to this embodiment of the invention, the incoming data is to be stored in such a fashion that it "brings along" information about its channel, particularly as it is communicated to interim 218 in process transputer 206. This information associated with each block of data is referred to in FIG. 21 as channel_head 235 and channel_info 236 structures.

Channel_head 235 is associated with each block of data for a channel, where a block consists of n data words or values for that particular channel, and where a channel is associated with one of the detecting mechanisms in the downhole tool (e.g., an accelerometer, temperature sensor, strain gage, magnetometer, voltmeter, etc.). For a block of data, as shown in FIG. 21, channel_head 235 points to channel_info 236 which indicates attributes of the particular channel associated with the block; channel_head 235 also points to the location in memory of the data in the block (pointers first_data and next_data pointing to the beginning and next addresses). The variables in channel_head 235 according to this example include the following:

channel_used: flag set by host 205 to indicate whether the data is to be used, or to be discarded (due to memory constraints, etc.)

last_channel: flag to indicate if the channel is the last one in a linked list (allowing the process to stop)

first_data: memory address of the first data value in the associated block of channel information next_data: memory address at which the next data is to be stored channel_info: location of the associated channel information structure next: points to the next channel_head Each channel_info 236 in this embodiment of the invention includes the following pointers or information:

channel_used: flag indicating whether the data is to be used or ignored number: numeric channel identification value buffer_size: size of data buffer (number of samples)

name, units: identifies the physical attribute of the stored data (temperature, strain, etc.) and its units (e.g., °C.)

channel_head: points to its associated channel_head next: points to the next channel_info 236

In the example of FIG. 21, having three multiplexed channels and five fixed channels, eight channel_heads 235 and eight channel_infos 236 will be assigned and used. As will be described hereinbelow, interim 218 in process transputer 206 will ask for input data by referring to channel_info 236.

Also as shown in FIG. 21, the operation of reaper 215 is controlled according to other data structures. Structure super 230 is a supervisory structure which is associated with a single block of data for each of the active channels. For example, if three multiplexed channels and five fixed channels are to be received as incoming data, a single instance of super 230 will control the placement of data for a block in each of these eight channels. Multiple blocks of data are handled by multiple supers 230. Each super 230 refers to the next super 230, in circular fashion, so that the sequence of supers 230 is a circular linked list. The length of the sequence of supers 230 is selected by the system designer or user, according to the frequency with which the incoming data is retrieved from reaper 215; by the time that a full circle of the super sequence is performed, it is preferable that one or more blocks of data have been retrieved so that additional incoming data can be handled.

Figure 24:
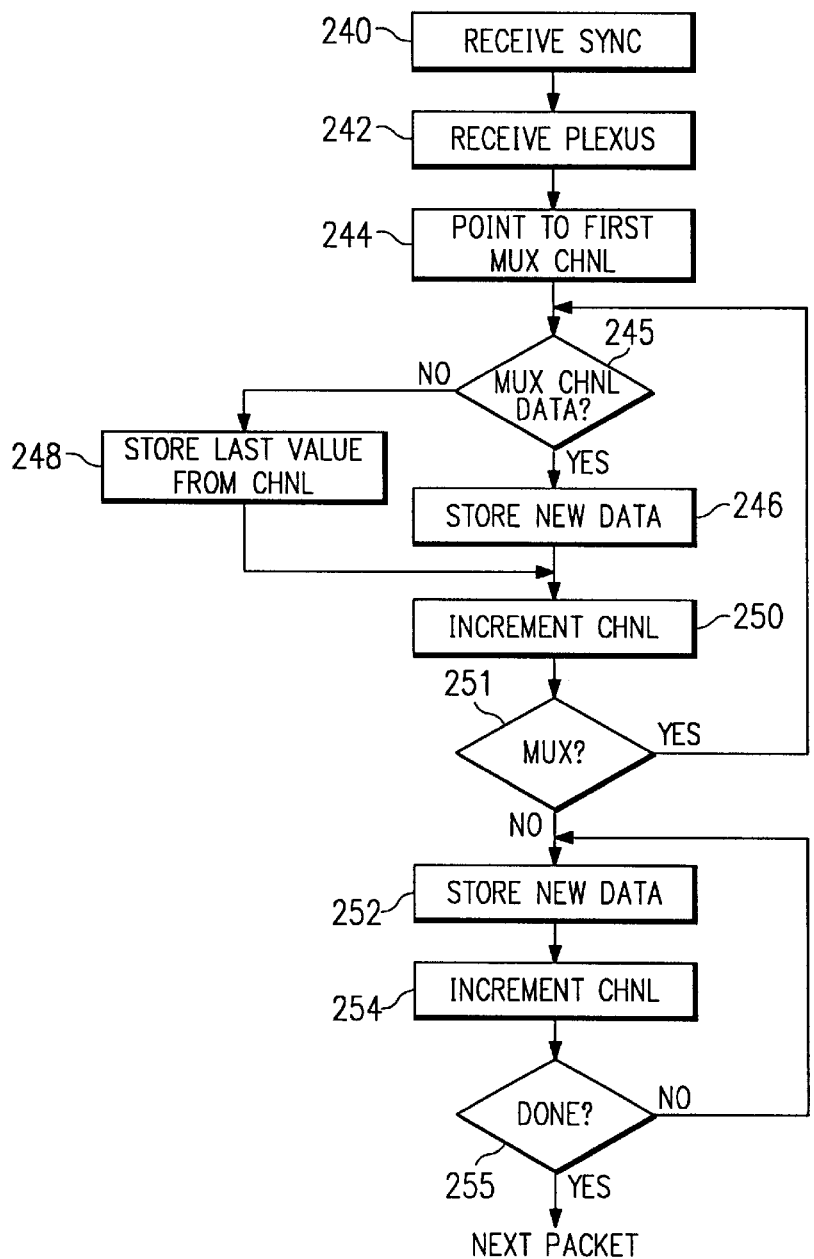
FIG. 24 is a flow diagram illustrating the storage of incoming data by the system of FIG. 18.

Each super 230 contains the following pointers or indicators:

checked_out: indicates if one of its associated channel_heads is being accessed by coolie 216 filling: flag indicating that the data structure is being filled (i.e., preventing the structure from being checked out)

sync_error: indicates if synchronization was lost discontinuous: indicates if data has been interrupted by loss of synchronization first_channel: points to the first channel_head structure 235$_0$ first_fixed: points to the location of the first fixed channel_head structure 234$_0$ multiplexed: points to the location of the first multiplexed-info structure 232$_0$ next: pointer to the next super 230 in the linked list Referring now to FIG. 24 in conjunction with FIG. 21, the operation of reaper 215 in receiving and storing a packet of information will be described. In process 240, the active super 230$_0$ in reaper 215 receives the sync word, indicating that a data packet is incoming, followed by process 242 in which it receives the plexus value, indicating which of the three (in this example) multiplexed channels will be receiving a data value in the current packet. In process 244, active super 230$_0$ points to data structure multiplexed_info 232$_0$ which is associated with the first of the three (in this example) multiplexed channels for which a data value may be in the current packet. In addition, active super 230$_0$ is also pointing to channel_head 235$_0$ which is associated with the first multiplexed_info structure 232$_0$. Channel_head 235$_0$ contains the channel information for this channel, including pointers to the appropriate channel_info structure 236$_0$ associated therewith. The contents of channel_info 236$_0$ are previously defined in store transputer 204; the contents of channel_head 235$_0$ are generated by reaper 215 in this operation. It should also be noted that while different channel_infos 236 are used for each of channel_heads 235 associated with active super 230$_0$, the same channel_info 236 may be used with several instances of supers 230, as the same channel may be used in different blocks of data, and since the information in channel_info 236 is not dependent upon the incoming data.

Test 245 is performed by which the plexus value is compared against the pointed-to multiplexed_info structure 232$_0$. If the values match, indicating that the plexus value matches the current structure 232, process 246 is performed by which the multiplexed value in the current packet is stored in the appropriate location indicated by channel_head 235$_0$ associated therewith.

However, if the plexus indicates that the pointed-to multiplexed_info structure 232$_0$ is not the channel with which the incoming value is associated, a carry-down operation is performed in process 248. This carry-down operation repeats the most recently received value for that channel into the location associated with the current packet. Accordingly, multiplexed data acquisition may be used for relatively slow-changing channels, with reaper 215 repeating the previously acquired values for intervening samples, or packets. Later use of the data from these channels therefore does not need to account for varying sample frequencies, as reaper 215 provides the intervening data between samples by process 248.

After the completion of either process 246 or process 248, depending upon the plexus value, the pointed-to channel is incremented in process 250, by way of the "next" value in the linked list element of multiplexed_info 232. If the next channel is still a multiplexed channel (as is the case for the "next" in multiplexed_info 232$_0$), the plexus value is again compared in test 245 as above.

If the next channel is a fixed channel, active super 230$_0$ points to the first fixed_channel structure 234$_0$. The data received in the next value of the packet will be stored in association with its corresponding channel_head 235 and channel_info 236. The fixed channels will be incremented by process 254 and new data accordingly stored, until test 255 determines that all fixed channels have been served. The next packet is then received, and the process continued until completion of active super 230$_0$, after which the next linked super 230$_1$ will control reaper 215.

It has been discovered that, even using several instances of supers 230, various events can occur which can cause upset of reaper 215. A first event is the "blocking" of a super 230 due to coolie 216 accessing one of the channel_heads 235 associated therewith, as the writing of new data into memory which is being read will cause upset of one or both of the operations. A second event is the overrunning of data, where data is not retrieved at a high enough rate such that incoming data has exceeded the capability of reaper 215. These events temporarily occur even in well designed systems; of course, in poorly designed reapers 215, these events may be commonplace.

Referring to FIG. 22 in conjunction with FIG. 21, the capability of reaper 215 according to this embodiment of the invention for dealing with either of these events will be described. As noted in FIG. 21, each of supers 230 includes a checked_out flag. In the event that a super 230 is blocked or will be overrun, its checked_out flag will invoke use of an idle_super 230'. Idle_super 230' has a similar function as the linked supers 230, except that it points to common storage for the multiplexed_info and fixed channel structures; such common storage is a "bit bucket", in the manner well known in the art. The function of idle_super 230' is thus to safely receive and discard excess data received during blocks or overrun events; while this amount of the incoming data is lost, subsequent processes are not upset due to incorrect or nonsensical data, or due to conflicts in access to memory. Upon completion of disposal of a packet, idle_super 230' points back to the super 230 which originally pointed to idle_super 230', indicating that data was lost by way of the "discontinuous" flag. If the block is clear, the original super 230 will continue its control of the operation; if not, the original super 230 will point back to idle_super 230' and the disposal of incoming data will continue.

After storage by reaper 215 in the memory of store transputer 204 in the manner described hereinabove, the incoming data is organized in blocks, by channel, and is ready for processing when needed by process transputer 206. As noted hereinabove, coolie 216 in store transputer 204 and client 217 in process transputer 206 cooperate with one another to perform DMA of the desired data from store transputer 204 to process transputer 206. This operation is generally performed by client 217 requesting data from coolie 216. Coolie 216 will interrogate reaper 215 to determine if a set of associated channel_heads 235 (and, of course, the associated data) are available to be read and transferred; if so, coolie 216 transfers the associated channel_head 235, channel_info 236, and data to client 217, which stores this information in the memory of process transputer 206, modifying the addresses in channel_info 236 and channel_head 235 as necessary to correspond with the memory organization and addressing scheme of process transputer 206. If the desired channel_heads 235 are not available, coolie 216 and client 217 cooperate with one another to enter a wait state, and to indicate to interim 218 that a wait is in process.

Figure 25:
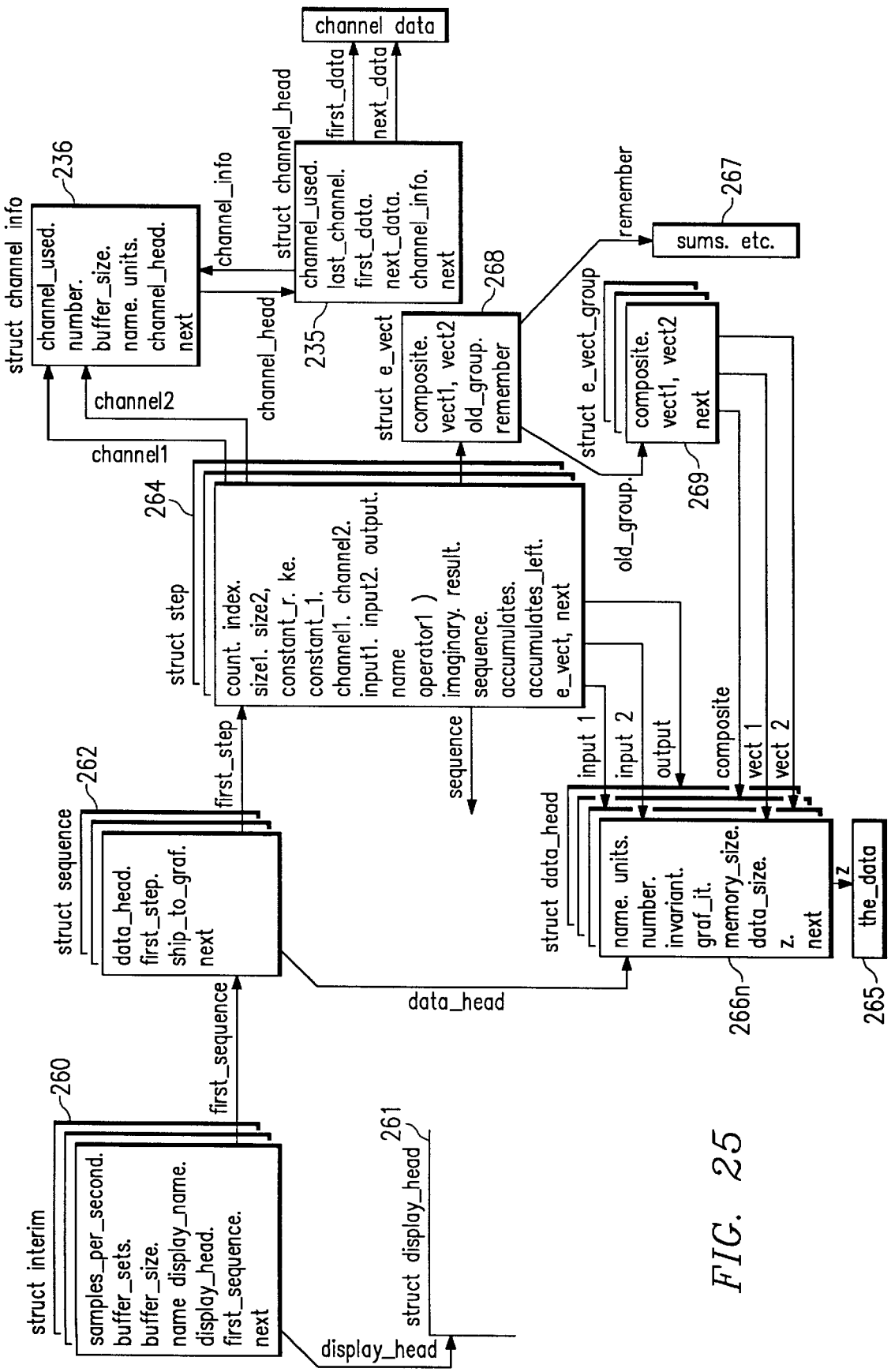
FIG. 25 is a data structure diagram illustrating data processing as performed by the system of FIG. 18.

Referring now to FIG. 25, the organization of data structures utilized by interim 218, and the operation of interim 218 in process transputer 206, will now be described in detail. Interim data structure 260 controls the operation of interim 218 for a particular task; examples of such tasks are FFTS, cross-correlations, and the like. Each interim structure 260 designates an associated display_head data structure 261, which controls the output of the results of the interim structure 261 via output transputer 208, as will be disclosed in further detail hereinbelow; display_head structure 261 provides the means by which a real-time user of the system can request a particular operation or sequence to be performed on selected information. Interim structure 260 also contains particular parameters for the analysis desired, for example:

samples_per_second: sampling rate of the data buffer_sets: number of super 230 to be implemented on store transputer 204 name, display_name: labels for output display_head: points to display_head 261

In addition, interim structure 260 includes a pointer to the location first_sequence, which points to the first of the structure data sequences 262 in the process. A pointer next is also included within interim 260, which points to the location of the next interim structure 260 (if any) to be processed upon user request.

Each interim structure 260 (within its own linked list) thus points to a linked list of sequence structures 262. In this embodiment of the invention, a sequence structure 262 corresponds to the mathematical (or other) algorithm to be performed. Subordinate to sequence structures 262 is exactly one data_head structure 266 and a linked list of step structures 264 (which may be a null set). The linked list of step structures 264 pointed to by a sequence structure 262 defines the algorithm as a sequence of steps; the linked list of sequence structures 262 therefore defines, for an interim structure 260, a potentially very high level operation.

In this example, each sequence structure 262 may include the following attributes:

data_head: pointer to a stored data block first_step: pointer to the first process step ship_to_graf: pointer to output control process next: pointer to the next step in the sequence Accordingly, the linked list of sequence structures contain the necessary information to initiate operation of the data processing routine to be performed by process transputer 206.

Data_head structures 266 point to the locations in memory 265 at which various blocks of data are stored. In this example, data_head structures point to memory 265 where data was placed which was generated or modified by an operation indicated in a step structure 264. Multiple instances of data_head structures 266 may be used in a single step of the process, as will be noted hereinbelow. Each of data_head structures 266 may include the following attributes:

name, units: data label (temperature, etc.) and physical units (e.g., °K.)

number: identifying number invariant: flag indicating constant or variable memory_size: largest memory size required for any operational step data_size: largest memory size for storage of output z: beginning memory address in memory 265 for the_data next Accordingly, data_head structures 266 provide a full description of the type of data and its location; in addition, data_head structures 266 can themselves be linked, without regard to the sequence structures 262 pointing to (i.e., owning) them. For purposes of parallel processing ease, there is no indication of the origin of the data, or what has processed the data. This allows each of the sequence structures 262 to point to, and operate upon, created data in a manner which is independent from prior processes or subsequent processes. As such, all data_head structures 266 appear identical to their users, making the data organization according to this embodiment of the invention particularly adaptable to parallel processing.

The detailed processing is performed by step structures 264. Step structures 264 are another linked list of data structures, which point to data_head structures 262 as well as to operators, and thus perform the detailed process on a step-by-step basis. Each step structure 264 is designed to be self-contained, such that each function performed by process transputer 206 will find exactly one pointer on its stack when it is invoked, namely a pointer to the step structure 264 that invoked the function. The step structure 264 thus contains the location of the function needed to execute its step, as well as all necessary information to perform the step. Accordingly, the attributes which may be stored in connection with each step structure 264 are as follows:

- count, index: user-defined constants for use in the operation
- size1, size2: number of operations to perform on input1 and input2, respectively
- constant_r, ks: user-defined real constant, and storage for indeterminate length vectors
- constant_i: user-defined imaginary constant
- channel1, channel2: pointers to data acquired earlier by reaper 215 (via channel_info structures 236)
- input1, input2: pointers to data_head structures $266_n$ for previously created inputs to the step
- output: points to data_head structure $266_n$ at which results are to be stored
- name: name of the step (e.g., FFT)
- operator( ): program memory location containing the machine instructions for this process step
- imaginary, result: imaginary and result flags
- sequence: points to a subsequent sequence structure 262 as necessary, thus allowing very complex functional relationships
- accumulates: intermediate accumulation counter
- accumulates_left: intermediate accumulation counts remaining
- e_vect, next: points to extended vector structures, and to a step structure 264

The large number of potential attributes for a step structure 264 are provided in order that a high degree of flexibility exists on the step structure level. It is contemplated that most step structures 264 will have fewer than half of these attributes filled, as many operations are of relatively low complexity for purposes of most sequences.

Particular attributes of note within step structures 264 include the "next" and "sequence" attributes. These attributes allow any single step structure 264 to inaugurate another step structure 264, or to introduce a sequence of steps by way of a sequence structure 262, in order to perform its function. For example, if the result desired from sequence 262 is the magnitude of an FFT, a step structure 264 for performing an FFT could be linked (via its "next" attribute) to a step structure 264 for performing the root-mean-square magnitude calculation. The present invention thus provides the creation of processes of virtually unlimited complexity, by way of the linking of step structures 264, particularly with sequence structures 262.

As noted above, step structure 264 can point to channel data, as well as to created data. Pointers channel1 and channel2 in step structure 264 point to the location (in the memory of process transputer 206, after importation by client 217 from coolie 216) of channel_info structures 236 which are desired for the particular step of the process. As described hereinabove, channel_info structures 236 describe the particular channel of time series data, and not necessarily the location of the data. Channel_info structures 236 are pointed to by step structures 264 since it is the channel type and attributes which are known by interim 218, and not the particular location of the data, its size, attributes, etc. In converse manner to that described hereinabove relative to store transputer 204, channel_info structures 236 point to their associated channel_head structures 235. Accordingly, from the viewpoint of interim 218, channel_head structures 235 and channel_info structures 236 appear as simple paired sets. When incoming new input data is to be acquired in the performance of interim process 218, the appropriate step structures 264 point to channel_info structures 236, which in turn point to channel_head structures 235 which, via first_data and next_data pointers therein, access the channel data.

As such, according to this embodiment of the invention, each step structure 264 points to two data_head structures 266, and to two incoming channel_info structures 236; step structure 264 also points to a data_head structure 266 at which the results of its operation are to be stored. It is contemplated that these inputs and single output are sufficient to perform many data processing operations. It is known, however, that for some operations (e.g., addition of several vectors), additional input data may be necessary. This example of the invention thus provides an extended vector capability, with unlimited extension.

Another pointer in step structure 264 is directed to extended vector data. As noted hereinabove, step structure 264 includes a pointer e_vect which points to the location of an extended vector e_vect structure 268. E_vect structure 268 is a data structure which points to additional memory locations 267. In addition, each e_vect structure 268 includes pointers to additional data_head structures 266 (vect1, vect2, composite) indirectly, via a linked list of e_vect_group structures 269. E_vect_group structures 269 can extend the reach of e_vect 268 indefinitely, depending upon the length of the linked structure (i.e., the number of e_vect_group structures 269 before the next pointer of one is null). Accordingly, the linked structures 268, 269, together with memory 267, allows for expansion of the number of variables operable by interim 218.

Referring now to FIG. 26, a simple example of an interim structure 260, in attaching incoming data and performing a 1024 point Fast Fourier Transform (FFT) and calculation of an amplitude spectrum, will now be described. As is well known in the art for surface seismic prospecting, the frequency-domain amplitude spectrum of a time series of analog data is useful in the analysis of seismic data; as such, the particular example of FIG. 26 is useful in the analysis of data acquired by the embodiments of the invention described hereinabove. In FIG. 26, interim structure 260' and display_head structure 261' are configured as described hereinabove for this process. In particular, sequence structure 262' in this example, points to data_head structure 266' and to first step structure 264*a*.

Step structure 264*a* includes a pointer to the appropriate operator attach_channel (size=1024) for acquiring data from one of the channels of data received by store transputer 204. Pointer channel1 in step structure 264*a* points to channel_info 236*a*, operator pointer in data structure 264*a* points to the machine language instructions for acquiring the channel data and associated information therefrom , and output pointer in step structure 264*a* points to data_head structure 266. The result of step attach-channel thus is to read channel data pointed to by channel_info 236*a* (and its channel_head structure 235), and store it in memory 265 at a location pointed to by data_head structure 266'. The operator function for step structure 264*a* may include format conversion or other single-operand type of operations on the attached data.

Next pointer in step structure 264*a* points to step structure 264*b*. In step structure 264*b*, the input1 pointer points to data_head structure 266' which, in turn, points to the location in memory 265 at which the attached channel data were converted and stored, the operator pointer points to machine instructions for performing a 1024-point FFT, and the output pointer points back to data_head structure 266'. Since step structures 264a and 264b both point to the same data_head structure 266', not only will the input1 pointer point to the same location as the output pointer, but the output of step 264b will be the same memory location at which the attached channel data were stored by way of step structure 264a. Accordingly, in step structure 264b, the input1 and output pointers have the same value. Step structure 264b thus retrieves the attached channel data from memory 265, performs the 1024 point FFT, and returns the complex results (real and imaginary amplitudes) to memory 265 at the same location from which the data was retrieved.

In the example of FIG. 26, the process is completed by step structure 264c, to which the next pointer of step structure 264b points. In step structure 264c, the input1 pointer points to data head 266'; as pointed out, since the input1 and output values of step structure 264c are equal, step structure 264c will receive at its input the output of the operation from the prior step structure 264b. The operator pointer of step structure 264c points to machine instructions for calculating the magnitude of the FFT (i.e., square root of the sum of the squares of the real and imaginary amplitudes for each discrete frequency), and its output pointer points again to data_head 266' which, as noted above, places the results of the calculation back into memory at the same location from which it was retrieved, except that the size of the data is now 512, instead of the 1024 values which were the output of the attach and FFT operations. The memory_size and data_size values for data_head structure 266' are thus 1024 and 512, respectively.

The next pointer of data structure 264c points to null, since the sequence is complete. The next sequence structure 262 (if any) pointed to with the next pointer of the current sequence structure 262 will then be read and its sequence performed; completion of the linked list of sequence structures 262 for interim 260' will return control back to the highest level.

As noted hereinabove, each of the step structures 264a, 264b, 264c pointed to the same data_head 266', such that the input1 and output pointers in data_head 266' were equal. Alternatively, multiple data_head structures 266 could be used in this example, with the input1 pointer of each subsequent step structure 264 pointing to the same data_head 266 as was the output pointer for the prior step structure 264, but with the output pointer of each subsequent step structure 264 pointing to a new data_head structure 266 from that of the prior step structure 264. This alternative arrangement would maintain the intermediate results of the operation in memory 265.

Accordingly, the example of FIG. 26 is suitable for calculating the amplitude spectrum of a time-domain input variable, and to output the same via output transputer 208. The physical units of the data (e.g., Hz) may be assigned to the data stored in connection with data_head structure 266', and an appropriate name may be given thereto so that the data may be readily retrieved by the output steps. The organization of data structures in output transputer 208 according to the present invention will now be described, relative to FIG. 27.

As discussed hereinabove, display_head structures 261 control the output of information from the processes of interim 218. In this embodiment of the invention, the output data is to be transmitted by way of stress wave telemetry, in particular by way of frequency shift keyed modulation, as described hereinabove. In order for output transputer 208 to perform the necessary output, however, in the multiple chip system of FIG. 20, transfer of data from process transputer 206 to output transputer 208 over link 214 must be performed. This is done by way of DMA between processes piddle 219 and grafy 221, in similar manner as described hereinabove for processes coolie 216 and client 217. In this embodiment of the invention, data_head structures 266 and their associated data in memory 265 are transferred.

Each of display_head structures 261 include an identifying number, a name, a display structure 270 pointer, and a "next" pointer; as such, display_head structures 261 comprise a linked list of output processes, identified by name and number. Display structures 270 control the generation of the output data from the results of interim 218. Attributes stored by display structures 270 can include:

format_info: information regarding the format of the data as it is to be presented sync: description of the synchronization pulse or word output_code: memory location of the machine instructions for translating the data into FSK format fsk_head: pointer to the data structure containing the data to be output next Data structure fsk_head 272 includes number and name identifiers, as well as a pointer to the data_head structure 266 to be output, and a next pointer. Data_head structure 266 is identical to those shown in FIG. 26, and points to the locations in memory 265 at which the data is stored.

Accordingly, in much the same manner of operation as the store and compute processes, the results of the processing are formatted by process grafer 222 in output transputer 208 and presented to interface 210 for telemetry to the surface. The above-described system therefore is capable of handling large amounts of data by way of advanced transputer circuitry, such advanced circuitry allowing for the provision of the computing capability in a downhole environment. In addition, the system described herein provides particular benefits from its data structure such that parallel processing can be advantageously utilized, such parallel processing being particularly useful in performing the data analysis routines contemplated to be necessary for the prospecting systems described herein.

Figure 28:
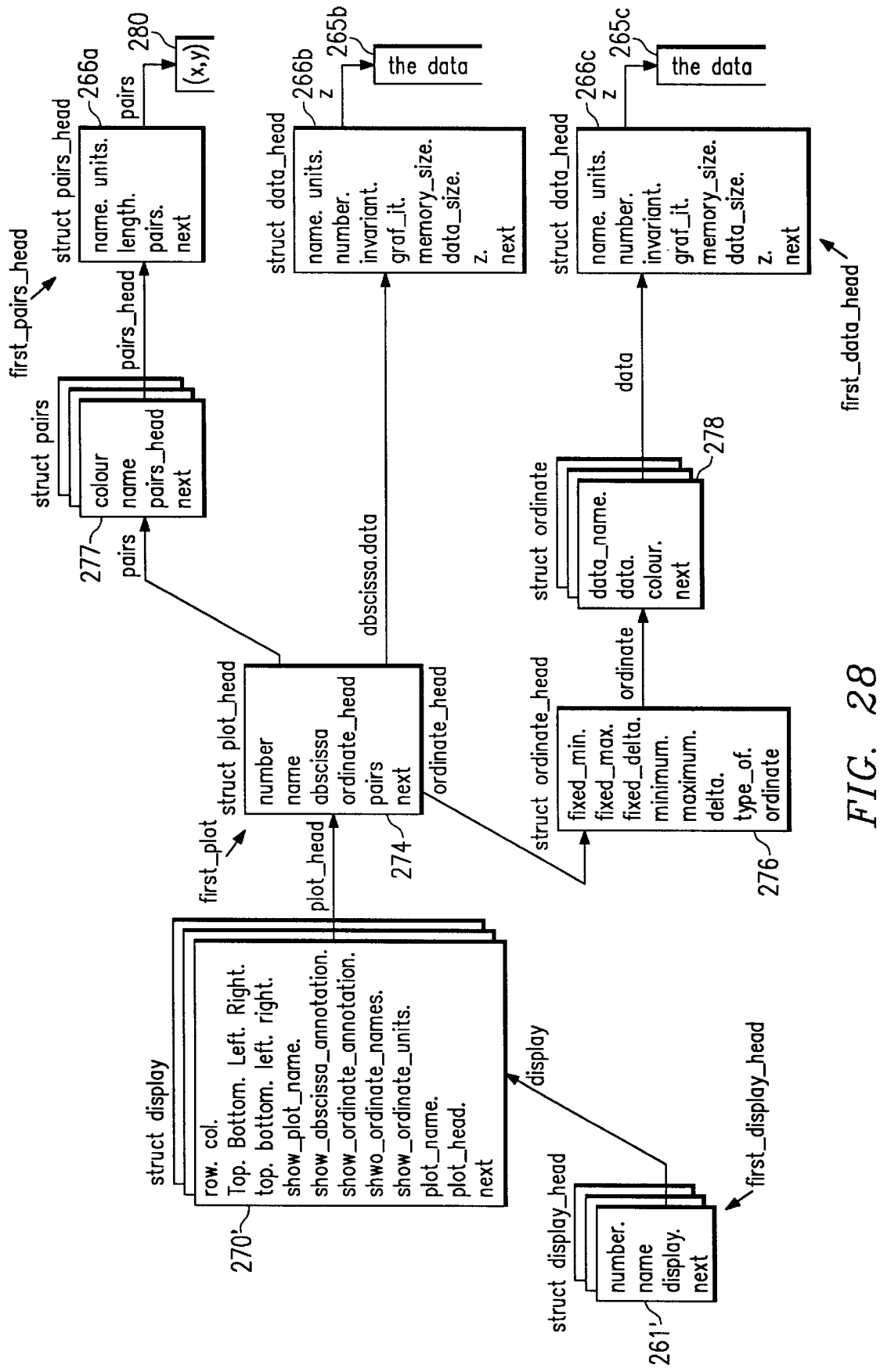
FIG. 28 is a data structure diagram illustrating an example of the output data presentation by the system of FIG. 19.

Furthermore, it is contemplated that the data structures and processes described herein may also be useful in surface data processing systems, particularly those with graphical output. In such a case, the store and process transputers in such a surface system may be similar to those described hereinabove, but the processes of output transputer 208 may be significantly more complex. Referring now to FIG. 28, a graphics output system incorporating the data structures of the present invention will now be described.

Display_head structures 261' and display structures 270' control the operation of the graphical output from data generated by process interim 218, as in the prior example, except that display structures 270' each may include additional attributes. For purposes of explanation of this embodiment of the invention, a "plot" may be considered as an abstraction of the data according to one independent variable with any number of dependent data sets; a "display" may be considered as a particular implementation of the abstraction. Data pairs may also be overlaid onto the display of the plot in this embodiment.

Referring to FIG. 28, display_head structures 261' refer to a full screen display, which may include multiple displays therein, each of which are referred to by the linked list of display structures 270' (i.e., presentation of the abstractions). Each of display structures 270' may include the following attributes:

row, col: origin of the display on the screen

Top, Bottom, Left, Right: boundaries of the screen area top, bottom, left, right: boundaries of the data plot within the screen area show_plot_name: flag indicating if plot name is to be shown show_abscissa_annotation: flag indicating if abscissa is to be annotated show_ordinate_annotation: flag indicating if ordinate is to be annotated show_ordinate_names: flag indicating if ordinate names are to be shown show_ordinate_units: flag indicating if ordinate units are to be shown plot_name: name of plot defined by user plot_head: pointer to plot_head structure 274 next: pointer to next plot_head in display

The linked list of plot_head structures 274 controls the abstraction of the data in the ordered fashion necessary to graphically plot the same. Each plot_head structure 274 includes identifying number and name, and pointers to the abscissa data_head structure 266b, to data structure ordinate_head 276, and to data structure pairs 277. Data_head structure 266b is similarly constructed as described hereinabove relative to interim 218, after the DMA of the information from process transputer 206 to output transputer 208, and points to memory 265b at which the data is stored. The data associated with data_head structure 266b are the independent variable values to be displayed.

Ordinate_head 276 data structures control the abstraction of the ordinates (i.e., dependent variables) corresponding to the abscissa data. The attributes of ordinate_head 276 include the following:

fixed_min, fixed_max: fixable range of ordinate values fixed_delta: fixable step size minimum, maximum: actual range of ordinate values delta: actual step size type_of: indicates if linear, logarithmic ordinate ordinate: pointer to ordinate structure 278

Ordinate structures 278 include name and color information, as well as a pointer to the data_head structure 266c which points to the location of the ordinate data associated therewith. Data_head structure 266c is similarly constructed as noted hereinabove.

In addition, this embodiment of the invention further includes pairs structure 277 to which plot_head structure 274 may point. Pairs structure 277 controls the color and name of overlying pairs of data (e.g., data points from which a best-fit line is drawn by plot_head), and points to a pairs_head data structure 266a which points to data in pairs memory 280.

The display control provided by the structure of FIG. 28 allows for significant flexibility and ease of parallel processing regarding the output of data. The plot abstraction, done separately from the display implementation, allows for multiple presentations of the same plot without requiring multiple abstractions to be generated and defined. In addition, multiple lots of the same data may be done without requiring multiple occurrences of the same data points in memory. Furthermore, as any vector may serve as the abscissa data set, cross-plots are readily generated.

The computing system described hereinabove relative to FIGS. 18 through 28 provides significant advantages over prior conventional architectures and data processing methodologies. These advantages are achieved in each of the three fundamental computing processes of data acquisition and storage, data processing, and output generation.

In the data acquisition and storage process, the computing system according to this embodiment of the invention is capable of accommodating a wide variety of input formats, input data lengths, and industry standard or custom encoding schemes, as well as the storage of data resulting from the computations performed by the system in its data processing. In particular, the number of input data channels received can be arbitrary, with user-definable block storage sizes, and the method is particularly well suited for the handling of multiplexed data channels of sampled analog inputs, even where the various channels have different sampling frequencies. Incoming data is also stored in a manner which can be efficiently retrieved by the data processing function, including remote or parallel processes.

In the data processing process, the system and method according to this embodiment of the invention can directly access stored incoming data, retrieving not only the data but self-identifying information concerning the stored incoming data; the output of the data processing by this system is stored in a similar, self-identifying manner, so that subsequent processing or output generation can access the final or intermediate processing results regardless of the origin of the data. In addition, the execution of multiple sets of user-defined algorithms is available, with such execution not disturbing the acquisition and storage of incoming data or the generation of output. The hierarchy of linked list sequences and steps for the data processing process described hereinabove allows for automatic inauguration of a process upon receipt of data, and also for the independent processing of steps in a sequence of unlimited complexity. The hierarchal linked lists of sequences, together with the self-identifying storage of incoming data and results, also facilitates parallel processing approaches to performing the data processing.

The generation of output by the system described hereinabove is further facilitated by the data structure arrangement. Each block of data is stored along with its self-identifying information, including physical units, sample size, and other attributes relating to the origin of the data, such that graphical display and communication of the result of the data processing can be done efficiently and without requiring knowledge of the history of the data and the processing performed thereupon. The generation of the output from this system can thus also be readily performed by parallel processing techniques, and can readily provide iterative generation of output without necessitating the reperforming of the data analysis or processing routines.

CONCLUSION

As described hereinabove, the systems according to the present invention allow for looking ahead of and around the drill bit location in a drilling operation, with high resolution local surveying available. Various energy types may be used, each with high resolution due to their high frequency generation; either the raw data may be sent to the surface by high data rate telemetry, or downhole parallel computing power may be used to handle the vast amounts of data generated at the higher frequencies. The advantages of high resolution surveying during drilling include greater likelihood of successful production, optimization of drilling parameters, mud usage, and casing design, and thus safer and more efficient hydrocarbon exploration and production.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of operating a computer including addressable memory, comprising the steps of:

for a channel from which input data is to be received by said computer, generating an input data structure comprising a data pointer indicating a memory location at which input data is to be stored and a first channel pointer indicating a memory location at which channel information is stored, said channel information including physical attributes about input data received from said channel;

receiving input data from a data source associated with said channel, and storing said input data in memory at the location indicated by said data pointer of said input data structure;

storing step data according to a step data structure comprising a second channel pointer indicating a memory location at which channel information is stored, an operator pointer indicating a memory location at which an instruction is stored, and an output pointer indicating a memory location at which a result is to be stored; and executing a sequence comprising the steps of:
retrieving the stored input data by retrieving the channel information indicated by said second channel pointer;
performing the operation indicated by said operator pointer; and
storing the result of said performing step at the memory location indicated by said output pointer.

2. The method of claim 1, wherein said executing step further comprises:

storing sequence data according to a sequence data structure comprising a step pointer indicating the memory location of said step data; and retrieving the step data from the location indicated by said step pointer.

3. The method of claim 2, wherein said step of storing sequence data comprises storing a plurality of instances of sequence data corresponding to a plurality of operations;

wherein the sequence data structure further comprises a next pointer indicating the memory location of the next instance of step data to be retrieved in said executing step, said plurality of instances of sequence data forming a linked list;

and wherein said step pointer of said sequence data indicates the memory location of the first instance of step data in said linked list to be retrieved in said executing step.

4. The method of claim 3, wherein the step of storing step data comprises storing a plurality of instances of step data;

and wherein said step pointer indicates the memory location of an instance of step data;

and wherein the next pointer in one instance of step data indicates the memory location of said sequence data.

5. The method of claim 1, wherein said step data structure further comprises a created input data pointer indicating the memory location of previously created data;

and wherein said executing step further comprises:
retrieving created data from the memory location indicated by said created input data pointer.

6. The method of claim 5, wherein said second channel pointer and said created input data pointer may each contain null values.

7. The method of claim 1, wherein said step data structure further comprises an extended vector pointer indicating the memory location of an extended vector;

and wherein said executing step further comprises:
accessing the memory location indicated by said extended vector pointer.

8. The method of claim 1, wherein the computer comprises first and second computers;

wherein said steps of generating an input data structure and receiving and storing input data are performed by said first computer;

wherein said steps of storing step data and executing a sequence are performed by said second computer;

and further comprising:
transferring the stored input data and said channel information from said first computer to said second computer after said receiving step.

9. The method of claim 8, further comprising:

receiving additional input data from a data source;

wherein said step of receiving additional input data is performed by said first computer in parallel with said executing step.

10. The method of claim 1, further comprising:

storing data head data according to a data head structure comprising a data pointer to a data memory location, and an identifying attribute;

wherein the output pointer of said step data structure indicates the location of said data head data, so that the results of said executing step are stored at the data memory location indicated by said data pointer.

11. The method of claim 10, wherein said data head data structure further comprises an attribute for storing an indication of the physical units represented by the data associated therewith.

12. The method of claim 10, further comprising:

generating an output signal by retrieving the data stored at the location indicated by said data pointer in said data head data structure.

13. The method of claim 12, wherein said output signal is a telemetry signal.

14. The method of claim 12, wherein said output signal is a graphics display.

15. The method of claim 12, wherein input data is to be received from a plurality of channels;

and wherein said generating step generates input data structures for each of said plurality of channels.

* * * * *